US008546872B2

(12) United States Patent
Sakuma et al.

(10) Patent No.: US 8,546,872 B2
(45) Date of Patent: Oct. 1, 2013

(54) NONVOLATILE SEMICONDUCTOR MEMORY DEVICE AND METHOD OF MANUFACTURING THE SAME

(75) Inventors: Kiwamu Sakuma, Yokohama (JP); Atsuhiro Kinoshita, Kamakura (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 232 days.

(21) Appl. No.: 13/072,366

(22) Filed: Mar. 25, 2011

(65) Prior Publication Data
US 2012/0068254 A1 Mar. 22, 2012

(30) Foreign Application Priority Data
Sep. 21, 2010 (JP) ................................. 2010-211271

(51) Int. Cl.
*H01L 29/792* (2006.01)
(52) U.S. Cl.
USPC .... 257/326; 257/324; 257/325; 257/E21.219; 257/E29.309; 438/689
(58) Field of Classification Search
USPC .................. 257/324–326, E21.219, E29.309; 438/689
See application file for complete search history.

(56) References Cited

U.S. PATENT DOCUMENTS
2008/0073635 A1   3/2008   Kiyotoshi et al.
2011/0049611 A1   3/2011   Kiyotoshi et al.

FOREIGN PATENT DOCUMENTS
JP   2004-152893   5/2004
JP   2006-155750   6/2006
JP   2009-27136    2/2009

OTHER PUBLICATIONS

U.S. Appl. No. 13/366,845, filed Feb. 6, 2012, Kiyotoshi, et al.
A. Hubert et al., "A stacked SONOS technology, up to 4 levels and 6nm crystalline nanowires, with gate-all-around or independent gates (Φ-Flash), suitable for full 3D integration," IEEE, 2009, pp. 27.6.1-27.6.4.
Wonjoo Kim et al., "Multi-Layered Vertical Gate NAND Flash Overcoming Stacking Limit for Terabit Density Storage," Symposium on VLSI Technology Digest of Technical Papers, 2009, pp. 188-189.
Jiyoung Kim et al., "Novel Vertical-Stacked-Array-Transistor (VSAT) for ultra-high-density and cost-effective NAND Flash memory devices and SSD (Solid State Drive)," Symposium on VLSI Technology Digest of Technical Papers, 2009, pp. 186-187.
U.S. Appl. No. 13/236,734, filed Sep. 20, 2011, Sakuma, et al.
U.S. Appl. No. 13/547,567, filed Jul. 12, 2012, Sakuma, et al.

*Primary Examiner* — Eugene Lee
*Assistant Examiner* — Elias M Ullah
(74) *Attorney, Agent, or Firm* — Oblon, Spivak, McClelland, Maier & Neustadt, L.L.P.

(57) ABSTRACT

According to one embodiment, a memory device includes a semiconductor substrate, first, second, third and fourth fin-type stacked layer structures, each having memory strings stacked in a first direction perpendicular to a surface of the semiconductor substrate, and each extending to a second direction parallel to the surface of the semiconductor substrate, a first part connected to first ends in the second direction of the first and second fin-type stacked layer structures each other, a second part connected to first ends in the second direction of the third and fourth fin-type stacked layer structures each other, a third part connected to second ends in the second direction of the first and third fin-type stacked layer structures each other, and a fourth part connected to second ends in the second direction of the second and fourth fin-type stacked layer structures each other.

13 Claims, 51 Drawing Sheets

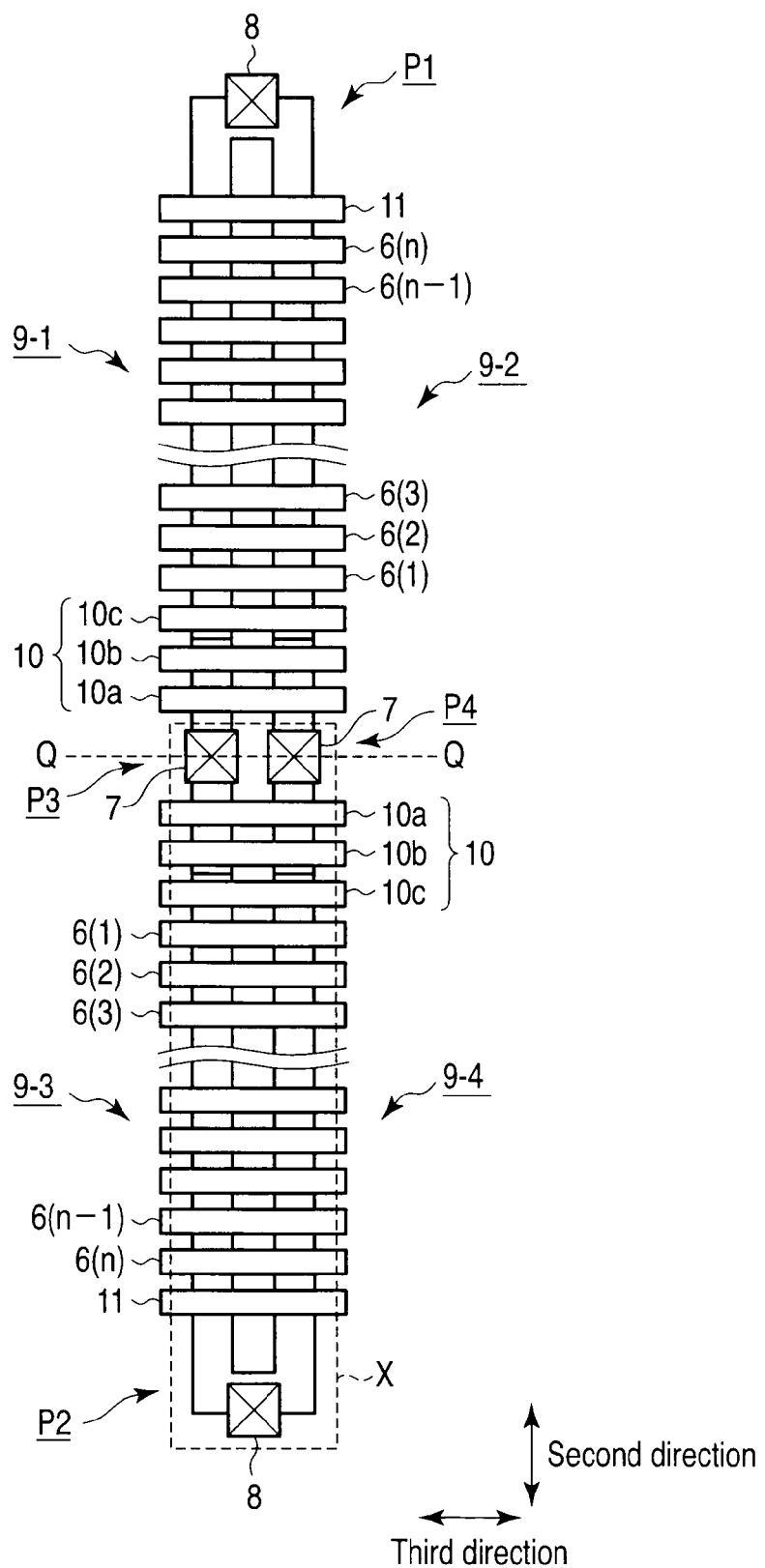
F I G. 1

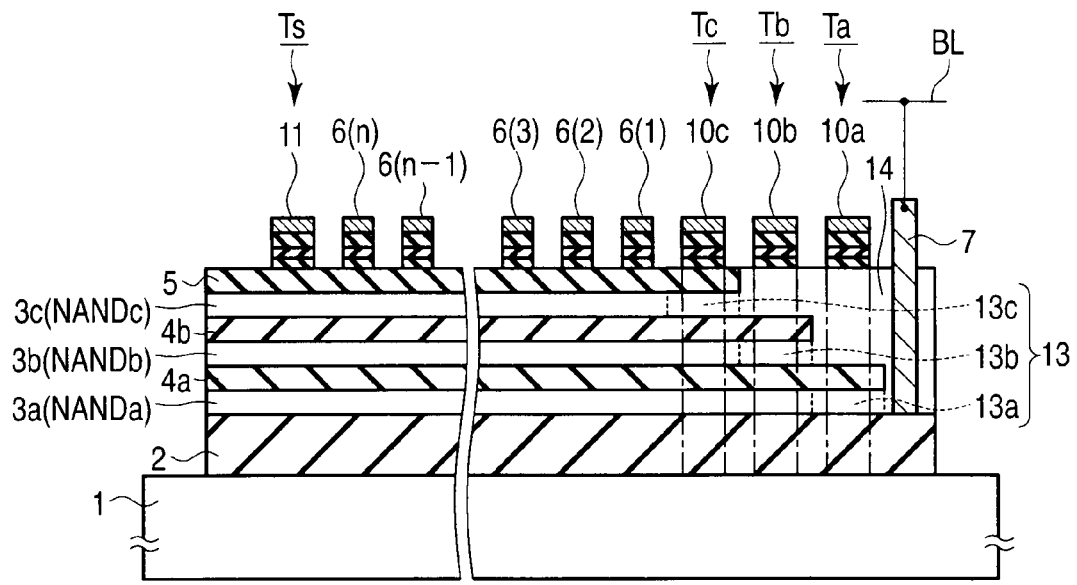
F I G. 3
First direction
Second direction
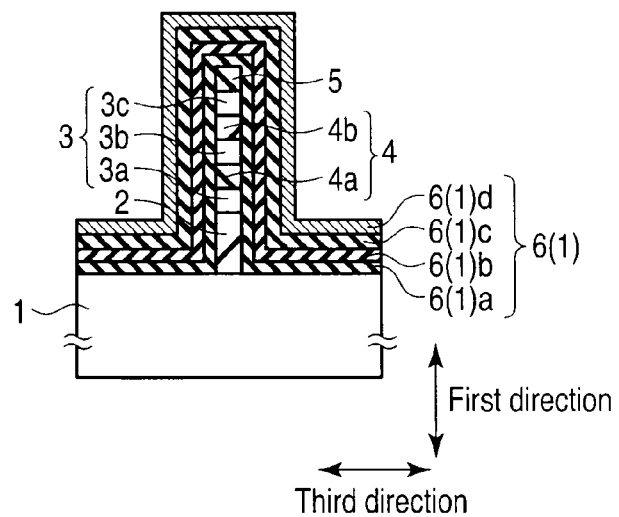
F I G. 4
First direction
Third direction

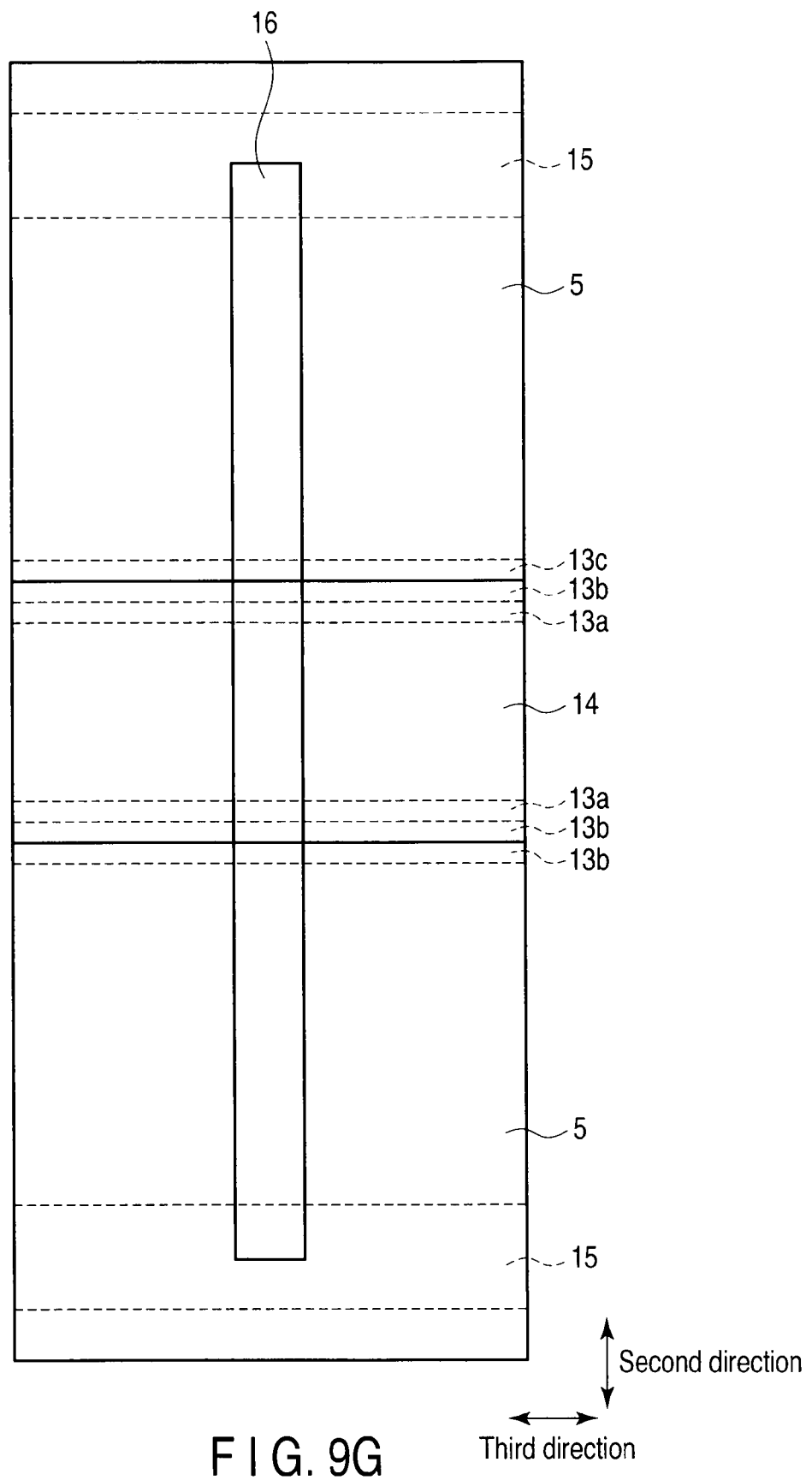
F I G. 9G

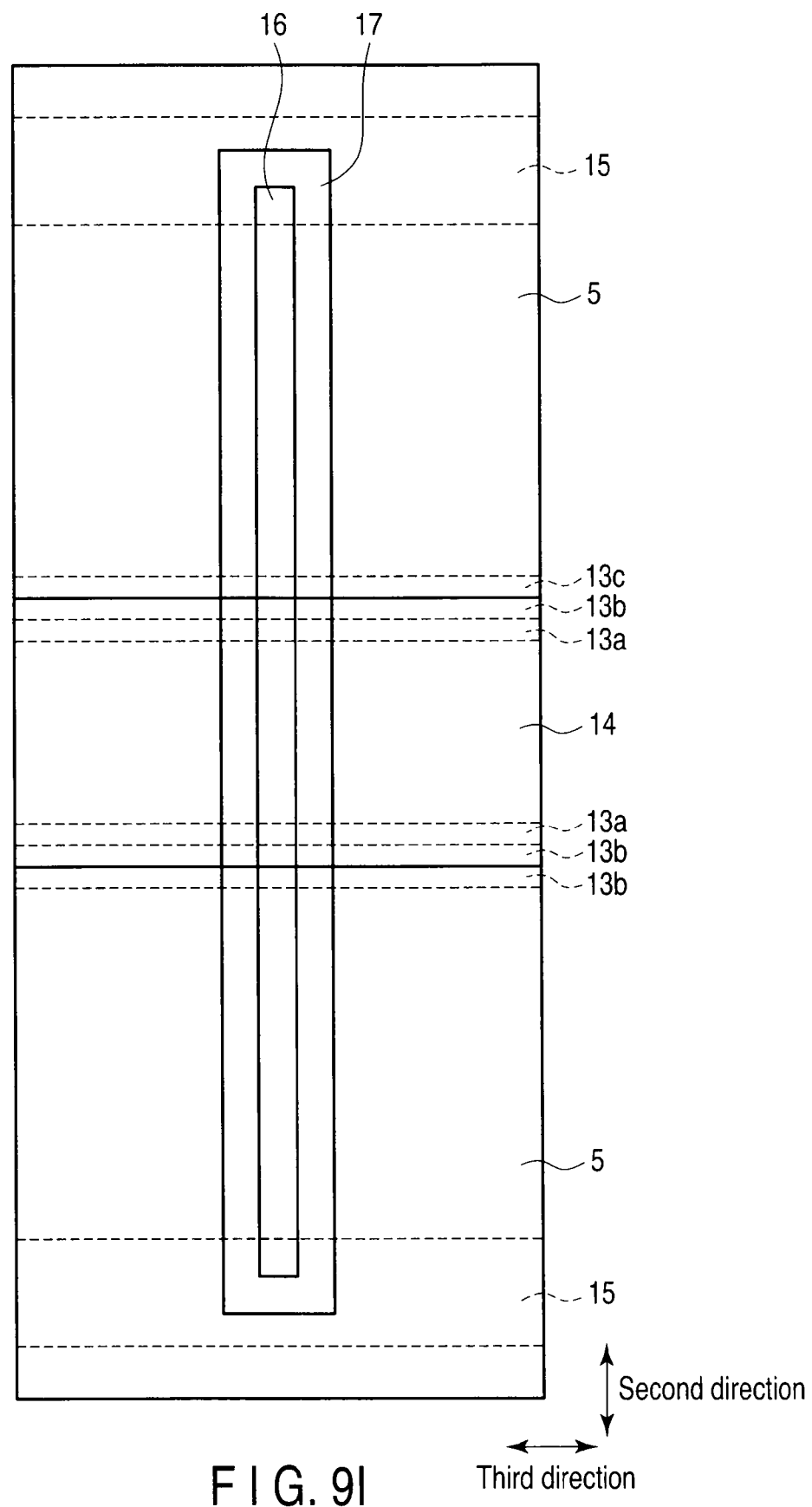
F I G. 9I

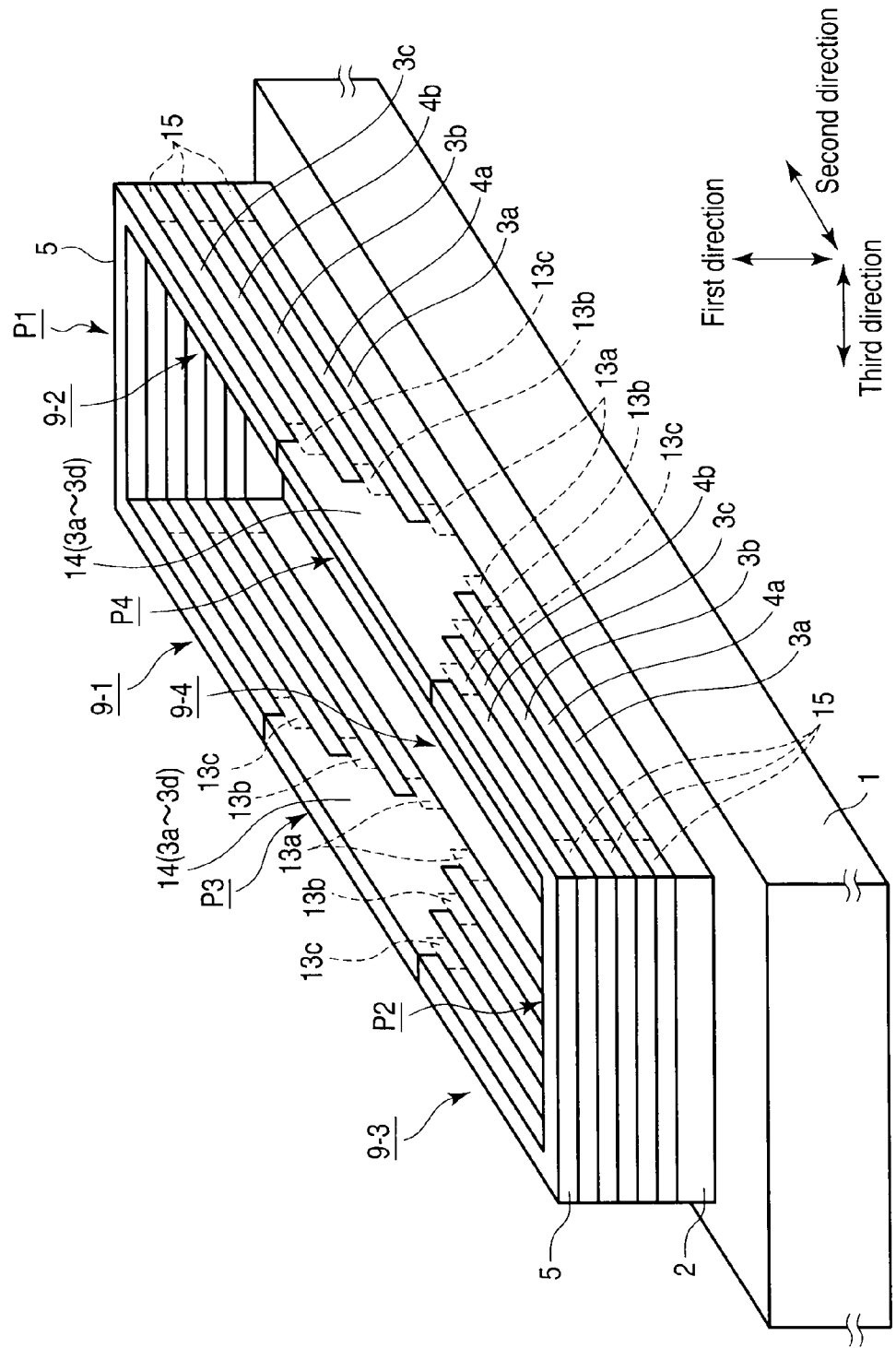
F I G. 9L

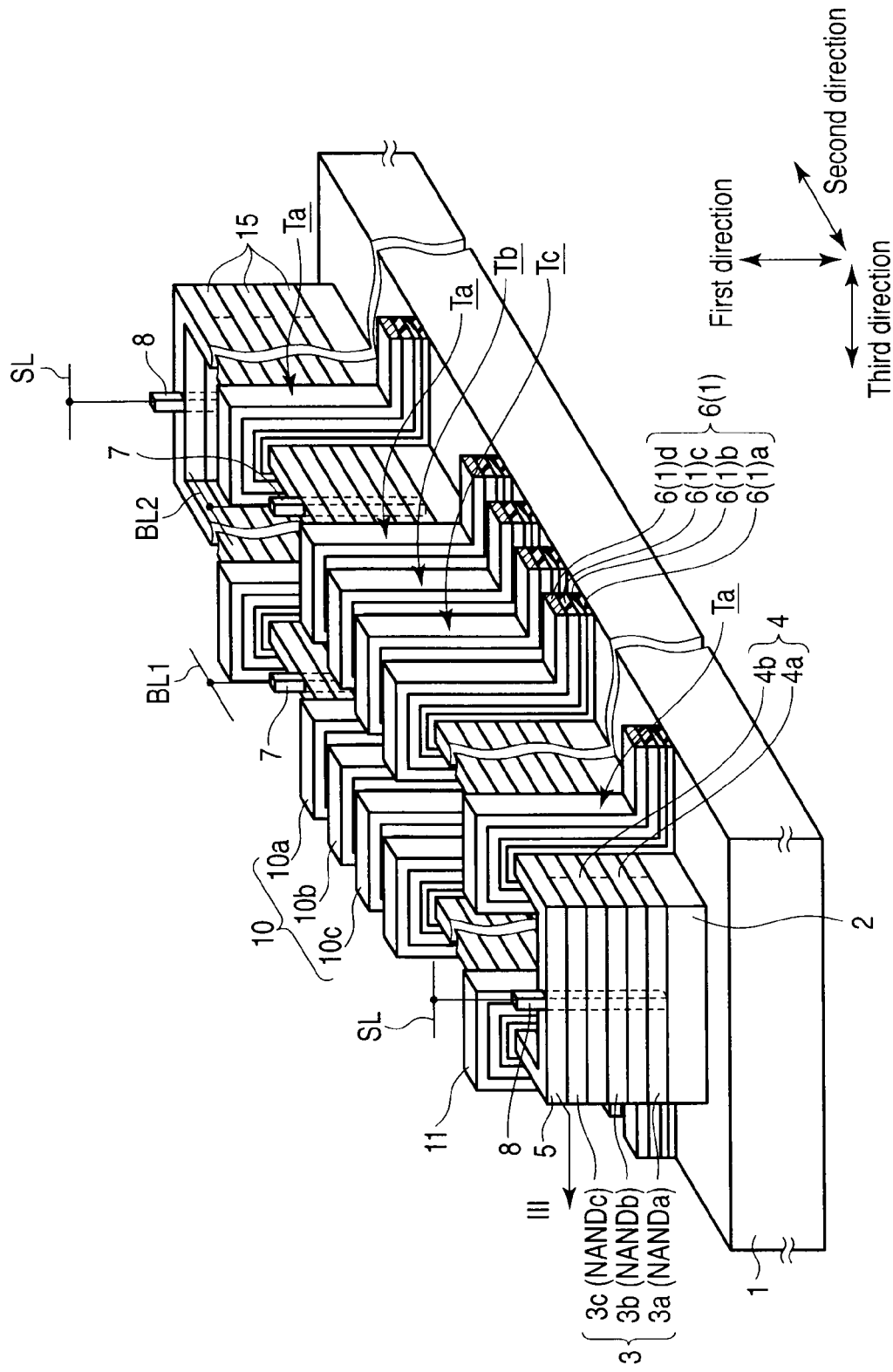
F I G. 9M

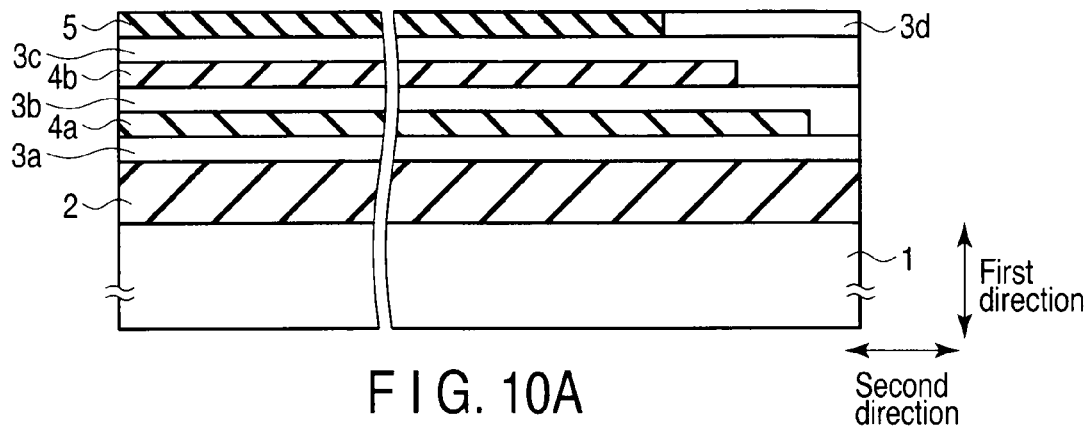
F I G. 10A
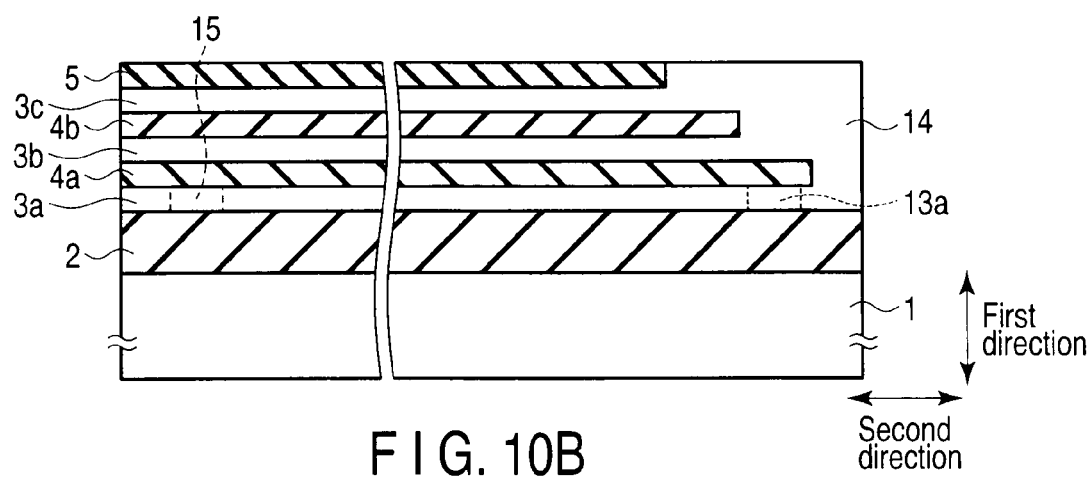
F I G. 10B

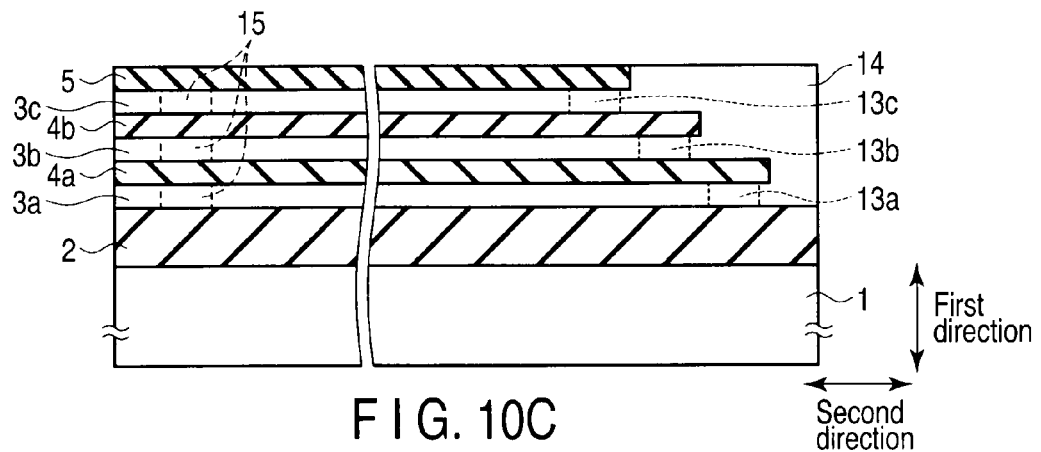
F I G. 10C
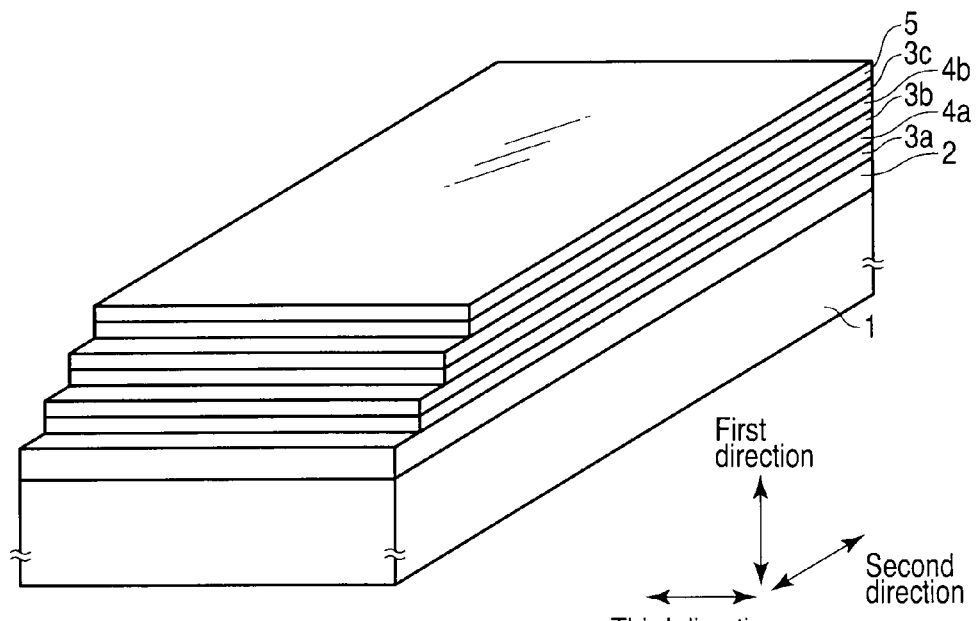
F I G. 11A

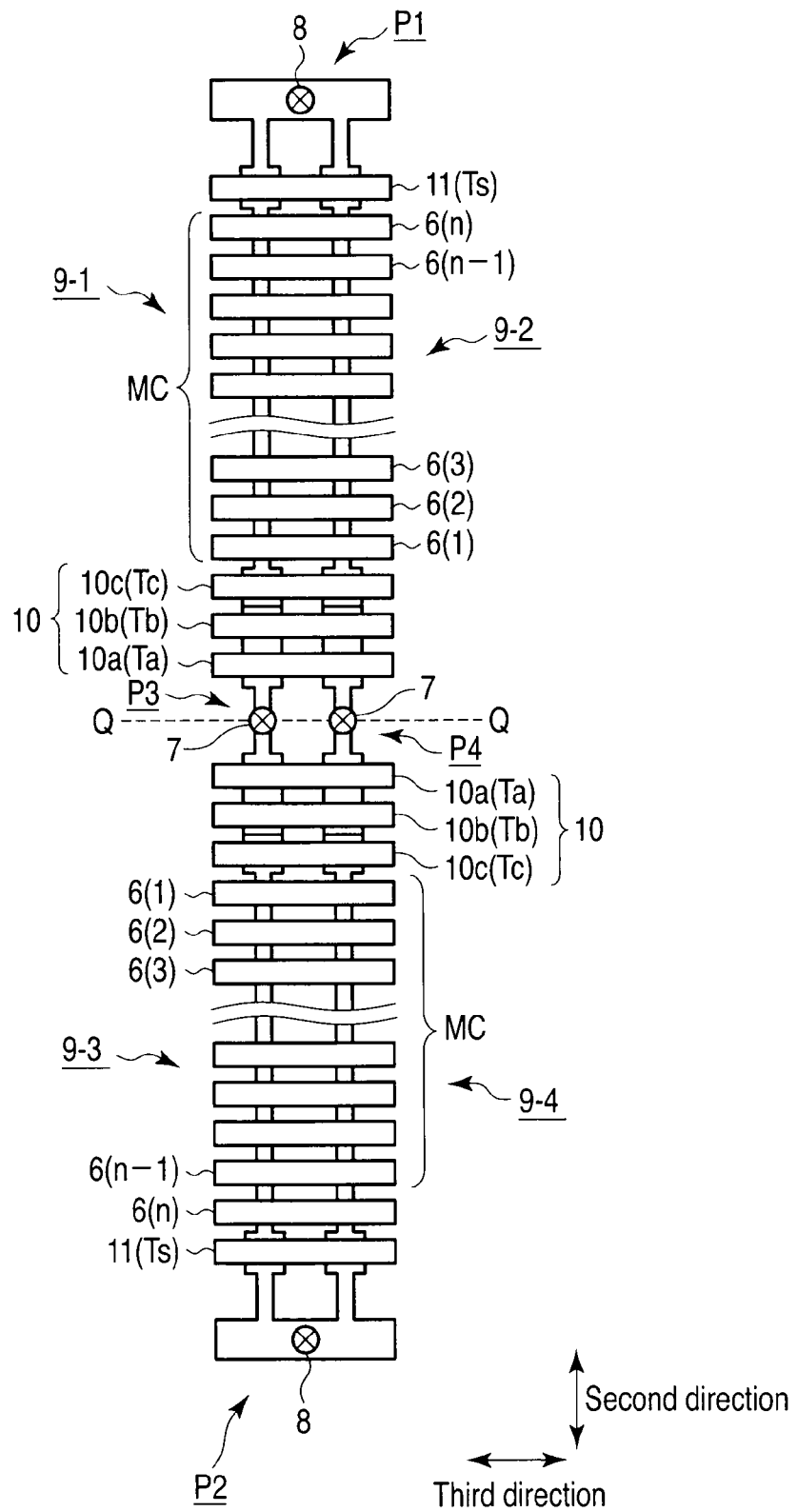
F I G. 14

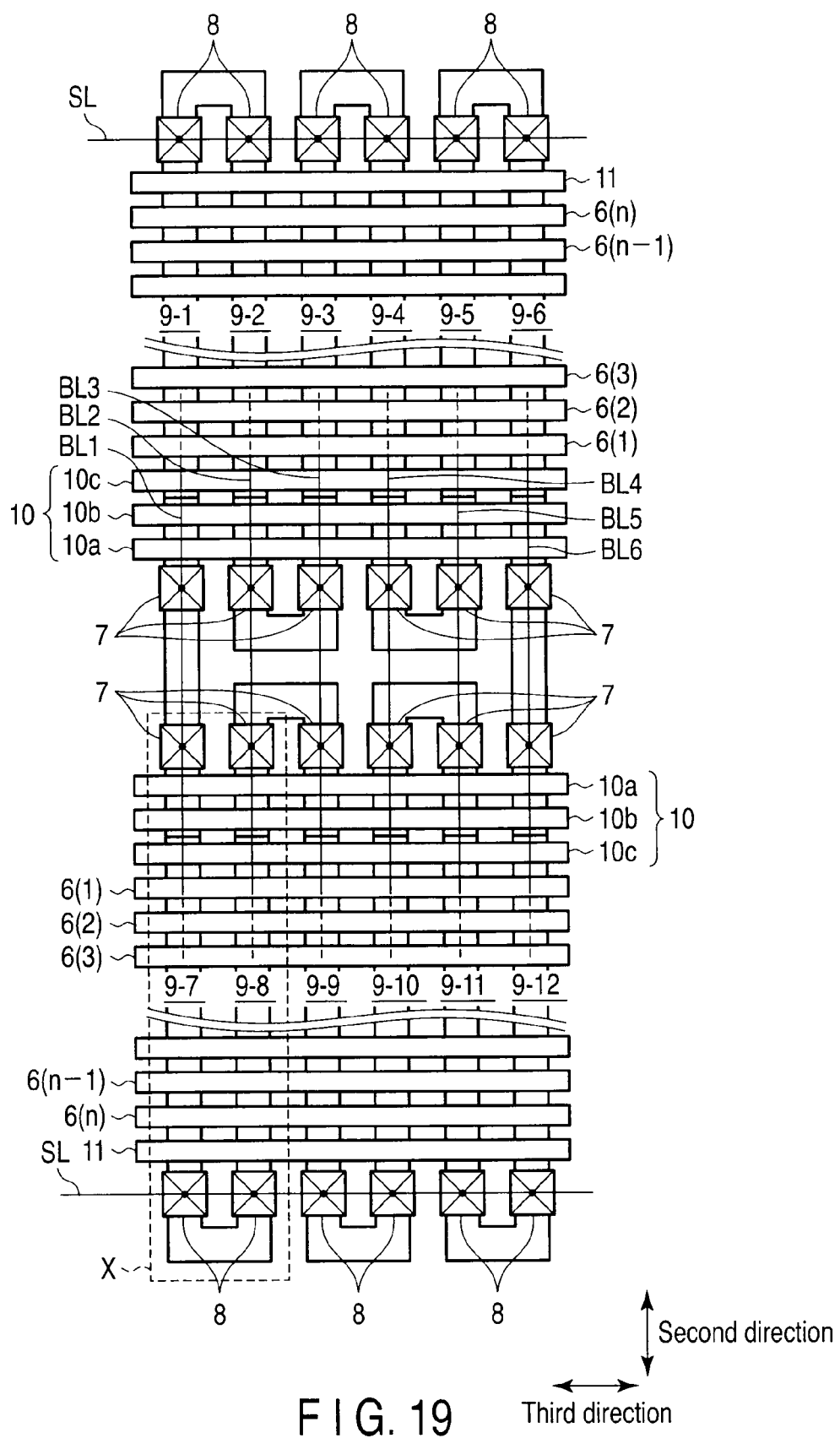
F I G. 19

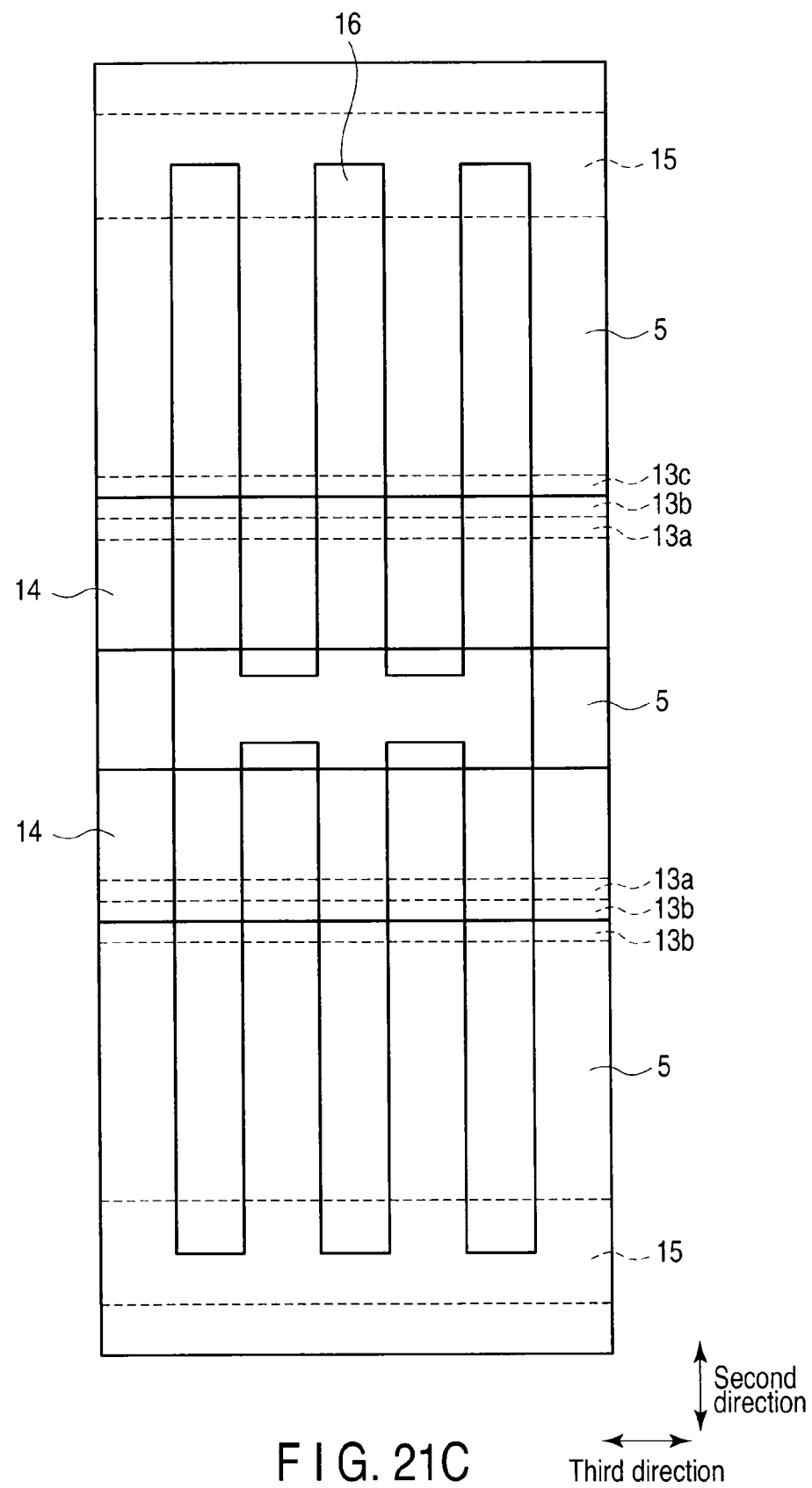
F I G. 21C

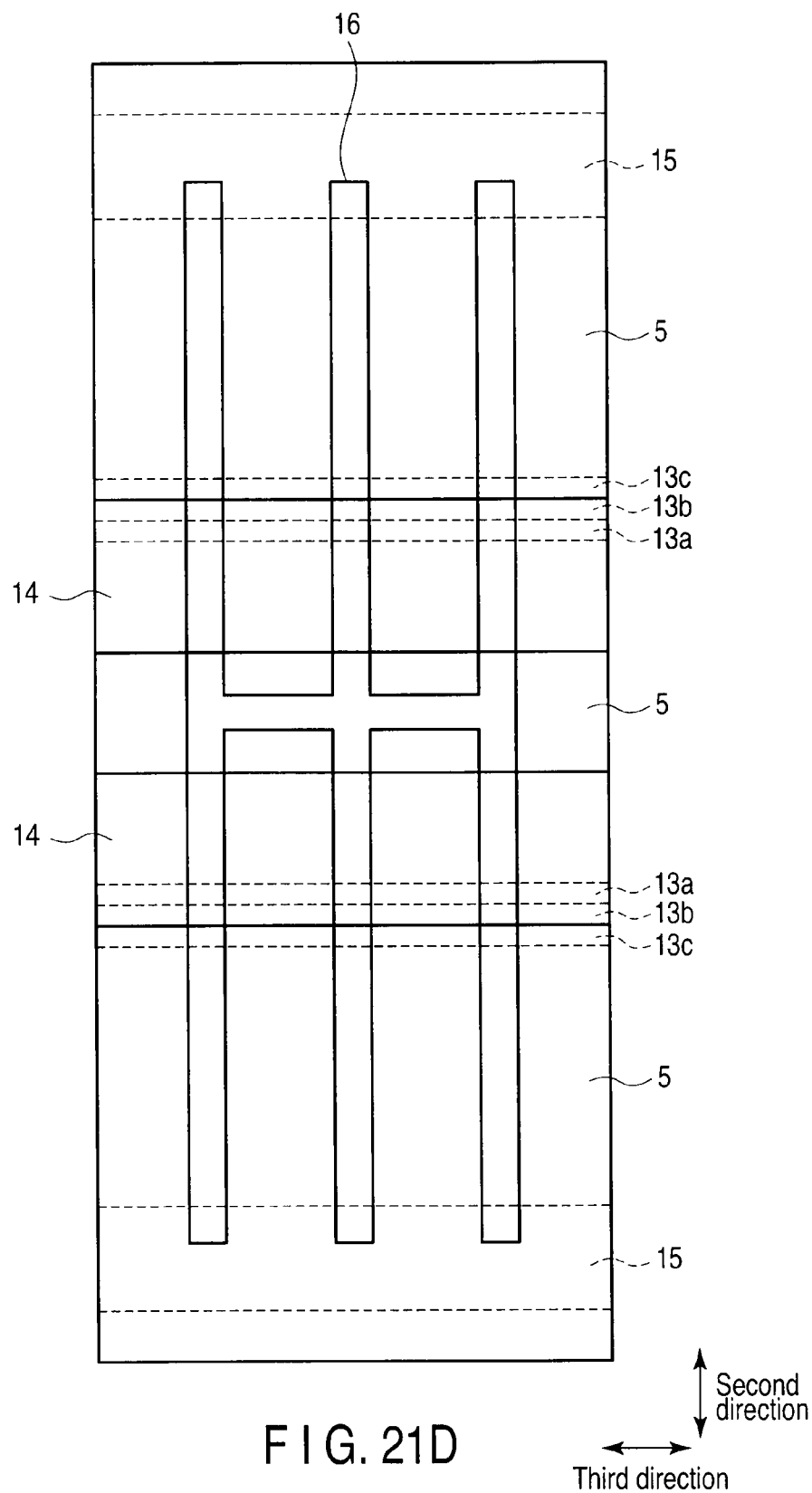
F I G. 21D

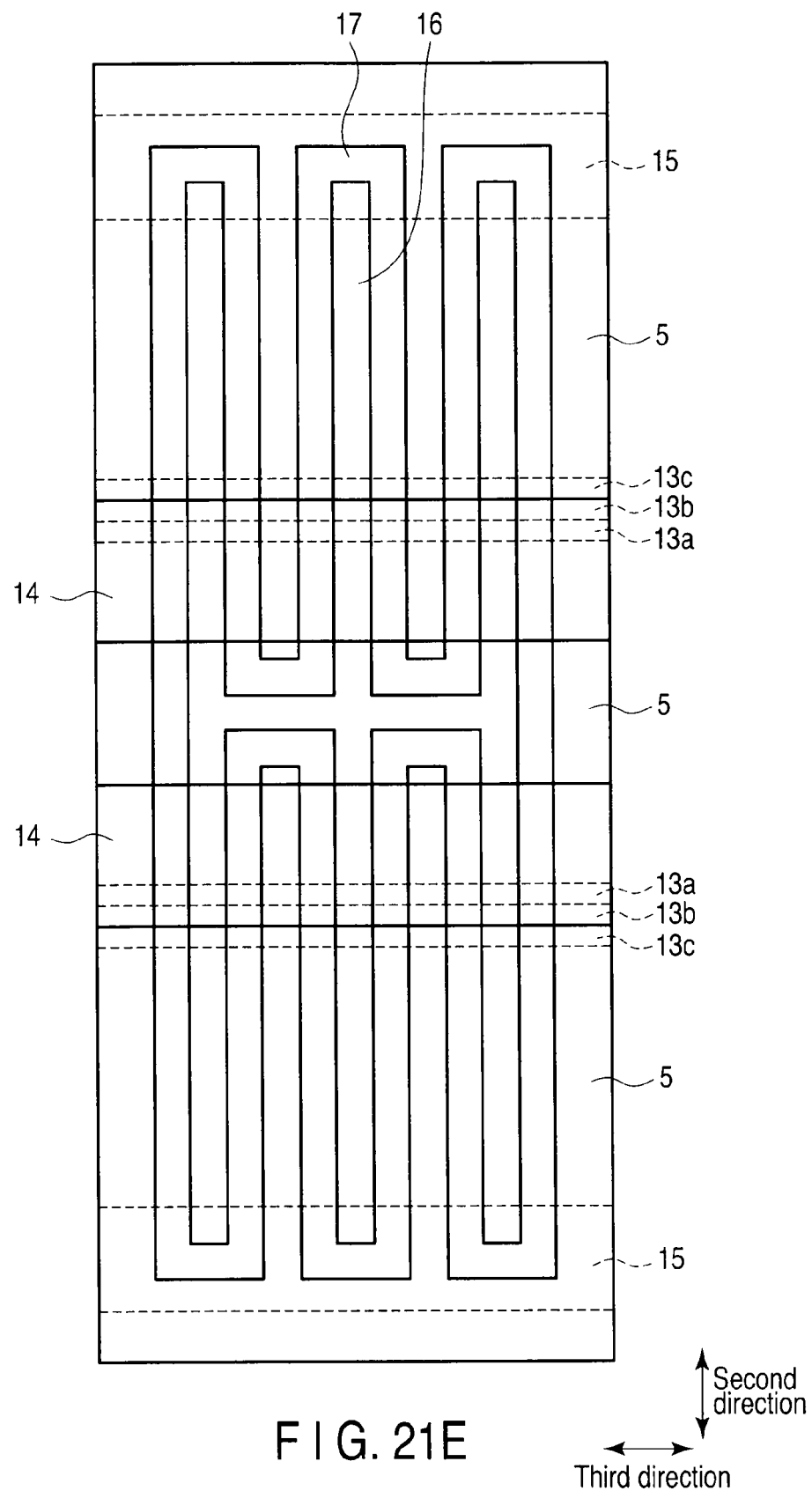
F I G. 21E

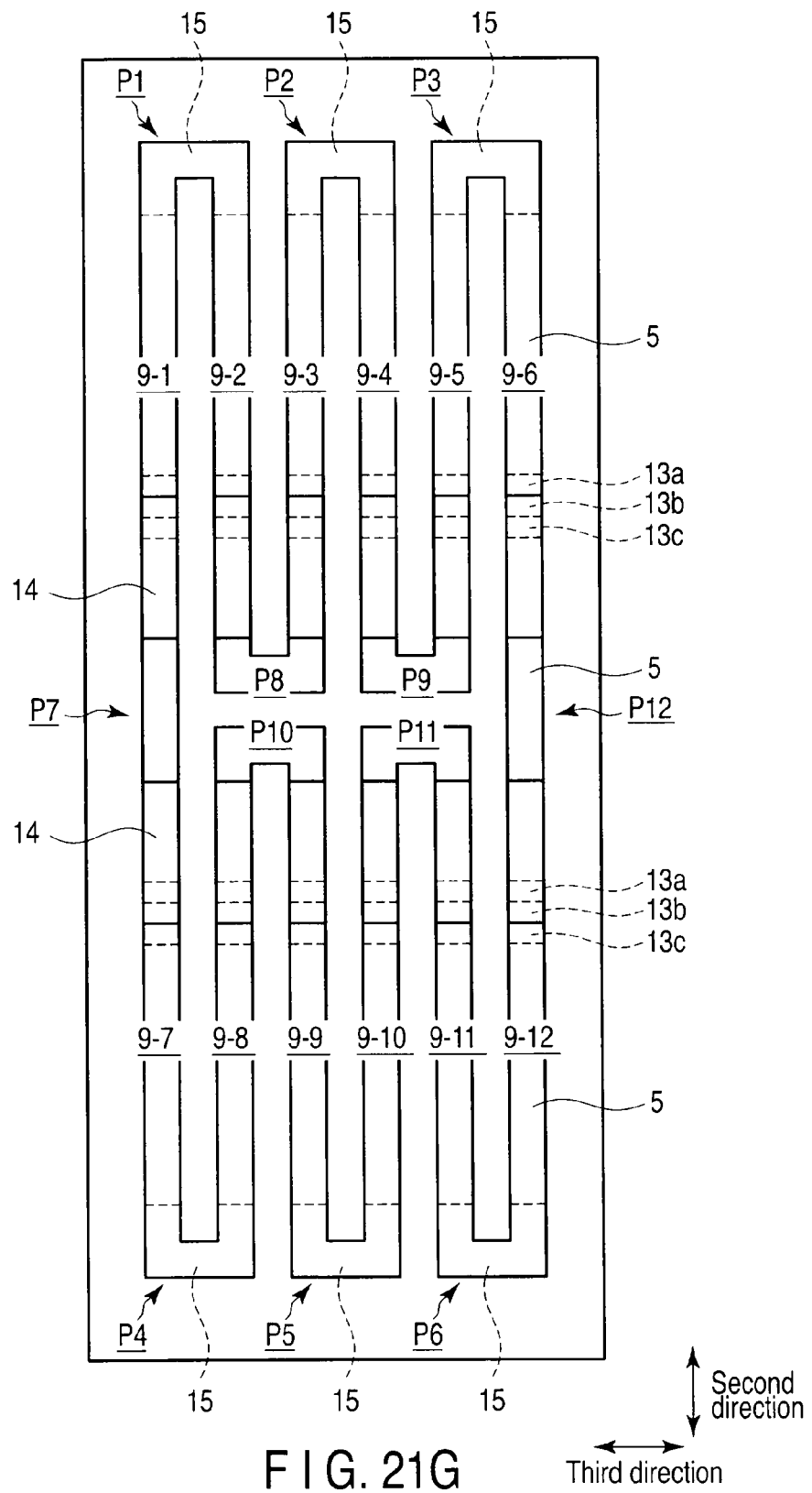
F I G. 21G

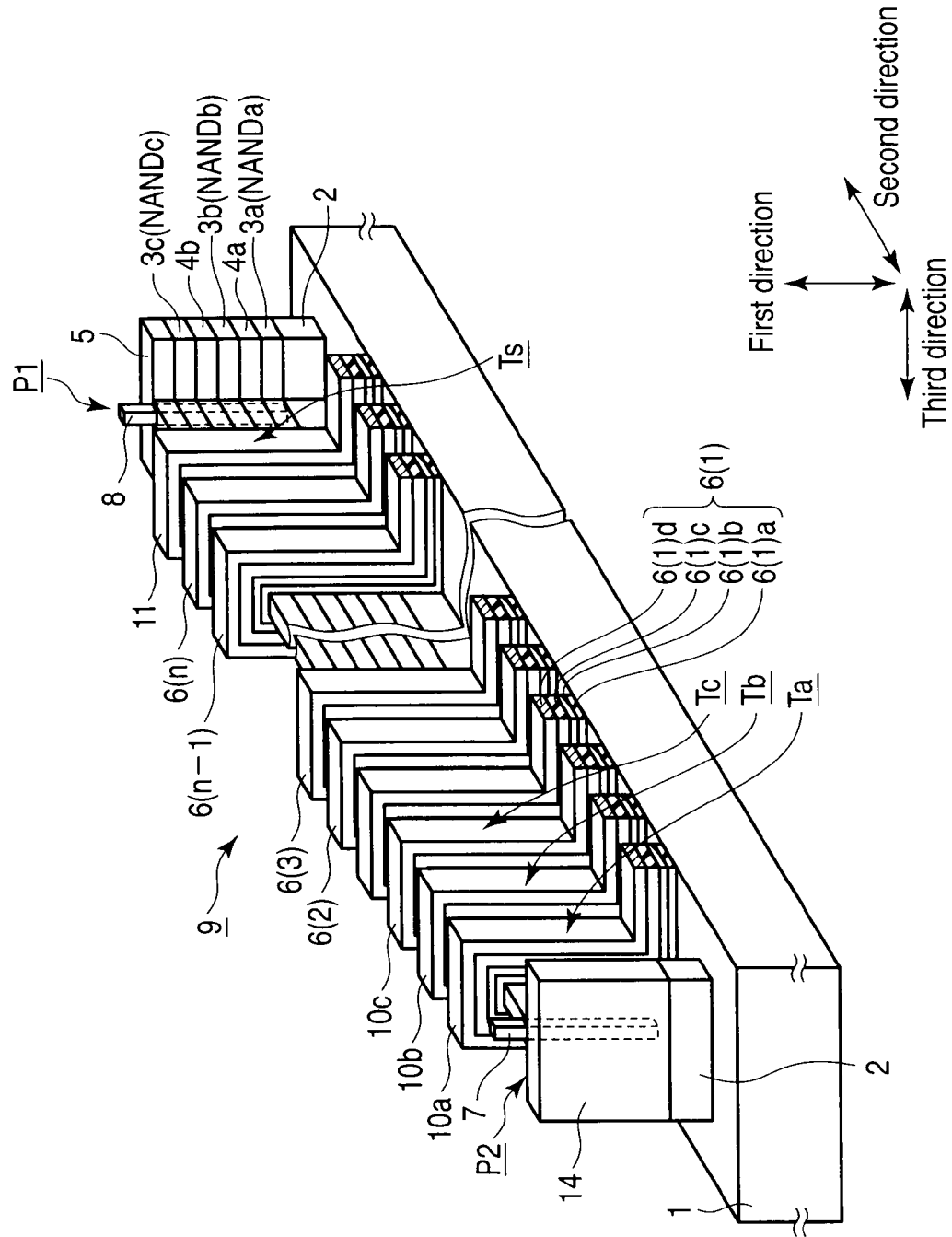
F I G. 23

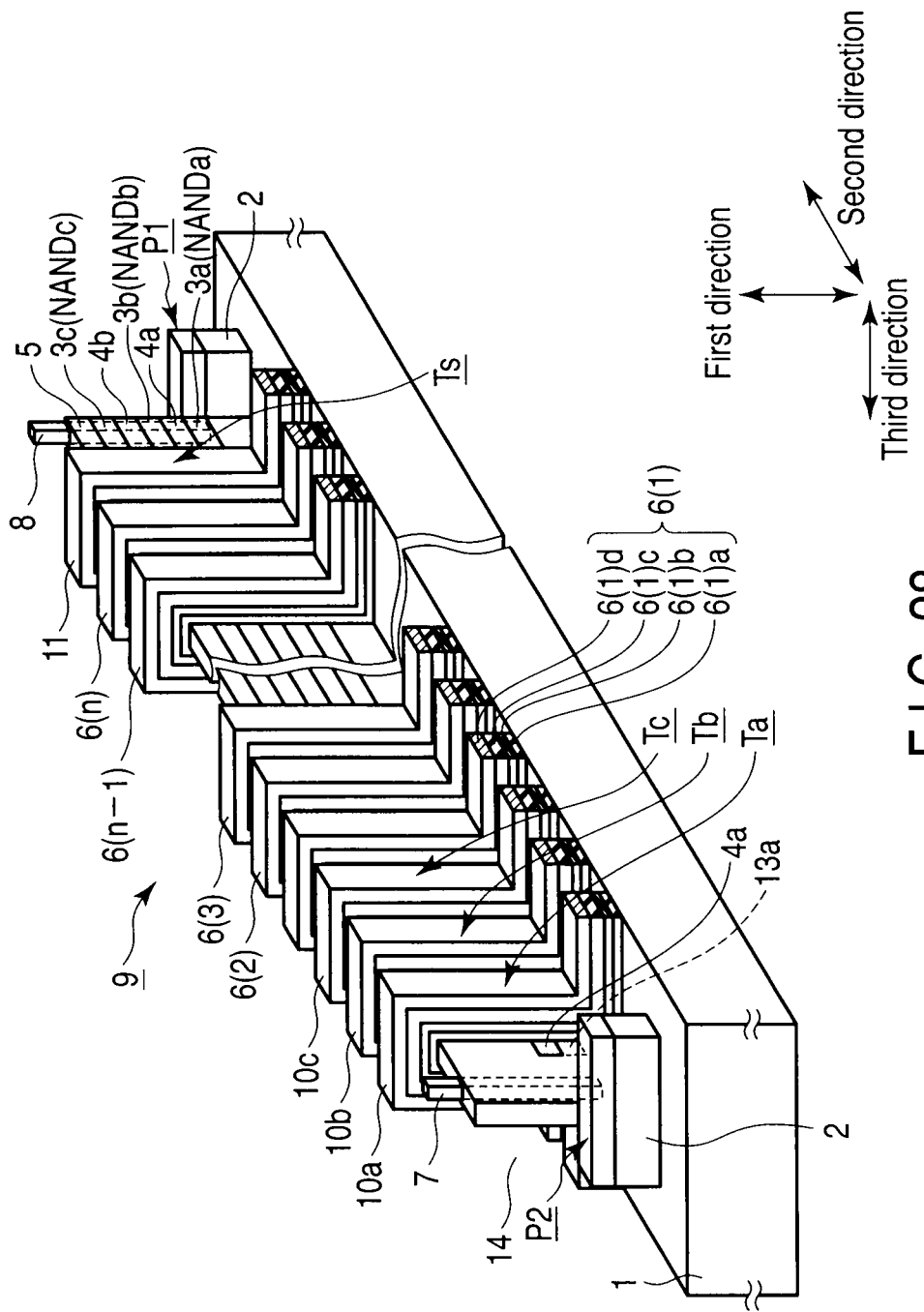
F I G. 28

NONVOLATILE SEMICONDUCTOR MEMORY DEVICE AND METHOD OF MANUFACTURING THE SAME

CROSS-REFERENCE TO RELATED APPLICATIONS

This application is based upon and claims the benefit of priority from Japanese Patent Application No. 2010-211271, filed Sep. 21, 2010; the entire contents of which are incorporated herein by reference.

FIELD

Embodiments described herein relate generally to a nonvolatile semiconductor memory device and a method of manufacturing the same.

BACKGROUND

A design rule needs to be reduced for higher integration and larger capacity of a nonvolatile semiconductor memory device. Further fine machining such as changing of wiring pattern is required for reducing the design rule. However, a remarkably advanced machining technique is required therefor and consequently the design rule is difficult to reduce.

In recent years, there has been proposed a nonvolatile semiconductor memory device having a three-dimensional structure for enhancing a degree of integration of memory cells.

A common characteristic of the nonvolatile semiconductor memory devices lies in that the three-dimensional structure is realized by a fin-type stacked layer structure. Theoretically, the higher integration can be achieved by increasing the number of stacked layers of the fin-type stacked layer structure and reducing a fin width. To the contrary, practically, the fin-type stacked layer structure is more likely to fall along with the increase in the stacked layers and the reduction in the fin width.

Thus, the upper limit of the number of stacked layers and the lower limit of the fin width are necessarily required for preventing a reduction in manufacture yield due to defectives, which is detrimental to the higher integration.

BRIEF DESCRIPTION OF THE DRAWINGS

FIG. 1 shows a structure of first embodiment.
FIG. 3 is a cross-sectional view along III-III line of FIG. 2.
FIG. 4 is a cross-sectional view along IV-IV line of FIG. 2.
FIGS. 9A to 9M show a first example of a manufacturing method.
FIGS. 10A to 10C show a second example of the manufacturing method.
FIGS. 11A to 11C show a third example of the manufacturing method.
FIG. 14 shows a second application example.
FIGS. 18 to 20 show a modification example of a layout.
FIGS. 21A to 21H show an example of the manufacturing method.
FIG. 23 shows a structure of (a) in FIG. 22.
FIG. 28 shows a third application example.

DETAILED DESCRIPTION

In general, according to one embodiment, a nonvolatile semiconductor memory device comprising a semiconductor substrate; first, second, third and fourth fin-type stacked layer structures, each having memory strings stacked in a first direction perpendicular to a surface of the semiconductor substrate, and each extending to a second direction parallel to the surface of the semiconductor substrate; a first part connected to first ends in the second direction of the first and second fin-type stacked layer structures stacked with respect to each other; a second part connected to first ends in the second direction of the third and fourth fin-type stacked layer structures stacked with respect to each other; a third part connected to second ends in the second direction of the first and third fin-type stacked layer structures stacked with respect to each other; and a fourth part connected to second ends in the second direction of the second and fourth fin-type stacked layer structures stacked with respect to each other, wherein each of the memory strings in the first and second fin-type stacked layer structures uses the first part as a source area and uses the third and fourth parts as a drain area, and each of the memory strings in the third and fourth fin-type stacked layer structures uses the second part as the source area and uses the third and fourth parts as the drain area, wherein each of the memory strings has memory cells connected in series in the second direction, each of the memory cells has a semiconductor layer and a stacked gate structure provided on a side surface in a third direction perpendicular to the first and second directions of the semiconductor layer, and the stacked gate structure includes a first insulating layer, a charge storage layer, a second insulating layer and a control gate electrode stacked each other, wherein the control gate electrodes of the memory cells arranged in the first direction in each of the first, second, third and fourth fin-type stacked layer structures are connected to each other.

1. First Embodiment

A. Structure

Figure 2:
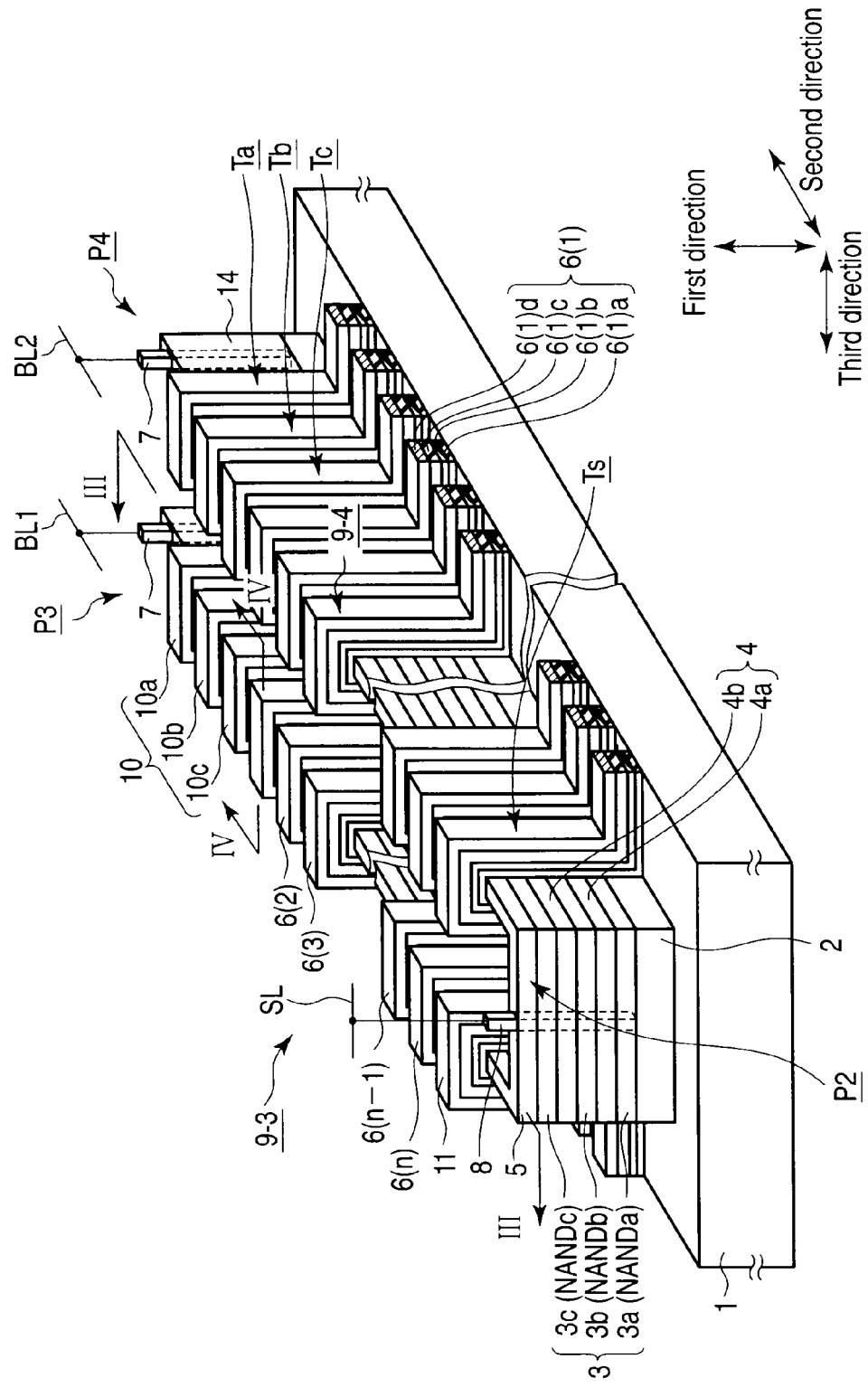
FIG. 2 shows an area X in FIG. 1.

FIG. 1 is a plan view of a nonvolatile semiconductor memory device, FIG. 2 is a perspective view of an area X in FIG. 1, FIG. 3 is a cross-sectional view along III-III line of FIG. 2, and FIG. 4 is a cross-sectional view along IV-IV line of FIG. 2.

A semiconductor substrate 1 is a silicon substrate, for example. First, second, third and fourth fin-type stacked layer structures 9-1, 9-2, 9-3 and 9-4 are formed on the semiconductor substrate 1.

Each of the first, second, third and fourth fin-type stacked layer structures 9-1, 9-2, 9-3 and 9-4 has first, second and third memory strings 3a (NANDa), 3b (NANDb) and 3c (NANDc) stacked in the first direction perpendicular to a surface of the semiconductor substrate 1, and extends in the second direction parallel to the surface of the semiconductor substrate 1.

The present embodiment exemplifies the first, second and third memory strings NANDa, NANDb and NANDc, but is not limited thereto. Generally, each of the first, second, third and fourth fin-type stacked layer structures 9-1, 9-2, 9-3 and 9-4 may have the first to i-th memory strings (i is a natural number of 2. or more).

A first part P1 connects ends in the second direction of the first and second fin-type stacked layer structures 9-1 and 9-2 stacked with respect to each other. A second part P2 connects ends in the second direction of the third and fourth fin-type stacked layer structures 9-3 and 9-4 stacked with respect to each other.

A third part P3 connects the other ends in the second direction of the first and third fin-type stacked layer structures 9-1 and 9-3 stacked with respect to each other. A fourth part P4 connects the other ends in the second direction of the second and fourth fin-type stacked layer structures 9-2 and 9-4 stacked with respect to each other.

The first, second and third memory strings NANDa, NANDb and NANDc in the first and second fin-type stacked layer structures 9-1 and 9-2 use the first part P1 as a source area and the third and fourth parts P3 and P4 as a drain area.

The first, second and third memory strings NANDa, NANDb and NANDc in the third and fourth fin-type stacked layer structures 9-3 and 9-4 use the second part P2 as the source area and the third and fourth parts P3 and P4 as the drain area.

That is, the first, second and third memory strings NANDa, NANDb and NANDc in the first and second fin-type stacked layer structures 9-1 and 9-2 share the first part (source area) P1, and the first, second and third memory strings NANDa, NANDb and NANDc in the third and fourth fin-type stacked layer structures 9-3 and 9-4 share the second part (source area) P2.

The first, second and third memory strings NANDa, NANDb and NANDc in the first and third fin-type stacked layer structures 9-1 and 9-3 share the third part (drain area) P3, and the first, second and third memory strings NANDa, NANDb and NANDc in the second and fourth fin-type stacked layer structures 9-2 and 9-4 share the fourth part (drain area) P4.

Each of the first, second and third memory strings NANDa, NANDb and NANDc has first, second and third semiconductor layers 3 (3a, 3b, 3c) and stacked gate structures 6(1), 6(2), ... 6(n) provided on the side surface in the third direction perpendicular to the first and second directions of the first, second and third semiconductor layers 3 (3a, 3b, 3c). The stacked gate structure 6(1) has a first insulating layer 6(1)a, a charge storage layer 6(1)b, a second insulating layer 6(1)c. and a control gate electrode 6(1)d, for example.

The first insulating layer 6(1)a. functions as a gate insulating layer, and the second insulating layer 6(1)c. functions as a block insulating layer for blocking leak current between the charge storage layer 6(1)b. and the control gate electrode 6(1)d.

In this embodiment, the first, second and third memory strings NANDa, NANDb and NANDc cover two opposite side surfaces in the third direction of the first, second and third semiconductor layers 3 (3a, 3b, 3c). That is, the first, second and third memory strings NANDa, NANDb and NANDc have a double gate structure.

Insulating layers 2, 4 (4a, 4b) isolate the semiconductor layers 3 (3a, 3b, 3c) from each other.

The first, second and third memory strings NANDa, NANDb and NANDc in the first and second fin-type stacked layer structures 9-1 and 9-2 share the control gate electrode 6(1)d, and the first, second and third memory strings NANDa, NANDb and NANDc in the third and fourth fin-type stacked layer structures 9-3 and 9-4 share the control gate electrode 6(1)d.

The first, second and third memory strings NANDa, NANDb and NANDc use the first, second and third semiconductor layers 3 (3a, 3b, 3c) as a channel. Since a memory string uses a semiconductor layer as a channel, an increase in semiconductor layers constituting a fin-type stacked layer structure and an increase in memory strings are desirable for higher integration.

The first part P1 has a first source electrode 8 which connects the first, second and third memory strings NANDa, NANDb and NANDc in the first and second fin-type stacked layer structures 9-1 and 9-2 stacked with respect to each other. Similarly, the second part P2 has a second source electrode 8 which connects the first, second and third memory strings NANDa, NANDb and NANDc in the third and fourth fin-type stacked layer structures 9-3 and 9-4 stacked with respect to each other.

The third part P3 has a first common semiconductor 14 which connects the first, second and third memory strings NANDa, NANDb and NANDc in the first and third fin-type stacked layer structures 9-1 and 9-3 stacked with respect to each other, and a first drain electrode 7 connected to the first common semiconductor 14. Similarly, the fourth part P4 has a second common semiconductor 14 which connects the first, second and third memory strings NANDa, NANDb and NANDc in the second and fourth fin-type stacked layer structures 9-2 and 9-4 stacked with respect to each other, and a second drain electrode 7 connected to the second common semiconductor 14.

Bit lines BL1 and BL2 are connected to the drain electrodes 7 and a source line SL is connected to the source electrodes 8.

The first, second and third memory strings NANDa, NANDb and NANDc in the first, second, third and fourth fin-type stacked layer structures 9-1, 9-2, 9-3 and 9-4 has first, second and third layer-select transistors Ta, Tb and Tc in this order from the first drain electrode 7 side, respectively.

The number of layer-select transistors Ta, Tb and Tc is equal to the number of memory strings NANDa, NANDb and NANDc. Generally, when each of the first, second, third and fourth fin-type stacked layer structures 9-1, 9-2, 9-3 and 9-4 has the first to i-th memory strings (i is a natural number of 2. or more), each of the first, second, third and fourth fin-type stacked layer structures 9-1, 9-2, 9-3 and 9-4 has the first to i-th layer-select transistors.

The first, second and third layer-select transistors Ta, Tb and Tc have first, second and third select gate electrodes 10 (10a, 10b, 10c) extending in the first direction by straddling the first, second and third semiconductor layers 3 (3a, 3b, 3c), respectively.

In this embodiment, the first, second and third select gate electrodes 10 (10a, 10b, 10c) cover two opposite side surfaces in the third direction of the first, second and third semiconductor layers 3 (3a, 3b, 3c). That is, the first, second and third layer-select transistors Ta, Tb and Tc have a double gate structure.

A source side select transistor Ts is provided between the first, second and third memory strings NANDa, NANDb, NANDc, and the source electrode 8.

The source side select transistor Ts has a select gate electrode 11 extending in the first direction by straddling the first, second and third semiconductor layers 3 (3a, 3b, 3c).

In this embodiment, the source side select gate electrode 11 covers two opposite side surfaces in the third direction of the first, second and third semiconductor layers 3 (3a, 3b, 3c). That is, the source side select transistor Ts also has a double gate structure.

The first, second and third layer-select transistors Ta, Tb, Tc and the source side select transistor Ts are not limited in their structures while functioning as a switch device.

For example, the first, second and third layer-select transistors Ta, Tb, Tc and the source side select transistor Ts may have the same structure as the memory cells constituting the first, second and third memory strings NANDa, NANDb and NANDc, or may have a different structure therefrom.

Edge positions of the second and third insulating layers 4 (4a, 4b) at the drain electrode 7 side will be described.

The edge of the second insulating layer 4a. at the drain electrode 7 side is at the same position as the edges of the first, second and third memory strings NANDa, NANDb and NANDc of the first select gate electrode 10a. or closer to the drain electrode 7 side.

Figure 5:
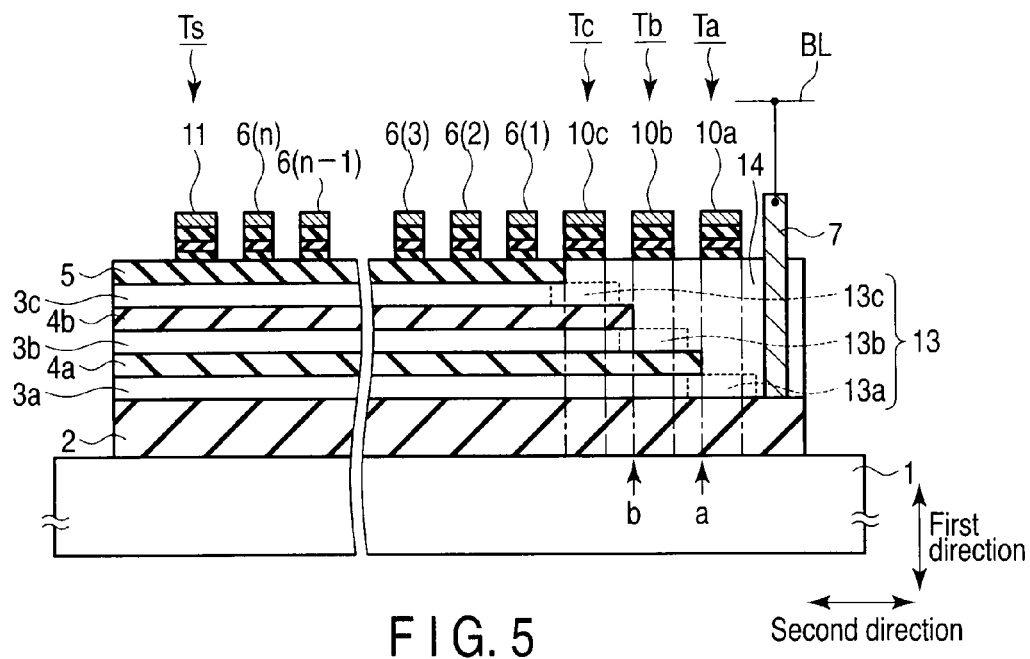
FIG. 5 shows an edge location of an insulating layer.

For example, as shown in FIG. 5, the edge of the second insulating layer 4a. at the drain electrode 7 side is at point a or closer to the drain electrode 7 side.

The edge of the third insulating layer 4b. at the drain electrode 7 side is at the same position as the edges of the first, second and third memory strings NANDa, NANDb and NANDc of the second select gate electrode 10b. or closer to the drain electrode 7 side.

For example, as shown in FIG. 5, the edge of the third insulating layer 4b. at the drain electrode 7 side is at point b or closer to the drain electrode 7 side.

Threshold states of the first, second and third layer-select transistors Ta, Tb and Tc will be described.

The first layer-select transistor Ta nearest to the drain electrode 7 is a normally on-state within a range of voltage to be applied to the first select gate electrode 10a. in the lowermost first semiconductor layer 3a. (uncontrollable state).

The normally on-state is realized by providing an impurity area 13a. in the first semiconductor layer 3a as a channel of the first layer-select transistor Ta.

For the second and third semiconductor layers 3b and 3c, the first layer-select transistor Ta is on/off controlled within a range of voltage to be applied to the first select gate electrode 10a.

The second layer-select transistor Tb is a normally on-state within a range of voltage to be applied to the second select gate electrode 10b. in the intermediate second semiconductor layer 3b (uncontrollable state).

The normally on-state is realized by providing an impurity area 13b. in the second semiconductor layer 3b as the channel of the second layer-select transistor Tb.

For the first and third semiconductor layers 3a and 3c, the second layer-select transistor Tb is on/off controlled within a range of voltage to be applied to the second select gate electrode 10b.

The third layer-select transistor Tc furthest from the drain electrode 7 is a normally on-state within a range of voltage to be applied to the third select gate electrode 10c. in the uppermost third semiconductor layer 3c. (uncontrollable state).

The normally on-state is realized by providing an impurity area 13c. in the third semiconductor layer 3c as the channel of the third layer-select transistor Tc.

For the first and second semiconductor layers 3a and 3b, the third layer-select transistor Tc is on/off controlled within a range of voltage to be applied to the third select gate electrode 10c.

With the structure, the first, second and third memory strings NANDa, NANDb and NANDc can share a drain electrode 7 and can block a leak path passing through non-selected memory strings.

For example, when the first layer-select transistor Ta is turned off in the second and third memory strings NANDb and NANDc, the first, second and third layer-select transistors Ta, Tb and Tc are all turned on in the first memory string NANDa, and current is applied through the first memory string NANDa, a leak path from the first memory string NANDa to the second and third memory strings NANDb and NANDc is blocked by the second insulating layer 4a.

The first, second, third and fourth fin-type stacked layer structures 9-1, 9-2, 9-3, 9-4 and the first, second, third and fourth parts P1, P2, P3, P4 form the entire plane in a ring shape. For the ring shape, the first and second fin-type stacked layer structures 9-1, 9-2, and the third and fourth fin-type stacked layer structures 9-3, 9-4 are symmetrically provided relative to line Q connecting the drain electrodes 7 in the third direction.

Thus, even if the number of memory strings in each of the first, second, third and fourth fin-type stacked layer structures 9-1, 9-2, 9-3 and 9-4 is increased and a fin width of each of the first, second, third and fourth fin-type stacked layer structures 9-1, 9-2, 9-3 and 9-4 is made smaller, the first, second, third and fourth fin-type stacked layer structures 9-1, 9-2, 9-3 and 9-4 will not fall.

B. Examples of Materials

Optimum materials depending on each generation of semiconductor memory can be appropriately selected for materials constituting each component of the device structure shown in FIGS. 1 to 4.

For example, the first insulating layer 2 is made of silicon oxide ($SiO_2$). The first, second and third semiconductor layers 3 (3a, 3b, 3c) are made of monocrystal silicon (Si), for example. The first, second and third semiconductor layers 3 (3a, 3b, 3c) are desirably monocrystal, but may be amorphous or polycrystal.

The second and third insulating layers 4 (4a, 4b) are made of silicon oxide ($SiO_2$), for example. The fourth insulating layer 5 is made of silicon oxide ($SiO_2$), silicon nitride ($SiN_x$) or stack thereof, for example.

The first, second and third memory strings NANDa, NANDb and NANDc has SONOS (silicon/oxide/nitride/oxide/silicon) type.

The first and second common semiconductors 14 are made of monocrystal silicon (Si), for example, and are integrated with the first, second and third semiconductor layers 3 (3a, 3b, 3c). The first and second common semiconductors 14 are desirably monocrystal but may be amorphous or polycrystal like the first, second and third semiconductor layers 3 (3a, 3b, 3c).

The first gate insulating layer 6(1)a. may be of $SiO_2$, the charge storage layer 6(1)b. may be of $Si_3N_4$, the second gate insulating layer 6(1)c. may be of $Al_2O_3$, and the control gate electrode 6(1)d. may be of NiSi.

The first gate insulating layer 6(1)a. may have a stacked layer structure of silicon oxynitride, silicon oxide and silicon nitride. The first gate insulating layer 6(1)a. may contain silicon nanoparticle or metal ion.

The charge storage layer 6(1)b. is made of at least one of silicon-rich SiN, $Si_xN_y$. having an arbitrary composition ratio of x and y of silicon and nitrogen, silicon oxynitride (SiON), aluminum oxide ($Al_2O_3$), aluminum oxynitride (AlON), Hafnium ($HfO_2$), Hafnium aluminate ($HfAlO_3$), hafnium nitride (HfON), hafnium aluminate nitride (HfAlON), hafnium Silicate (HfSiO), Hafnium silicate nitride (HfSiON), lanthanum oxide ($La_2O_3$) and lanthanum aluminate ($LaAlO_3$).

The charge storage layer 6(1)b. may contain silicon nanoparticle or metal ion. The charge storage layer 6(1)b. may be made of a conductor such as impurity-added polysilicon or metal.

The second gate insulating layer 6(1)c. may be made of at least one of silicon oxide ($SiO_2$), silicon oxynitride (SiON), aluminum oxide ($Al_2O_3$), aluminum oxynitride (AlON), hafnium ($HfO_2$), hafnium aluminate ($HfAlO_3$), hafnium nitride (HfON), hafnium aluminate nitride (HfAlON), hafnium silicate (HfSiO), hafnium silicate nitride (HfSiON), lanthanum oxide ($La_2O_3$), lanthanum aluminate ($LaAl0_3$) and lanthanum aluminum silicate (LaAlSiO).

The control gate electrode 6(1)d. may be made of metal compound such as tantalum nitride (TaN), tantalum carbide (TaC) or titanium nitride (TiN), or Ni, V, Cr, Mn, Y, Mo, Ru, Rh, Hf, Ta, W, Ir, Co, Ti, Er, Pt, Pd, Zr, Gd, Dy, Ho, Er and their silicide indicating metallic electric conductivity.

The impurities constituting the impurity areas 13a, 13b. and 13c. may be n-type semiconductor including quinquevalent element such as arsenic (As) or phosphorous (P), p-type semiconductor including triad such as boron (B) or indium (In), or combination thereof.

The rain electrode 7 and the source electrode 8 are made of metallic material such as W or Al.

C. Modification Examples

C-1. First Modification Example

Figure 6:
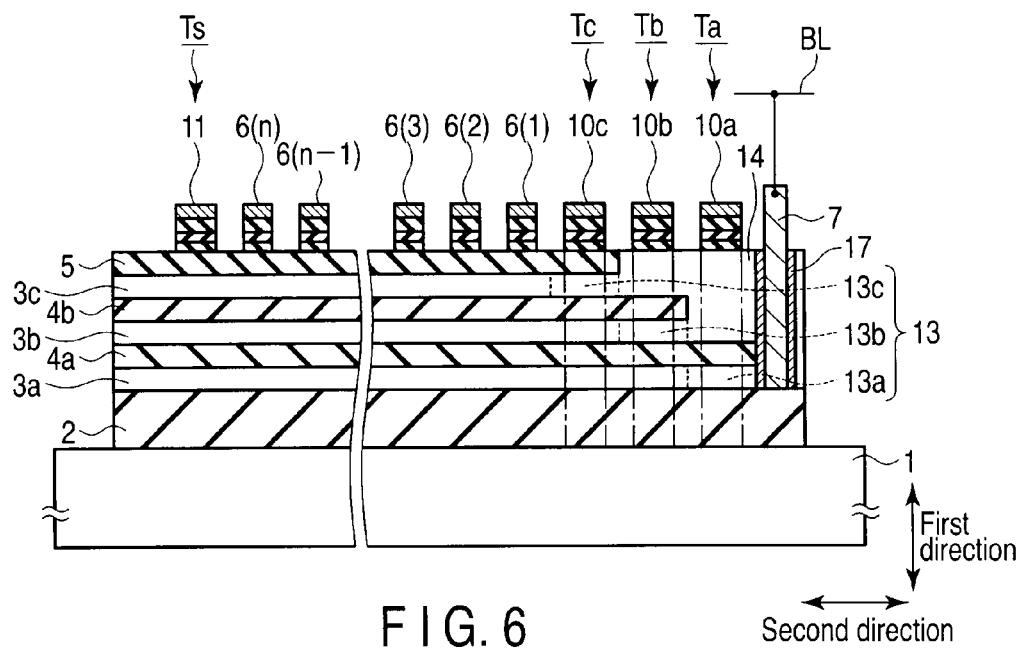
FIG. 6 shows a first modification example.

FIG. 6 shows a first modification example of the device structure shown in FIGS. 1 to 4.

Like reference numerals are denoted to like elements similar to those in FIGS. 1 to 4 and thus a detailed explanation thereof will be omitted.

The first modification example is characterized in that a diffusing layer 17 surrounding the drain electrode 7 is formed in the first and second common semiconductor layers 14.

The diffusing layer 17 may be made of n-type semiconductor impurity, p-type semiconductor impurity or combination thereof similar to the impurity areas 13a, 13b. and 13c.

The diffusing layer 17 serves to reduce a contact resistance between the first and second common semiconductors 14, and the drain electrode 7.

C-2. Second Modification Example

Figure 7:
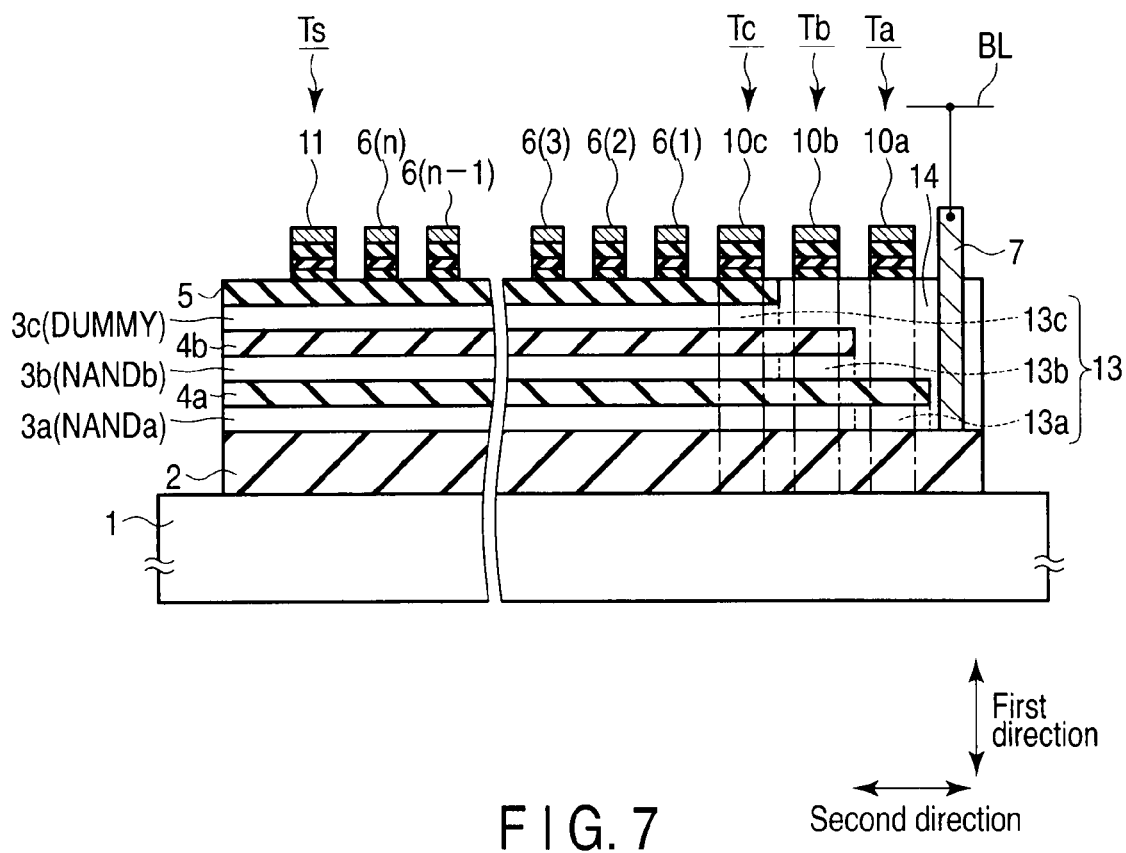
FIG. 7 shows a second modification example.

FIG. 7 shows a second modification example of the device structure shown in FIGS. 1 to 4.

Like reference numerals are denoted to like elements similar to those in FIGS. 1 to 4 and thus a detailed explanation thereof will be omitted.

The second modification example is characterized in that the third memory string (DUMMY) which uses the uppermost third semiconductor layer 3c. as the channel among the first, second and third semiconductor layers 3a, 3b. and 3c. constituting each of the first, second, third and fourth fin-type stacked layer structures 9-1, 9-2, 9-3 and 9-4 is formed by dummy cells as non-memory cells.

The uppermost layer is a dummy layer because the impurity area 13c. is formed within the substantially entire uppermost third semiconductor layer 3c. when the structure shown in FIGS. 1 to 4 is formed by way of a manufacturing method described later, for example.

In this example, since the uppermost third semiconductor layer 3c. is a dummy layer, the third layer-select transistor Tc furthest from the drain electrode 7 is not indispensable. That is, the third layer-select transistor Tc may be omitted.

D. Memory Cell Array Structure

Figure 8:
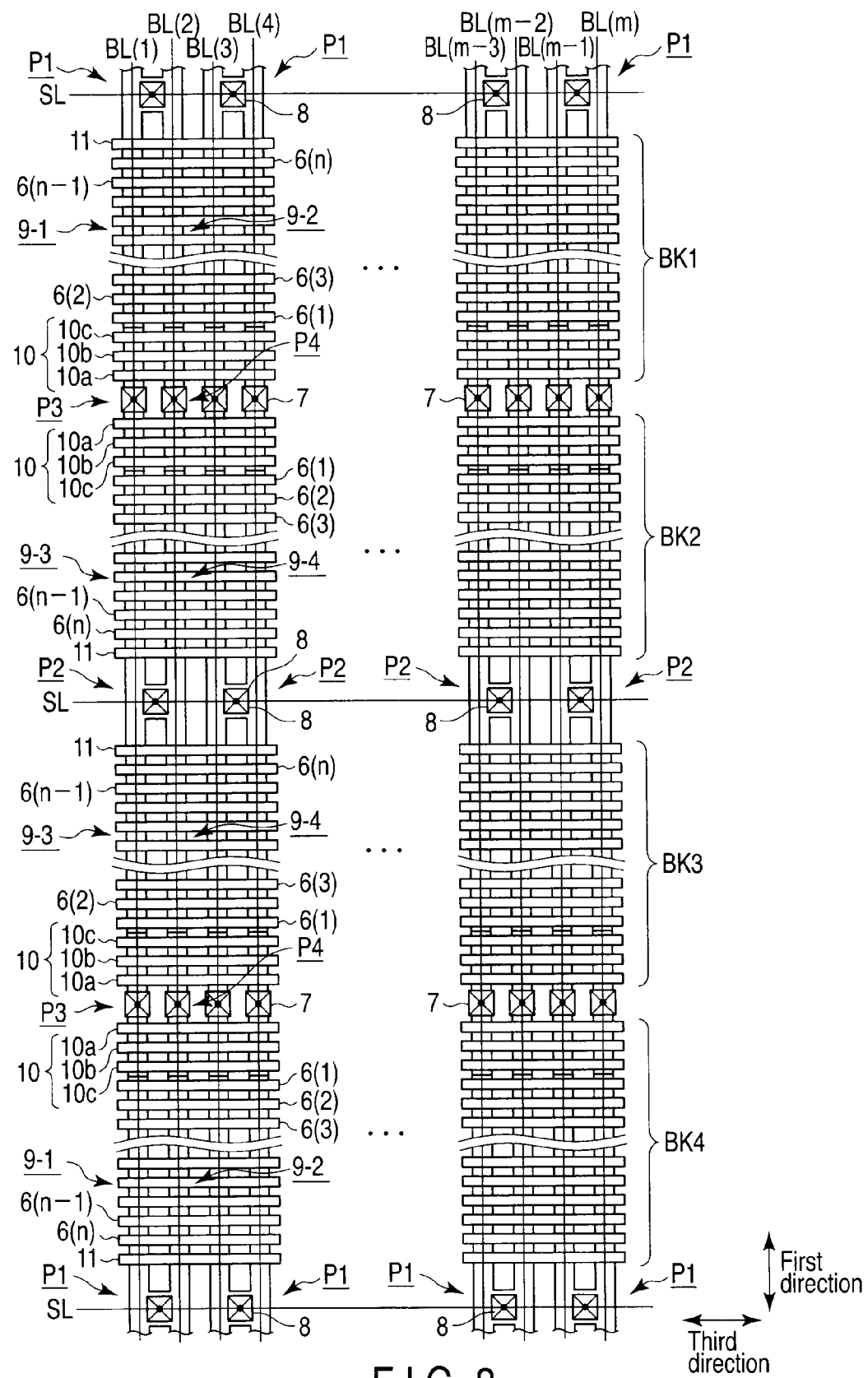
FIG. 8 shows a memory cell array.

FIG. 8 shows a memory cell array utilizing the device structure shown in FIGS. 1 to 4.

Like reference numerals are denoted to like elements similar to those in FIGS. 1 to 4 and thus a detailed explanation thereof will be omitted.

The memory cell array is formed such that units are provided in the second and third directions in an array, each unit including the first, second, third and fourth fin-type stacked layer structures (ring-shaped) 9-1, 9-2, 9-3 and 9-4 shown in FIGS. 1 to 4.

Two contiguous units in the second direction share one of the first and second parts (source areas) P1 and P2.

Two contiguous units in the third direction are isolated from each other. For the two contiguous units in the third direction, the third and fourth parts (drain areas) P3 and P4 may be jointed with each other. In this case, a drain area needs to correspond to a fin-type stacked layer structure.

The bit lines BL(1), BL(2), . . . BL(m) are commonly connected to the drain electrodes 7 which extend and are provided side by side in the second direction. m is a natural number of 2. or more. The source line SL is commonly connected to the source electrodes 8 which extend and are provided side by side in the third direction.

In the memory cell array structure, a group including the fin-type stacked layer structures provided side by side in the third direction is defined as a block, for example. In this example, four blocks BK1, BK2, BK3 and BK4 are shown. In this case, the number of memory strings in a block is (the number of memory strings in a fin-type stacked layer structure)×(the number m of columns). Thus, a three-dimensional stacked layer semiconductor memory having a larger memory capacity can be realized.

E. Operations

The operations of the third-dimensional stacked layer semiconductor memory according to the first embodiment (FIGS. 1 to 8) will be described.

A write operation is as follows.

First, when writing is performed on the memory string NANDa using the first semiconductor layer 3a. as the channel, a ground potential is applied to the drain electrode 7 and the source electrode 8, and a first positive bias is applied to the select gate electrodes 10b, 10c. and the control gate electrodes 6(1)d, . . . 6(n)d. A bias is not applied to the select gate electrodes 10a. and 11.

At this time, an n-type impurity storing area is formed in each of the first, second and third semiconductor layers 3 (3a, 3b, 3c) as the channels of the first, second and third layer-select transistors Ta, Tb, Tc and the first, second and third memory strings NANDa, NANDb, NANDc.

Since a bias is not applied to the select gate electrode 10a, the first layer-select transistor Ta is at the off-state in the second and third semiconductor layers 3b. and 3c, and at the on-state in the first semiconductor layer 3a. due to the impurity area 13a. Since a bias is not applied to the select gate electrode 11, the source side select transistor Ts is at the off-state in the first, second and third semiconductor layers 3 (3a, 3b, 3c).

Thereafter, a second positive bias larger than the first positive bias is applied to the control gate electrode of a selected memory cell to be written, and program data "0"/"1" is transferred from the bit lines BL(1), BL(2), . . . BL(m) to the drain electrodes 7.

Since a channel potential increases due to capacity coupling caused by the application of the second positive bias in the second and third semiconductor layers 3b. and 3c. in which the non-selected memory strings NANDb and NANDc are formed, respectively, a sufficiently large voltage is not applied between the control gate electrode (or charge storage layer) and the channel and thus the writing is inhibited.

Since the first layer-select transistor Ta is at the on-state in the first semiconductor layer 3a. in which the selected memory string NANDa is formed, the program data "0"/"1" is transferred to the first semiconductor layer 3a. as the channel.

When the program data is "0", the first semiconductor layer 3a. as the channel is at the positive potential, for example. In this state, when the second positive bias is applied to the control gate electrode of a selected memory cell and the channel potential slightly increases due to capacity coupling, the first layer-select transistor Ta enters the cutoff state.

Thus, the channel potential increases, because the capacity coupling causes by applying the second positive bias in the first semiconductor layer 3a. That is, a sufficiently large voltage is not applied between the control gate electrode (or charge storage layer) and the channel and electrons are not implanted into the charge storage layer so that the writing is inhibited ("0"-programming).

To the contrary, when the program data is "1", the first semiconductor layer 3a. as the channel is at the ground potential, for example. In this state, even when the second positive bias is applied to the control gate electrode of the selected memory cell, the first layer-select transistor Ta will not enter the cutoff state.

Therefore, the ground potential is applied to the first semiconductor layer 3a. as the channel and the second positive bias is applied to the control gate electrode. That is, a sufficiently large voltage occurs between the control gate electrode (or charge storage layer) and the channel and electrons are implanted into the charge storage layer so that the writing is performed ("1"-programming).

Next, when the writing is performed on the memory string NANDb using the second semiconductor layer 3b. as the channel, the ground potential is applied to the drain electrode 7 and the source electrode 8, and the first positive bias is applied to the select gate electrodes 10a, 10c. and the control gate electrodes 6(1)d, ... 6(n)d. A bias is not applied to the select gate electrodes 10b. and 11.

At this time, an n-type impurity storing area is formed in each of the first, second and third semiconductor layers 3 (3a, 3b, 3c) as the channels of the first, second and third layer-select transistors Ta, Tb, Tc and the first, second and third memory strings NANDa, NANDb, NANDc, for example.

Since a bias is not applied to the select gate electrode 10b, the second layer-select transistor Tb is at the off-state in the first and third semiconductor layers 3a. and 3c. and at the on-state in the second semiconductor layer 3b. due to the impurity area 13b. Since a bias is not applied to the select gate electrode 11, the source side select transistor Ts is at the off-state in the first, second and third semiconductor layers 3 (3a, 3b, 3c).

Thereafter, the second positive bias larger than the first positive bias is applied to the control gate electrode of the selected memory cell to be written, and the program data "0"/"1" is transferred from the bit lines BL(1), BL(2), ... BL(m) to the drain electrodes 7.

Since the channel potential increases, because the capacity coupling causes by applying the second positive bias in the first and third semiconductor layers 3a. and 3c. in which the non-selected memory strings NANDa and NANDc are formed, respectively, a sufficiently large voltage is not applied between the control gate electrode (or charge storage layer) and the channel so that the writing is inhibited.

Since the second layer-select transistor Tb is at the on-state in the second semiconductor layer 3b. in which the selected memory string NANDb is formed, the program data "0"/"1" is transferred to the second semiconductor layer 3b. as the channel.

When the program data is "0", the second semiconductor layer 3b. as the channel enters the positive potential, for example. In this state, when the second positive bias is applied to the control gate electrode of the selected memory cell and the channel potential slightly increases due to the capacity coupling, the second layer-select transistor Tb enters the cut-off state.

Thus, the channel potential increases, because the capacity coupling causes by applying the second positive bias in the second semiconductor layer 3b. That is, a sufficiently large voltage is not applied between the control gate electrode (or charge storage layer) and the channel and electrons are not implanted into the charge storage layer so that the writing is inhibited ("0"-programming).

To the contrary, when the program data is "1", the second semiconductor layer 3b. as the channel enters the ground potential, for example. In this state, even when the second positive bias is applied to the control gate electrode of the selected memory cell, the second layer-select transistor Tb remains at the on-state.

Thus, the ground potential is applied to the second semiconductor layer 3b. as the channel and the second positive bias is applied to the control gate electrode. That is, a sufficiently large voltage occurs between the control gate electrode (or charge storage layer) and the channel and electrons are implanted into the charge storage layer so that the writing is performed ("1"-programming).

Lastly, when the writing is performed on the memory string NANDc using the third semiconductor layer 3c. as the channel, the ground potential is applied to the drain electrode 7 and the source electrode 8, and the first positive bias is applied to the select gate electrodes 10a, 10b. and the control gate electrodes 6(1)d, ... 6(n)d. A bias is not applied to the select gate electrodes 10c. and 11.

At this time, an n-type impurity storing area is formed in each of the first, second and third semiconductor layers 3 (3a, 3b, 3c) as the channels of the first, second and third layer-select transistors Ta, Tb, Tc and the first, second and third memory strings NANDa, NANDb, NANDc, for example.

Since a bias is not applied to the select gate electrode 10c, the third layer-select transistor Tc is at the off-state in the first and second semiconductor layers 3a. and 3b, and at the on-state in the third semiconductor layer 3c. due to the impurity area 13c. Since a bias is not applied to the select gate electrode 11, the source side select transistor Ts is at the off-state in the first, second and third semiconductor layers 3 (3a, 3b, 3c).

Thereafter, the second positive bias larger than the first positive bias is applied to the control gate electrode of the selected memory cell to be written and the program data "0"/"1" is transferred from the bit lines BL(1), BL(2), ... BL(m) to the drain electrode 7.

Since the channel potential increases, because the capacity coupling causes by applying the third bias in the first and second semiconductor layers 3a. and 3b. in which the non-selected memory strings NANDa and NANDb are formed, respectively, a sufficiently large voltage is not applied between the control gate electrode (or charge storage layer) and the channel and thus the writing is inhibited.

Since the third layer-select transistor Tc is at the on-state in the third semiconductor layer 3c. in which the selected memory string NANDc is formed, the program data "0"/"1" is transferred to the third semiconductor layer 3c. as the channel.

When the program data is "0", the third semiconductor layer 3c. as the channel enters the positive potential, for example. In this state, when the second positive bias is applied to the control gate electrode of the selected memory cell and the channel potential slightly increases due to the capacity coupling, the third layer-select transistor Tc enters the cutoff state.

Thus, the channel potential increases, because the capacity coupling causes by applying the second positive bias in the third semiconductor layer 3c. That is, a sufficiently large voltage is not applied between the control gate electrode (or charge storage layer) and the channel and electrons are not implanted into the charge storage layer so that the writing is inhibited ("0"-programming).

To the contrary, when the program data is "1", the third semiconductor layer 3c. as the channel enters the ground potential, for example. In this state, even when the second positive bias is applied to the control gate electrode of the selected memory cell, the third layer-select transistor Tc remains at the on-state.

Thus, the ground potential is applied to the third semiconductor layer 3c. as the channel and the second positive bias is applied to the control gate electrode. That is, a sufficiently large voltage occurs between the control gate electrode (or charge storage layer) and the channel and electrons are implanted into the charge storage layer so that the writing is performed ("1"-programming).

An erase operation is as follows.

First Example

The erase operation is collectively performed on the first, second and third memory strings NANDa, NANDb and NANDc in the fin-type stacked layer structure, for example (Block erase No. 1).

At first, a ground potential is applied to the drain electrode 7 and the source electrode 8 and a first negative bias is applied to the select gate electrode 10a, 10b, 10c, 11 and the control gate electrodes 6(1)d, . . . 6(n)d.

At this time, a p-type impurity storing area is formed in each of the first, second and third semiconductor layers 3 (3a, 3b, 3c) as the channels of the first, second and third layer-select transistors Ta, Tb, Tc and the first, second and third memory strings NANDa, NANDb, NANDc, for example.

Then, a second negative bias larger than the first negative bias is applied to the control gate electrodes 6(1)d, . . . 6(n)d.

Consequently, a sufficiently large voltage occurs between the control gate electrode (or charge storage layer) and the channel and electrons inside the charge storage layer are discharged to the channel so that the erasing is performed.

Second Example

The erase operation can be performed on one of the first, second and third memory strings NANDa, NANDb and NANDc in the fin-type stacked layer structure, for example (Block erase No. 2).

For example, when the erasing is performed on the first memory string NANDa, a bias is not applied to the select gate electrodes 10a. and 11 similar to the writing. Thus, since the first layer-select transistor Ta enters the off-state in the second and third semiconductor layers 3b. and 3c, the erasing can be selectively performed on the first memory string NANDa.

When the erasing is performed on the second memory string NANDb, a bias is not applied to the select gate electrodes 10b. and 11 similar to the writing. Thus, since the second layer-select transistor Tb enters the off-state in the first and third semiconductor layers 3a. and 3c, the erasing can be selectively performed on the second memory string NANDb.

When the erasing is performed on the third memory string NANDc, a bias is not applied to the select gate electrodes 10c. and 11 similar to the writing. Thus, since the third layer-select transistor Tc enters the off-state in the first and second semiconductor layers 3a. and 3b, the erasing can be selectively performed on the third memory string NANDc.

Third Example

The erase operation can be also performed on a memory cell among the first, second and third memory strings NANDa, NANDb and NANDc in the fin-type stacked layer structure (page erase/one-cell erase).

In this case, the following conditions are added to the conditions of the first or second example.

The second negative bias larger than the first negative bias is applied to the control gate electrode of a selected memory cell to be erased. The second negative bias is not applied to the control gate electrode of the non-selected memory cell not to be erased.

Thus, a sufficiently large voltage occurs between the control gate electrode (or charge storage layer) and the channel and electrons inside the charge storage layer are discharged so that the erasing is performed only for the selected memory cell.

A read operation is as follows.

At first, when reading is performed on the memory string NANDa using the first semiconductor layer 3a. as the channel, the drain electrode 7 is connected to a read circuit and a ground potential is applied to the source electrode 8. The first positive bias is applied to the select gate electrodes 10b, 10c, 11 and the control gate electrodes 6(1)d, . . . 6(n)d.

The first positive bias has a value at which the memory cell is at the on-state irrespective of "0"/"1"-data. A bias is not applied to the select gate electrode 10a.

At this time, since a bias is not applied to the select gate electrode 10a, the first layer-select transistor Ta is at the off-state in the second and third semiconductor layers 3b. and 3c. and at the on-state in the first semiconductor layer 3a.

Thereafter, data is sequentially read from the source side memory cell toward the drain side memory cell for the memory string NANDa.

The second positive bias for the reading, which is smaller than the first positive bias, is applied to the control gate electrode of the selected memory cell to be read, for example. The second positive bias has a value between "0"-data threshold and "1"-data threshold, for example.

Thus, since on/off of the selected memory cell is determined depending on the data value stored in the selected memory cell, the reading can be performed by using the read circuit to detect a change in potential of the bit lines BL(1), BL(2), BL(m) or a change in current passing through the bit lines BL(1), BL(2), . . . BL(m).

Next, when the reading is performed on the memory string NANDb using the second semiconductor layer 3b. as the channel, the drain electrode 7 is connected to the read circuit and the ground potential is applied to the source electrode 8. The first positive bias is applied to the select gate electrodes 10a, 10b, 11 and the control gate electrodes 6(1)d, . . . 6(n)d.

The first positive bias has a value at which the memory cell is at the on-state irrespective of "0"/"1"-data, for example. A bias is not applied to the select gate electrode 10b.

At this time, since a bias is not applied to the select gate electrode 10b, the second layer-select transistor Tb is at the off-state in the first and third semiconductor layers 3a. and 3c. and at the on-state in the second semiconductor layer 3b.

Thereafter, data is sequentially read from the source side memory cell toward the drain side memory cell for the memory string NANDb.

The second positive bias for the reading, which is smaller than the first positive bias, is applied to the control gate electrode of the selected memory cell to be read, for example. The second positive bias has a value between "0"-data threshold and "1"-data threshold, for example.

Thus, on/off of the selected memory cell is determined depending on the data value stored in the selected memory cell, the reading can be performed by using the read circuit to detect a change in potential of the bit lines BL(1), BL(2), . . . BL(m) or a change in current passing through the bit lines BL(1), BL(2), . . . BL(m).

Lastly, when the reading is performed on the memory string NANDc using the third semiconductor layer 3c. as the channel, the drain electrode 7 is connected to the read circuit and the ground potential is applied to the source electrode 8. The first positive bias is applied to the select gate electrodes 10a, 10b, 11 and the control gate electrodes 6(1)d, . . . 6(n)d.

The first positive bias has a value at which the memory cell is at the on-state irrespective of "0"/"1"-data, for example. A bias is not applied to the select gate electrode 10c.

At this time, since a bias is not applied to the select gate electrode 10c, the third layer-select transistor Tc is at the off-state in the first and second semiconductor layers 3a. and 3b. and at the on-state in the third semiconductor layer 3c.

Thereafter, data is sequentially read from the source side memory cell toward the drain side memory cell for the memory string NANDc.

The second positive bias for reading, which is smaller than the first positive bias, is applied to the control gate electrode of the elected memory cell to be read, for example. The second positive bias has a value between "0"-data threshold and "1"-data threshold, for example.

Thus, on/off of the selected memory cell is determined depending on the data value stored in the selected memory cell, the reading can be performed by using the read circuit to detect a change in potential of the bit lines BL(1), BL(2), . . . BL(m) or a change in current passing through the bit lines BL(1), BL(2), . . . BL(m).

F. First Example of Method for Manufacturing Structure Shown in FIGS. 1 to 8

FIGS. 9A, 9B, 9C, 9D, 9E, 9F, 9G, 9H, 9I, 9J, 9K, 9L and 9M show a method for manufacturing the structure shown in FIGS. 1 to 8.

Figure 9A:
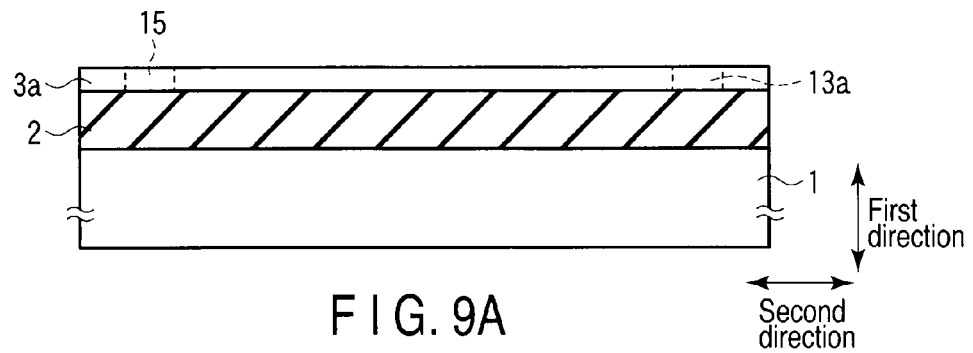

At first, as shown in FIG. 9A, the semiconductor substrate (such as silicon) 1 of first conductive type (such as p-type) having plane orientation (100) and specific resistance of 10. to 20. Ωcm is prepared, for example. The first insulating layer (such as silicon oxide) 2 is formed on the semiconductor substrate 1 and subsequently the first semiconductor layer (such as silicon) 3a. is formed on the first insulating layer 2.

Then, a resist pattern is formed on the first semiconductor layer 3a. by photo etching process (PEP) and ion implantation is performed by using the resist pattern as a mask to form the impurity areas 13a. and 15 in the first semiconductor layer 3a. Thereafter, the resist pattern is removed.

Figure 9B:
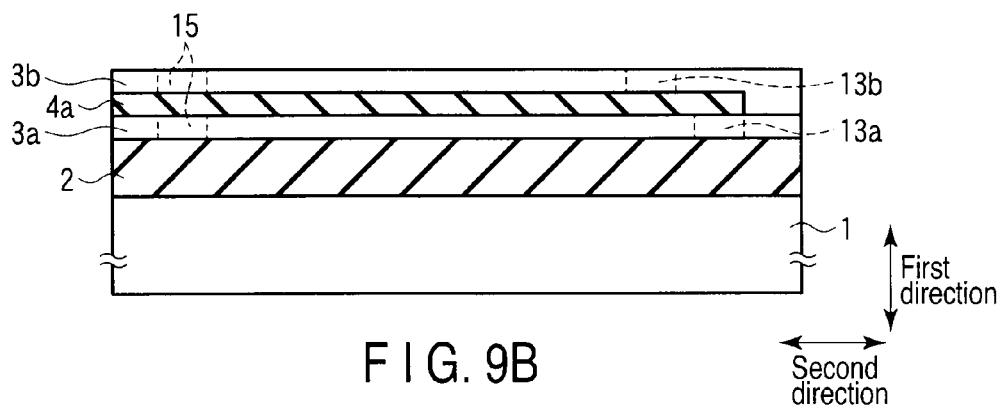

Next, as shown in FIG. 9B, the second insulating layer (such as silicon oxide) 4a. is formed on the first semiconductor layer 3a. A resist pattern is formed on the second insulating layer 4a. by PEP and RIE (Reactive Ion Etching) is performed by using the resist pattern as a mask to pattern the second insulating layer 4a.

Consequently, an edge position of the second insulating layer 4a. is determined in the second direction. The edge position of the second insulating layer 4a. in the second direction conforms to the conditions explained in the section of the structure. Thereafter, the resist pattern is removed.

Then, the second semiconductor layer (such as silicon) 3b. is formed on the first semiconductor layer 3a. and the second insulating layer 4a. The second semiconductor layer 3b. is contacted to one end of the first semiconductor layer 3a. in the second direction.

A resist pattern is formed on the second semiconductor layer 3b. by PEP and ions are implanted by using the resist pattern as a mask to form the impurity areas 13b. and 15 in the second semiconductor layer 3b. Thereafter, the resist pattern is removed.

Figure 9C:
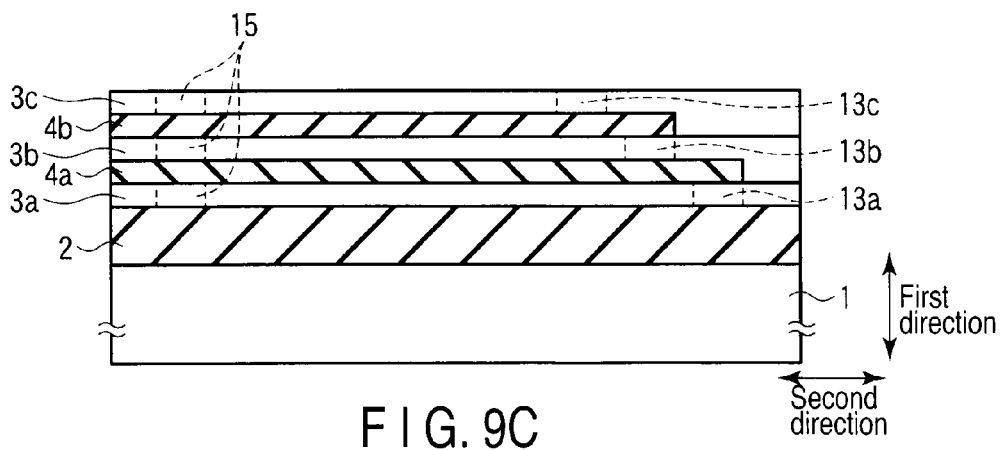

Next, as shown in FIG. 9C, the third insulating layer (such as silicon oxide) 4b. is formed on the second semiconductor layer 3b. A resist pattern is formed on the third insulating layer 4b. by PEP and RIE is performed by using the resist pattern as a mask to pattern the third insulating layer 4b.

Consequently, an edge position of the third insulating layer 4b. is determined in the second direction. The edge position of the third insulating layer 4b. in the second direction conforms to the conditions explained in the section of the structure. Thereafter, the resist pattern is removed.

Then, the third semiconductor layer (such as silicon) 3c. is formed on the second semiconductor layer 3b. and the third insulating layer 4b. The third semiconductor layer 3c. is contacted to one end of the second semiconductor layer 3b. in the second direction.

A resist pattern is formed on the third semiconductor layer 3c. by PEP and ions are implanted by using the resist pattern as a mask to form the impurity areas 13c. and 15 in the third semiconductor layer 3c. Thereafter, the resist pattern is removed.

Figure 9D:
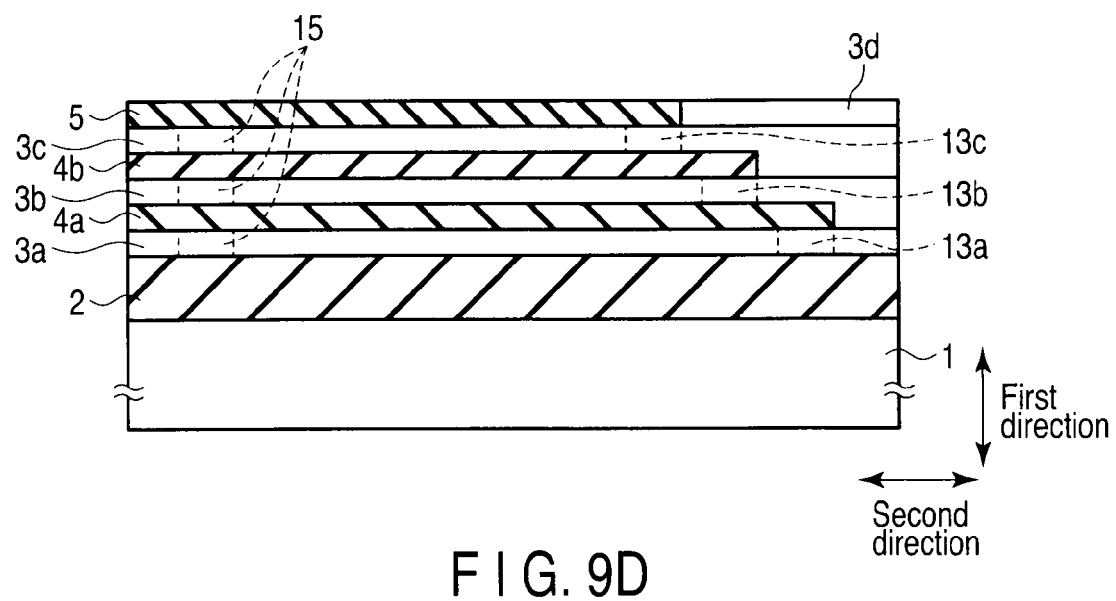

Next, as shown in FIG. 9D, the fourth insulating layer (such as silicon oxide) 5 is formed on the third semiconductor layer 3c. A resist pattern is formed on the fourth insulating layer 5 by PEP and RIE is performed by using the resist pattern as a mask to pattern the fourth insulating layer 5. Consequently, an edge position of the fourth insulating layer 5 is determined in the second direction.

The edge position of the uppermost fourth insulating layer 5 in the second direction is not particularly limited to the conditions explained in the section of the structure.

Thereafter, the resist pattern is removed.

Then, the fourth semiconductor layer (such as silicon) 3d. is formed on the third semiconductor layer 3c. The fourth semiconductor layer 3d. is contacted to one end of the third semiconductor layer 3c. in the second direction. The fourth semiconductor layer 3d may be omitted.

Figure 9E:
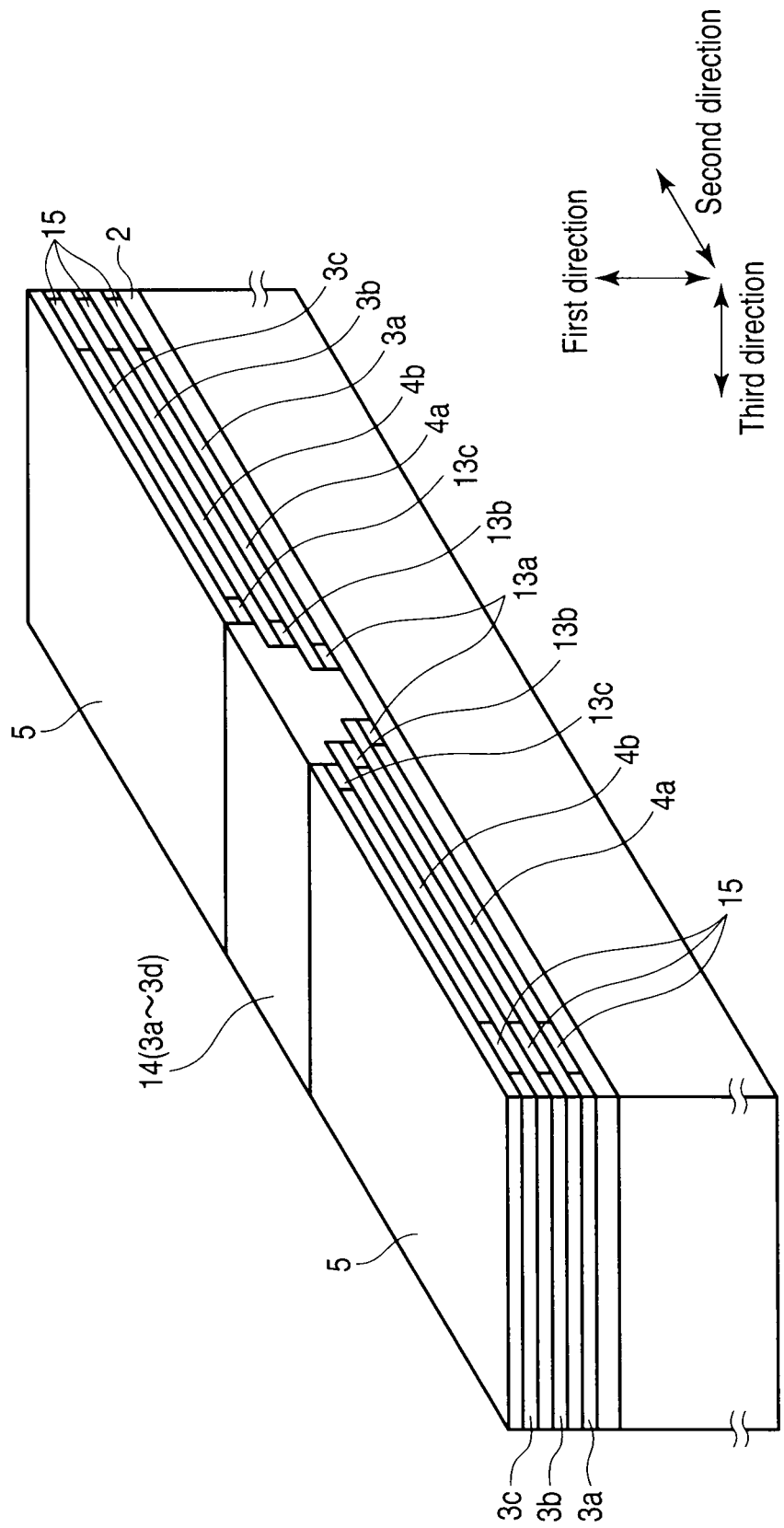
Figure 9F:
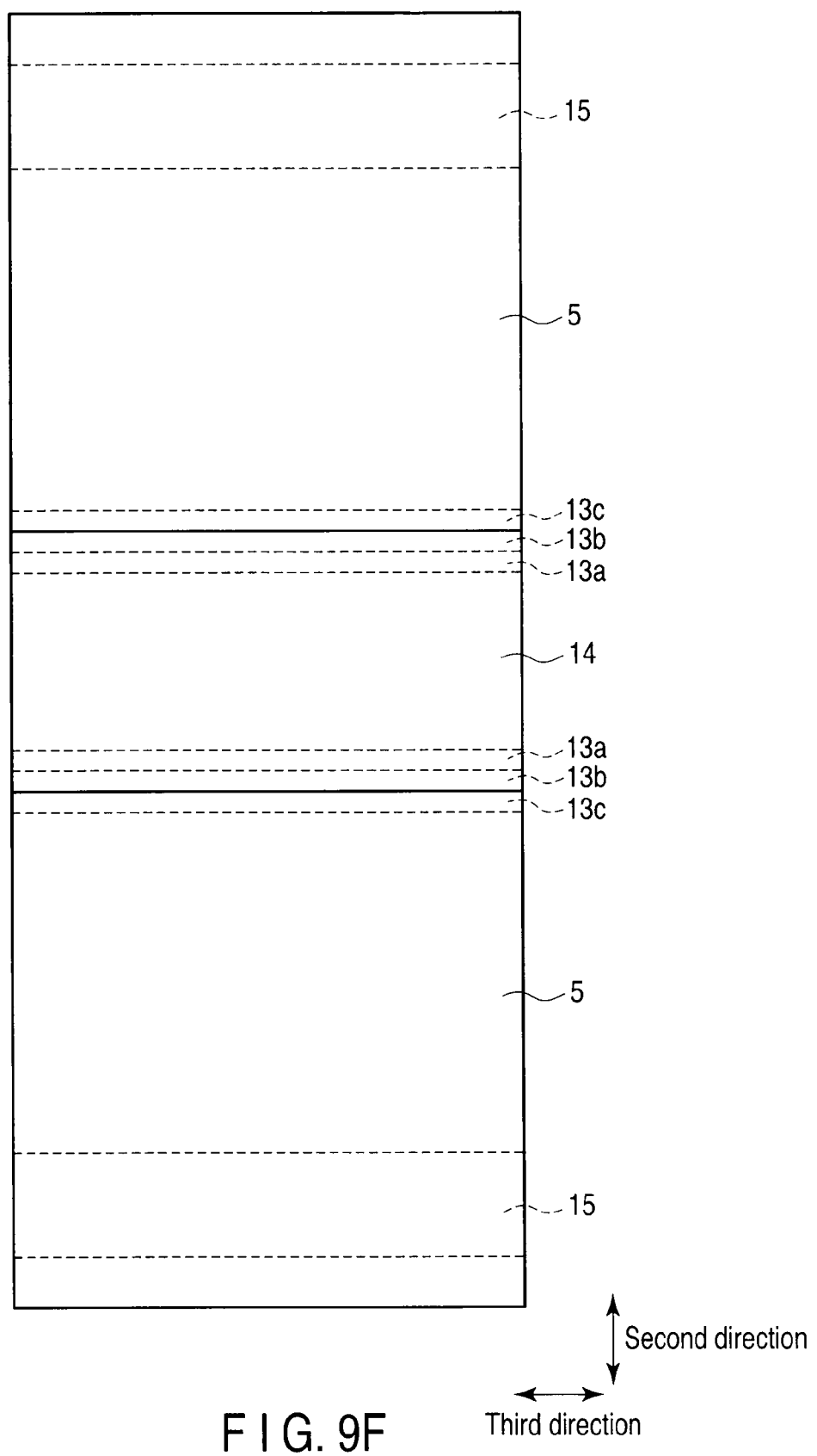

The structure shown in FIGS. 9E and 9F can be obtained through the steps of FIGS. 9A, 9B, 9C and 9D. FIG. 9E is a perspective view of FIG. 9D and FIG. 9F is a plan view of FIG. 9D.

As shown in FIGS. 9E and 9F, the common semiconductors 14 (3a, 3b, 3c, 3d) are formed on ends of the first, second and third semiconductor layers 3a. 3b. and 3c. in the second direction.

Next, a mask element having a ring shape for forming the first, second, third and fourth fin-type stacked layer structures is formed on the fourth insulating layer 5 and the common semiconductor 14. The mask element having a ring shape is made of a hard mask (such as amorphous Si).

Since a resist pattern is peeled by an ashing processing and thus the first, second and third semiconductor layers 3a, 3b. and 3c. can be prevented from being oxidized during the peeling of the resist pattern, the resist pattern cannot be used as a patterning mask of the first, second and third semiconductor layers 3a, 3b. and 3c.

The patterning mask of the first, second and third semiconductor layers 3a, 3b. and 3c. uses a hard mask.

The mask element having a ring shape is formed through the following steps.

Figure 9H:
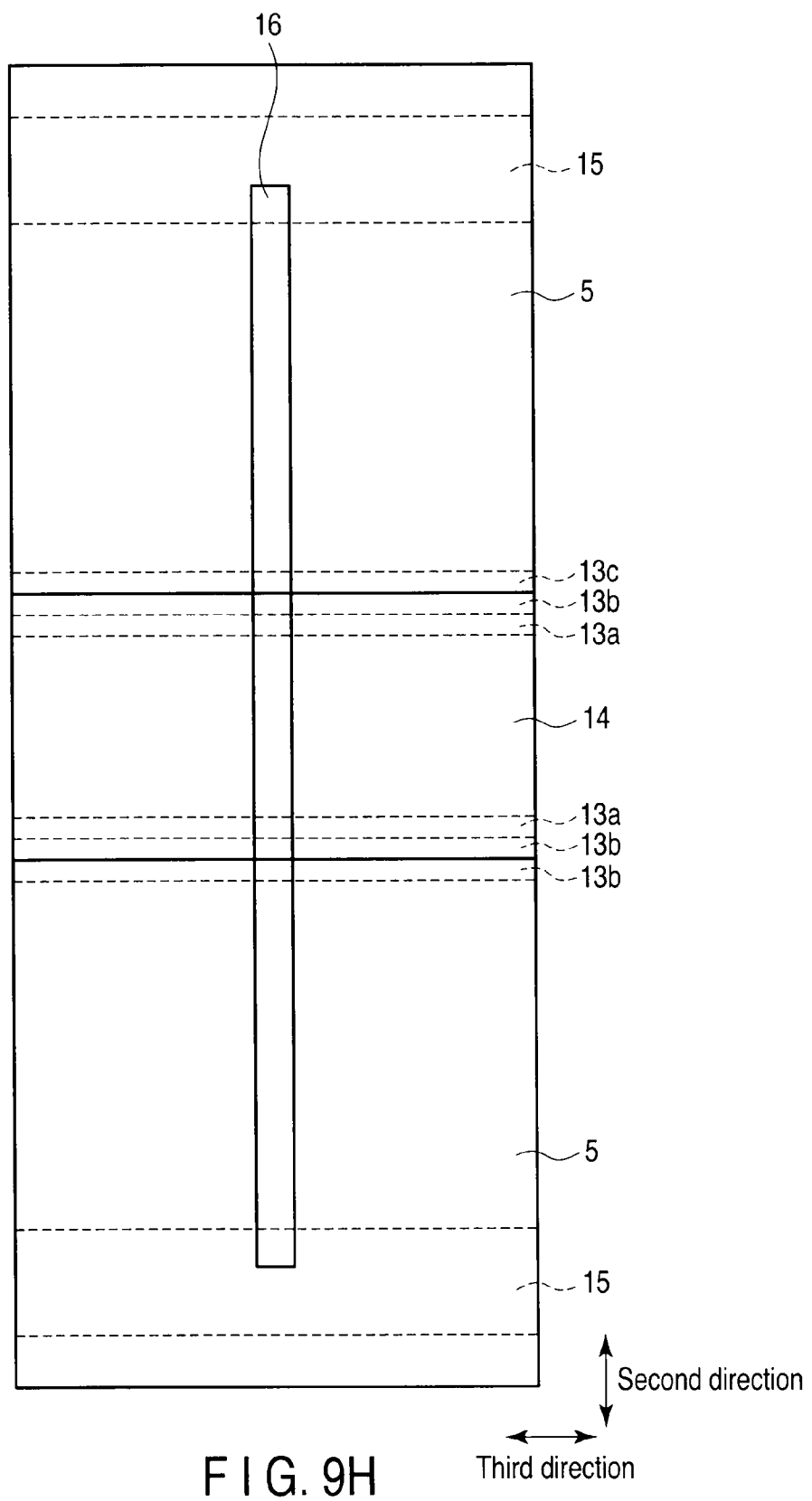

At first, as shown in FIG. 9G, a linear-shaped core (such as SiN) 16 extending in the second direction is formed on the fourth insulating layer 5 and the common semiconductor 14. As shown in FIG. 9H, the linear-shaped core 16 is etched by isotropic wet etching to narrow the widths of the linear-shaped core 16 in the second and third directions.

Figure 9J:
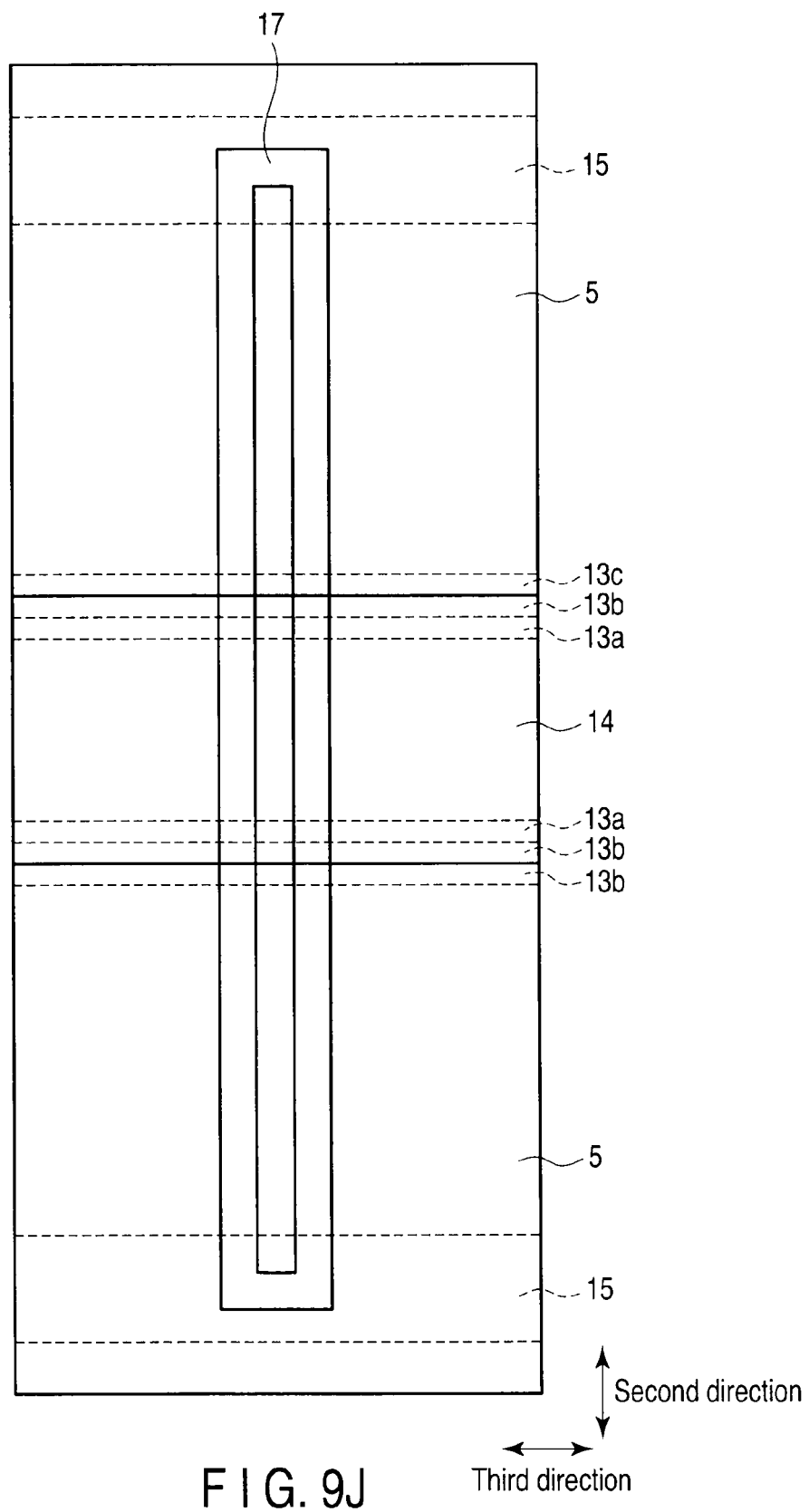

Next, as shown in FIG. 9I, a hard mask (such as amorphous Si) is formed on the fourth insulating layer 5 and the common semiconductor 14 and the hard mask is etched by anisotropic etching so that the mask element 17 having a ring shape is formed on side walls of the linear-shaped core 16. As shown in FIG. 9J, when the linear-shaped core 16 is selectively removed, the mask element 17 having a ring shape remains on the fourth insulating layer 5 and the common semiconductor 14.

Figure 9K:
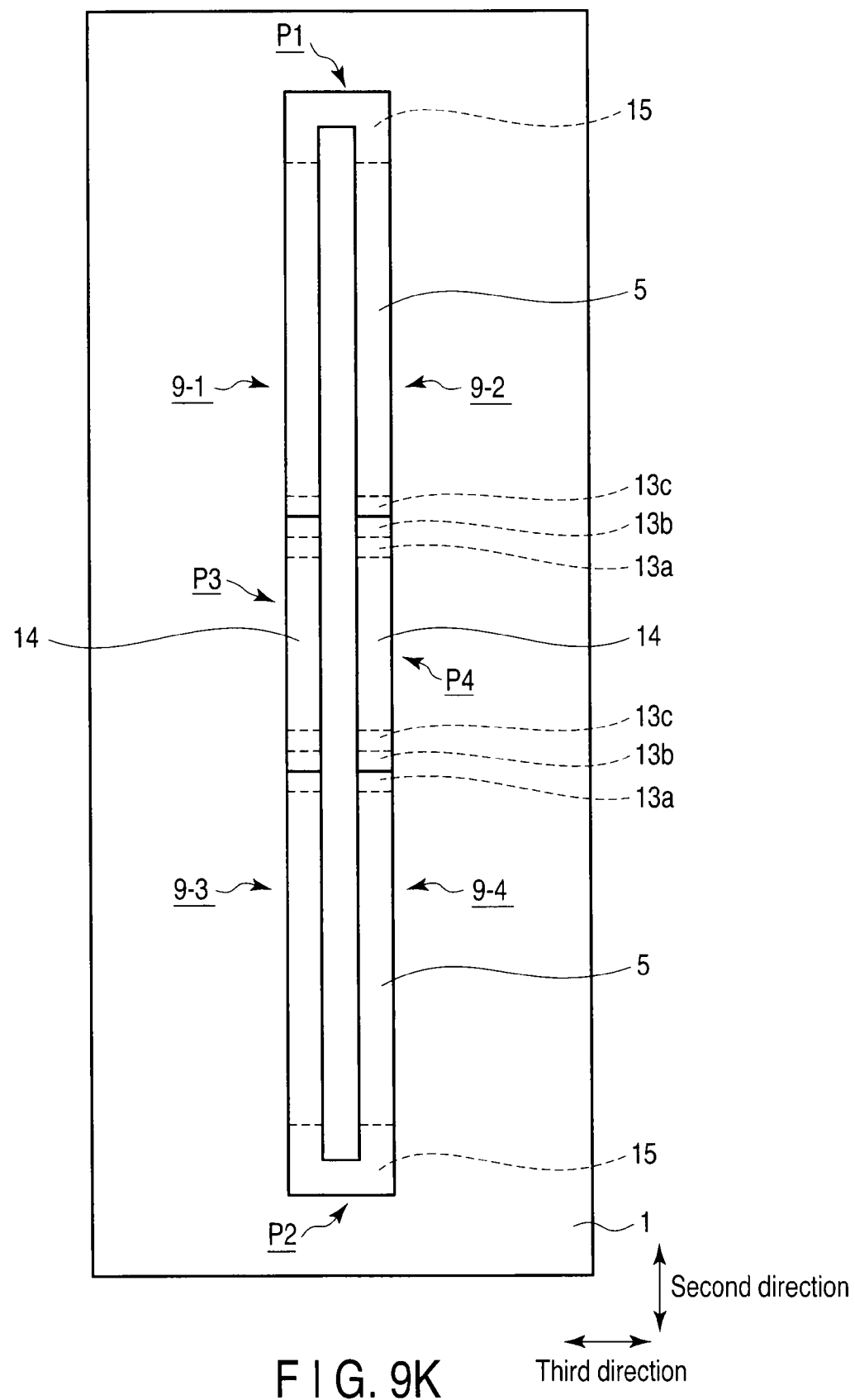

Then, as shown in FIG. 9K, the fourth insulating layer 5, the third semiconductor layer 3c, the third insulating layer 4b, the second semiconductor layer 3b, the second insulating layer 4a, the first semiconductor layer 3a, the first insulating layer 2 and the common semiconductor 14 are sequentially patterned by anisotropic etching using the mask element 17 having a ring shape as a mask.

Consequently, the first, second, third and fourth fin-type stacked layer structures 9-1, 9-2, 9-3, 9-4 and the first, second, third and fourth parts P1, P2, P3, P4 are formed on the semiconductor substrate 1.

Thereafter, the mask element 17 having a ring shape is removed. The mask element 17 having a ring shape may remain instead of being removed.

The structure shown in FIG. 9L can be obtained through the steps of FIGS. 9G, 9H, 9I, 9J and 9K. FIG. 9L is a perspective view of FIG. 9K.

Next, as shown in FIG. 9M, the stacked gate structures 6(1), 6(2), . . . 6(n) and the select gate electrodes 10 (10a, 10b, 10c) extending in the third direction are formed by using anisotropic etching such as CDV, sputtering and RIE and by straddling the first, second, third and fourth fin-type stacked layer structures 9-1, 9-2, 9-3 and 9-4.

The stacked gate structures 6(1), 6(2), . . . 6(n) extend in the first direction at two opposite side surfaces in the third direction of the first, second, third and fourth semiconductor layers (3a, 3b, 3c, 3d), for example. Similarly, the select gate electrodes 10 (10a, 10b, 10c, 10d) also extend in the first direction at two opposite side surfaces in the third direction of the first, second, third and fourth semiconductor layers 3 (3a, 3b, 3c, 3d), for example.

The device structure shown in FIGS. 1 to 8 is completed through the above steps.

G. Second Example of Method for Manufacturing Structure Shown in FIGS. 1 to 8

FIGS. 10A, 10B and 10C show a method for manufacturing the structure shown in FIGS. 1 to 8.

The second example is a modification example of the first example of the method for manufacturing the structure shown in FIGS. 1 to 8 and thus different points from the first example will be described.

At first, as shown in FIG. 10A, the first insulating layer 2 is formed on the semiconductor substrate 1 and subsequently the first semiconductor layer 3a. is formed on the first insulating layer 2. Thereafter, ion implantation is performed for forming an impurity area in the first semiconductor layer 3a. in the first example, but is not performed in the second example. Subsequently, the second insulating layer 4a is formed on the first semiconductor layer 3a.

A resist pattern is formed on the second insulating layer 4a. by PEP and RIE is performed by using the resist pattern as a mask to pattern the second insulating layer 4a. Consequently, an edge position of the second insulating layer 4a. is determined in the second direction. Thereafter, the resist pattern is removed.

The second semiconductor layer 3b. is formed on the first semiconductor layer 3a. and the second insulating layer 4a. The second semiconductor layer 3b. is contacted to one end of the first semiconductor layer 3a. in the second direction. Thereafter, ion implantation is performed for forming an impurity area in the second semiconductor layer 3b. in the first example, but is not performed in the second example. Subsequently, the third insulating layer 4b. is formed on the second semiconductor layer 3b.

A resist pattern is formed on the third insulating layer 4b. by PEP and RIE is performed by using the resist pattern as a mask to pattern the third insulating layer 4b. Consequently, an edge position in the second direction of the third insulating layer 4b is determined. Thereafter, the resist pattern is removed.

The third semiconductor layer 3c. is formed on the second semiconductor layer 3b. and the third insulating layer 4b. The third semiconductor layer 3c. is contacted to one end in the second direction of the second semiconductor layer 3b. Thereafter, ion implantation is performed for forming an impurity area in the third semiconductor layer 3c. in the first example, but is not performed in the second example. Subsequently, the fourth insulating layer 5 is formed on the third semiconductor layer 3c.

A resist pattern is formed on the fourth insulating layer 5 by PEP and RIE is performed by using the resist pattern as a mask to pattern the fourth insulating layer 5. Consequently, an edge position in the second direction of the fourth insulating layer 5 is determined. Thereafter, the resist pattern is removed.

Then, the fourth semiconductor layer 3d. is formed on the third semiconductor layer 3c. The fourth semiconductor layer 3d. is contacted to one end in the second direction of the third semiconductor layer 3c.

Next, as shown in FIG. 10B, a resist pattern is formed on the fourth insulating layer 5 and the fourth semiconductor layer 3d. and ion implantation is performed by using the resist pattern as a mask to form the impurity areas 13a. and 15 in the first semiconductor layer 3a.

For the ion implantation, the acceleration energy and the amount of dose are set such that the impurity areas 13a. and 15 are formed in the first semiconductor layer 3a.

Thereafter, the resist pattern is removed.

Next, as shown in FIG. 10C, a resist pattern is formed again on the fourth insulating layer 5 and the fourth semiconductor layer 3d. by PEP and ion implantation is performed by using the resist pattern as a mask to form the impurity areas 13b. and 15 in the second semiconductor layer 3b.

For the ion implantation, the acceleration energy and the amount of dose are set such that the impurity areas 13b. and 15 are formed in the second semiconductor layer 3b.

Thereafter, the resist pattern is removed.

Subsequently, a resist pattern is formed again on the fourth insulating layer 5 and the fourth semiconductor layer 3d. by PEP and ion implantation is performed by using the resist pattern as a mask to form the impurity areas 13c. and 15 in the third semiconductor layer 3c.

For the ion implantation, the acceleration energy and the amount of dose are set such that the impurity areas 13c. and 15 are formed in the third semiconductor layer 3c.

Thereafter, the resist pattern is removed.

The same structure as that of FIG. 9D in the first example of the manufacturing method can be obtained through the above steps. Thus, thereafter, the device structure shown in FIGS. 1 to 8 is completed through the same steps as those of FIGS. 9E, 9F, 9G, 9H, 9I, 9J, 9K, 9L and 9M in the first example.

In the second example of the manufacturing method, since a resist does not adhere on each of the first, second and third semiconductor layers 3 (3a, 3b, 3c) as an active area in which a memory string is formed, the first, second and third semiconductor layers 3 (3a, 3b, 3c) are prevented from being contaminated and the channel properties of the memory strings are enhanced.

H. Third Example of Method for Manufacturing Structure of FIGS. 1 to 8

Figure 11B:
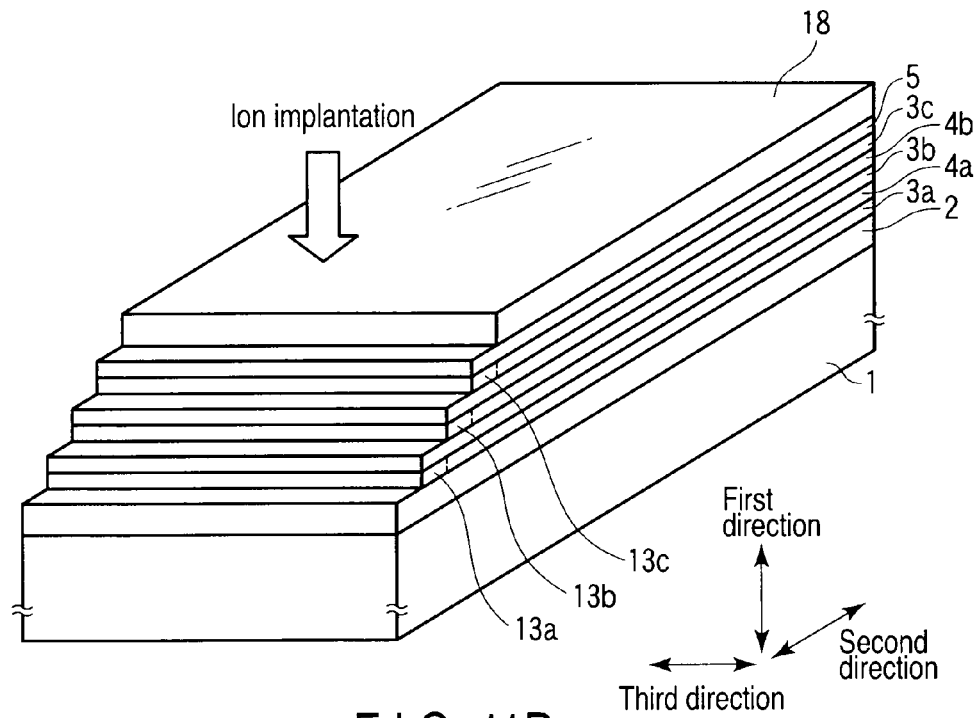
Figure 11C:
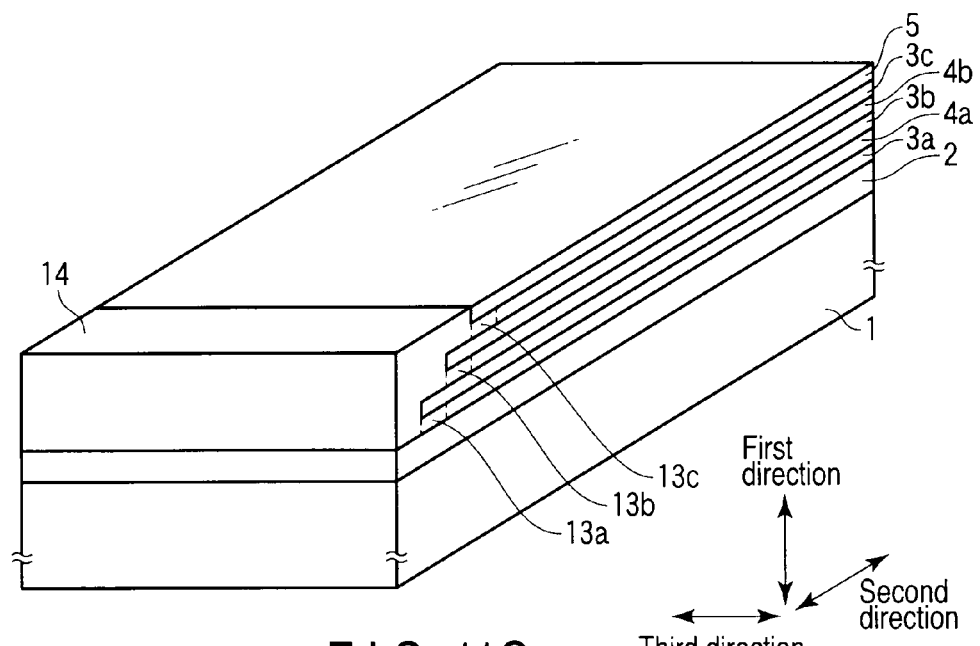

FIGS. 11A, 11B and 11C show a method for manufacturing the structure of FIGS. 1 to 8.

The third example is a modification example of the first example of the method for manufacturing the structure of FIGS. 1 to 8, and different points from the first example will be described.

At first, as shown in FIG. 11A, the first insulating layer (such as silicon oxide) 2 is formed on the semiconductor substrate 1 and subsequently the first semiconductor layer (such as silicon) 3a. and the second insulating layer (such as silicon oxide) 4a. are sequentially formed on the first insulating layer 2.

A resist pattern is formed on the second insulating layer 4a. by PEP and RIE is performed by using the resist pattern as a mask to pattern the second insulating layer 4a. and the first semiconductor layer 3a.

Consequently, an edge position in the second direction of the second insulating layer 4a. is determined. Thereafter, the resist pattern is removed.

The second semiconductor layer (such as silicon) 3b. and the third insulating layer (such as silicon oxide) 4b. are sequentially formed on the second insulating layer 4a.

A resist pattern is formed on the third insulating layer 4b. by PEP and RIE is performed by using the resist pattern as a mask to pattern the third insulating layer 4b. and the second semiconductor layer 3b.

Consequently, an edge position in the second direction of the third insulating layer 4b. is determined. Thereafter, the resist pattern is removed.

The third semiconductor layer (such as silicon) 3c and the fourth insulating layer (such as silicon oxide) 5 are sequentially formed on the third insulating layer 4b.

A resist pattern is formed on the fourth insulating layer 5 by PEP and RIE is performed by using the resist pattern as a mask to pattern the fourth insulating layer 5 and the third semiconductor layer 3c.

Consequently, an edge position in the second direction of the fourth insulating layer 5 is determined. Thereafter, the resist pattern is removed.

In this example, the thicknesses of the second, third and fourth insulating layers 4a, 4b. and 5 in the first direction are desirably equal to each other in consideration of ion implantation (collective implantation) described later.

Next, as shown in FIG. 11B, a resist pattern 18 is formed on the fourth insulating layer 5 by PEP and ion implantation is performed by using the resist pattern 18 as a mask.

For the ion implantation, the acceleration energy and the amount of dose are controlled so that the impurity areas 13a, 13b. and 13c. are simultaneously formed in the first, second and third semiconductor layers 3 (3a, 3b, 3c) (collective implantation).

Since the second, third and fourth insulating layers 4a, 4b. and 5 function as a mask, each of the impurity areas 13a, 13b. and 13c. is formed only at one end of each of the first, second and third semiconductor layers 3 (3a, 3b, 3c) in a self-alignment manner.

Thereafter, the resist pattern 18 is removed.

Next, as shown in FIG. 11C, the common semiconductor (such as silicon) 14 is formed and the surface of the common semiconductor 14 is planarized by CMP (Chemical Mechanical Polishing). The planarization may be performed by dry etching, for example.

The common semiconductor 14 contacts ends in the second direction of the first, second and third semiconductor layers 3 (3a, 3b, 3c).

The same structure as that of FIG. 9D (except for the impurity area 15 of FIG. 9D) in the first example of the manufacturing method can be obtained through the above steps. In this example, the impurity area 15 of FIG. 9D is not indispensable but may be additionally formed by adding a process similar to that in the second example of the manufacturing method.

Thus, thereafter, the device structure shown in FIGS. 1 to 8 is completed through the same steps as those of FIGS. 9E, 9F, 9G, 9H, 9I, 9J, 9K, 9L and 9M in the first example of the manufacturing method.

In the third example of the manufacturing method, since the impurity areas 13a, 13b. and 13c. are simultaneously formed by the collective implantation, a reduction in manufacture cost can be achieved due to a reduction in the number of PEP.

I. Fourth Example of Method for Manufacturing Structure of FIGS. 1 to 8

Figure 12A:
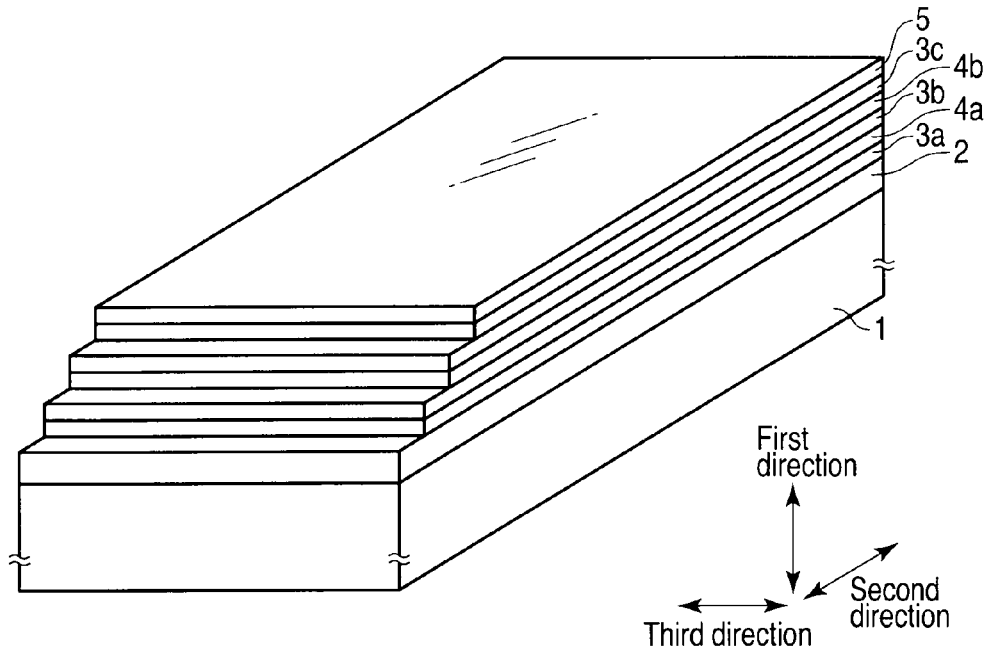
FIGS. 12A to 12C show a fourth example of the manufacturing method.
Figure 12B:
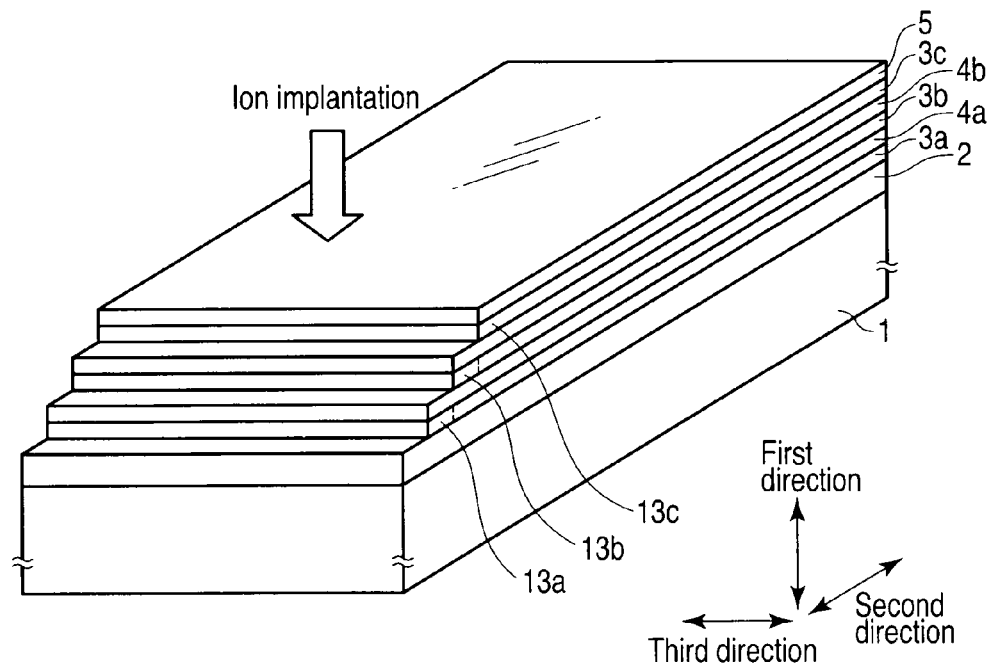
Figure 12C:
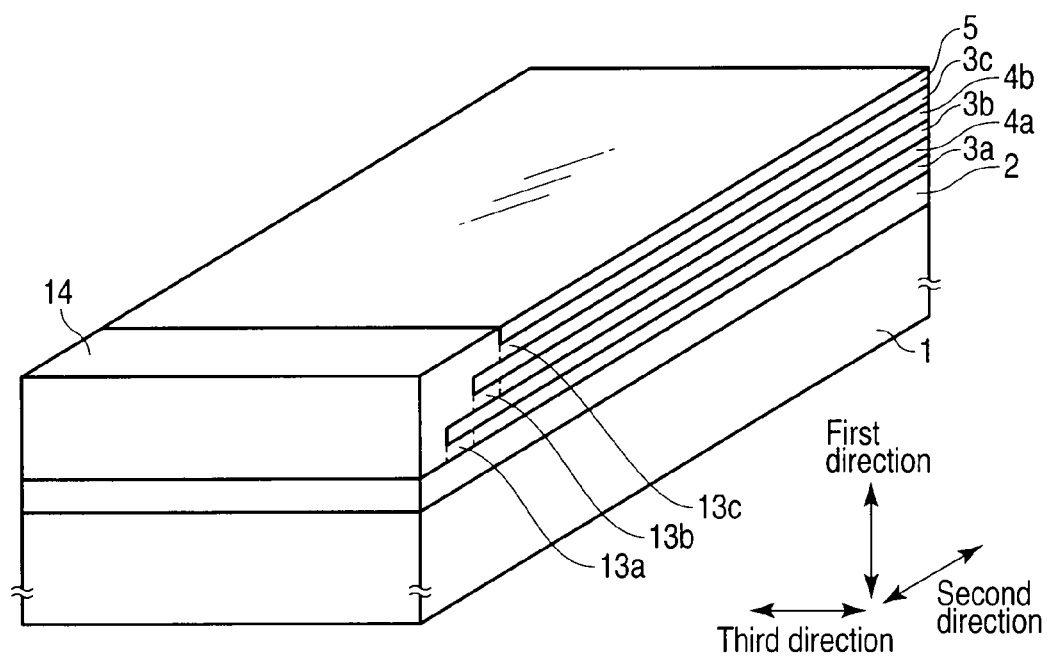

FIGS. 12A, 12B and 12C show a method for manufacturing the structure of FIG. 7.

At first, as shown in FIG. 12A, for example, the semiconductor substrate (such as silicon) 1 of first conductive type (such as p-type) having plane orientation (100) and specific resistance of 10. to 20. Ωcm is prepared. The first insulating layer (such as silicon oxide) 2 is formed on the semiconductor substrate 1 and subsequently the first semiconductor layer (such as silicon) 3a. and the second insulating layer (such as silicon oxide) 4a. are sequentially formed on the first insulating layer 2.

A resist pattern is formed on the second insulating layer 4a. by PEP and RIE is performed by using the resist pattern as a mask to pattern the second insulating layer 4a. and the first semiconductor layer 3a.

Consequently, an edge position in the second direction of the second insulating layer 4a. is determined. Thereafter, the resist pattern is removed.

The second semiconductor layer (such as silicon) 3b. and the third insulating layer (such as silicon oxide) 4b. are sequentially formed on the second insulating layer 4a.

A resist pattern is formed on the third insulating layer 4b. by PEP and RIE is performed by using the resist pattern as a mask to pattern the third insulating layer 4b. and the second semiconductor layer 3b.

Consequently, an edge position in the second direction of the third insulating layer 4b. is determined. Thereafter, the resist pattern is removed.

The third semiconductor layer (such as silicon) 3c and the fourth insulating layer (such as silicon oxide) 5 are sequentially formed on the third insulating layer 4b.

A resist pattern is formed on the fourth insulating layer 5 by PEP and RIE is performed by using the resist pattern as a mask to pattern the fourth insulating layer 5 and the third semiconductor layer 3c.

Consequently, an edge position in the second direction of the fourth insulating layer 5 is determined. Thereafter, the resist pattern is removed.

In this example, the thicknesses of the second and third insulating layers 4a. and 4b. in the first direction are desirably equal to each other in consideration of ion implantation (collective implantation) described later.

The thickness of the fourth insulating layer 5 in the first direction may be equal to the thicknesses of the second and third insulating layers 4a. and 4b. in the first direction, or may be larger than the thicknesses of the second and third insulating layers 4a. and 4b. in the first direction.

Next, as shown in FIG. 12B, ion implantation is performed. For the ion implantation, the acceleration energy and the amount of dose are controlled so that the impurity areas 13a, 13b. and 13c. are simultaneously formed in the first, second and third semiconductor layers 3 (3a, 3b, 3c) (collective implantation).

The impurity area 13c. is formed in the substantially entire of uppermost third semiconductor layer 3c. Thus, the second semiconductor layer 3c serves as a dummy layer. To the contrary, the impurity areas 13a. and 13b. are formed only at the ends in the second direction in the first and second semiconductor layers 3a. and 3b. in a self-alignment manner. This is because the third and fourth insulating layers 4b. and 5 function as a mask.

Next, as shown in FIG. 12C, the common semiconductor (such as silicon) 14 is formed and the surface of the common semiconductor 14 is planarized by CMP. The planarization may be performed by dry etching, for example.

The common semiconductor 14 contacts ends in the second direction of the first, second and third semiconductor layers 3 (3a, 3b, 3c).

The same structure as that of FIG. 9D (except for impurity area 15 of FIG. 9D) in the first example of the manufacturing method can be obtained through the above steps. In this example, the impurity area 15 of FIG. 9D is not indispensable but may be additionally formed by adding a process similar to that of the second example of the manufacturing method.

Thus, thereafter, the device structure of FIGS. 1 to 8 is completed through the same steps as those of FIGS. 9E, 9F, 9G, 9H, 9I, 9J, 9K, 9L and 9M in the first example of the manufacturing method.

Also in the fourth example of the manufacturing method, the impurity areas 13a, 13b. and 13c. are simultaneously formed by the collective implantation, thereby achieving a reduction in manufacture cost due to a reduction in the number of PEP.

J. Application Examples

The application examples of the structure of FIGS. 1 to 8 will be described.

The following application examples are characterized in that the width of each of the first, second, third and fourth fin-type stacked layer structures 9-1, 9-2, 9-3 and 9-4 is variable in the third direction.

Figure 13:
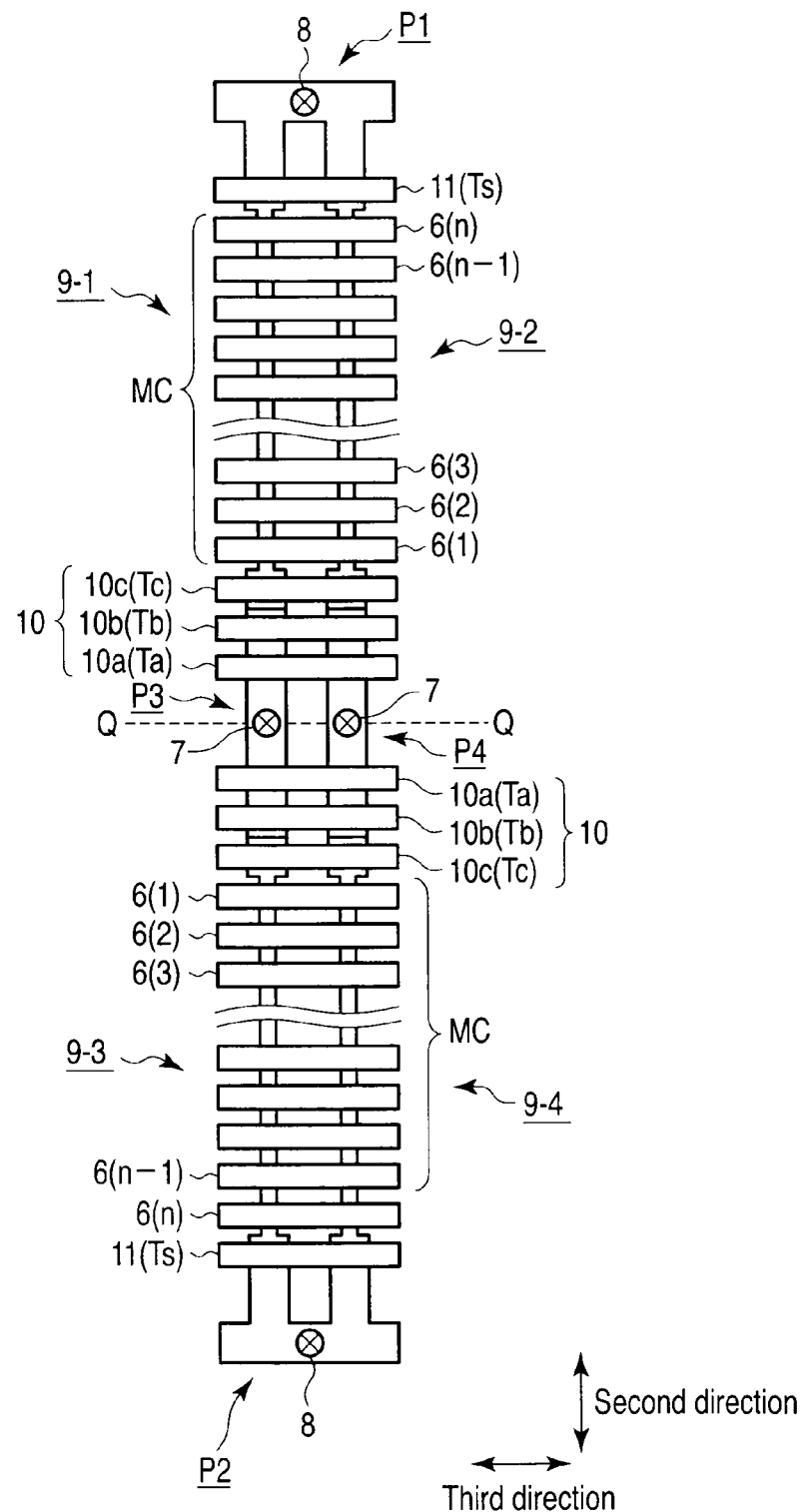
FIG. 13 shows a first application example.

FIG. 13 shows a first application example.

In FIG. 13, like reference numerals are denoted to like elements identical to those of FIGS. 1 to 8 and thus a detailed explanation thereof will be omitted.

In the first application example, a fin width of a part in which the layer-select transistors (drain side select transistors) Ta, Tb, Tc and the source side select transistor Ts are provided is larger than a fin width of a part in which the memory cells MC are provided.

That is, a width of the semiconductor layers 3 (3a, 3b, 3c) in the third direction in each of the first, second, third and fourth fin-type stacked layer structures 9-1, 9-2, 9-3 and 9-4 has a minimum value in a part in which the memory cells MC are provided between the layer-select transistors Ta, Tb, Tc and the source side select transistor Ts.

Thereby, the properties of the select transistors can be improved and the amount of current passing through the memory cells can be reduced. Further, the control of the control gate electrodes is enhanced, thereby enabling higher speed and lower voltage of the memory cell operation. The ends and center part of the ring shape in the second direction are thicker so that the ring shape is difficult to fall.

In this example, both the fin width of the part in which the layer-select transistors Ta, Tb and Tc are provided and the fin width of the part in which the source side select transistor Ts is provided are large, but either one of them may be larger.

FIG. 14 shows a second application example.

In FIG. 14, like reference numerals are denoted to like elements identical to those of FIGS. 1 to 8 and thus a detailed explanation thereof will be omitted.

In the second application example, a fin width of a part in which the layer-select transistors (drain side select transistors) Ta, Tb, Tc and the source side select transistor Ts are provided is larger than a fin width of a part in which the memory cells MC are provided and a fin width of each of the source/drain contact parts P1, P2, P3 and P4.

That is, a width of the semiconductor layers 3 (3a, 3b, 3c) in the third direction in each of the first, second, third and fourth fin-type stacked layer structures 9-1, 9-2, 9-3 and 9-4 has a minimum value in a part in which the memory cells MC are provided between the layer-select transistors Ta, Tb, Tc and the source side select transistor Ts.

Thereby, the properties of the select transistors can be enhanced and the amount of current passing through the memory cells can be reduced. Further, the control of the control gate electrodes is enhanced, thereby enabling higher speed and lower voltage of the memory cell operation. Further, the ends and center part of the ring shape in the second direction are thicker so that the ring shape is difficult to fall.

In this example, both the fin width of the part in which the layer-select transistors Ta, Tb and Tc are provided and the fin width of the part in which the source side select transistor Ts is provided are large but either one of them may be larger.

Figure 15:
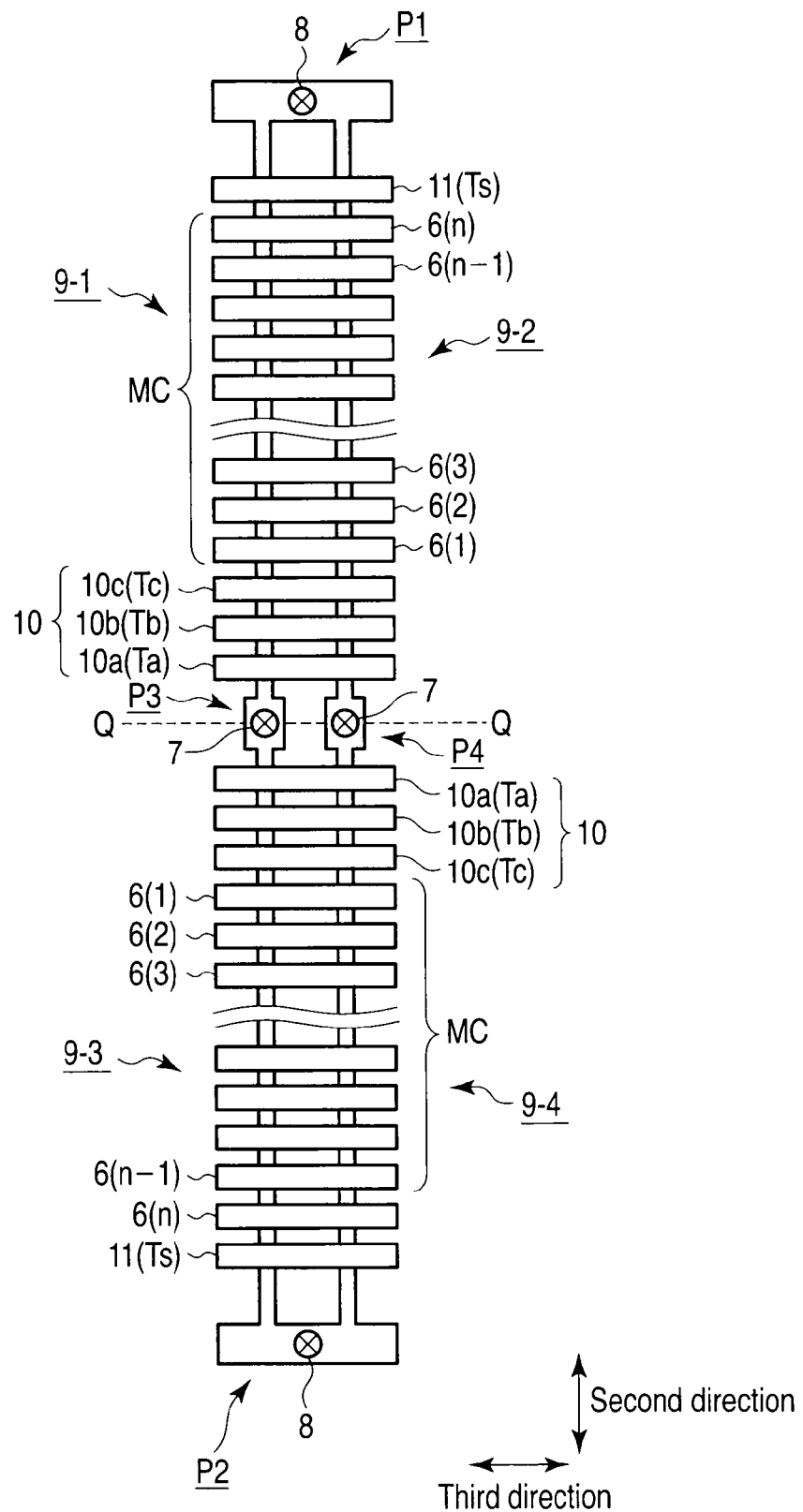
FIG. 15 shows a third application example.

FIG. 15 shows a third application example.

In FIG. 15, like reference numerals are denoted to like elements identical to those of FIGS. 1 to 8 and thus a detailed explanation thereof will be omitted.

In the third application example, a fin width of each of the source/drain contact parts P1, P2, P3 and P4 is larger than the fin width of the part in which the layer-select transistors (drain side select transistors) Ta, Tb, Tc and the source side select transistor Ts are provided and the fin width of the part in which the memory cells MC are provided.

Thereby, a source/drain contact resistance can be reduced and the amount of current passing through the memory cells can be reduced. Further, the control of the control gate electrodes is enhanced, thereby enabling higher speed and lower voltage of the memory cell operation. The ends and center part of the ring shape in the second direction are thicker so that the ring shape is difficult to fall.

In this example, both the fin width of each of the source contact parts P1 and P2 and the fin width of each of the drain contact parts P3 and P4 are large but either one of them may be larger.

K. Conclusion

According to the first embodiment, the entire plane shape is the ring shape due to the first, second, third and fourth fin-type stacked layer structures 9-1, 9-2, 9-3, 9-4 and the first, second, third and fourth parts P1, P2, P3, P4.

Thus, even if the number of memory strings in each of the first, second, third and fourth fin-type stacked layer structures 9-1, 9-2, 9-3 and 9-4 is increased and the fin width of each of the first, second, third and fourth fin-type stacked layer structures 9-1, 9-2, 9-3 and 9-4 is made smaller, the first, second, third and fourth fin-type stacked layer structures 9-1, 9-2, 9-3 and 9-4 will not fall.

Therefore, it is possible to realize higher integration and higher yield of a nonvolatile semiconductor memory device.

2. Second Embodiment

A. Structure

Figure 16:
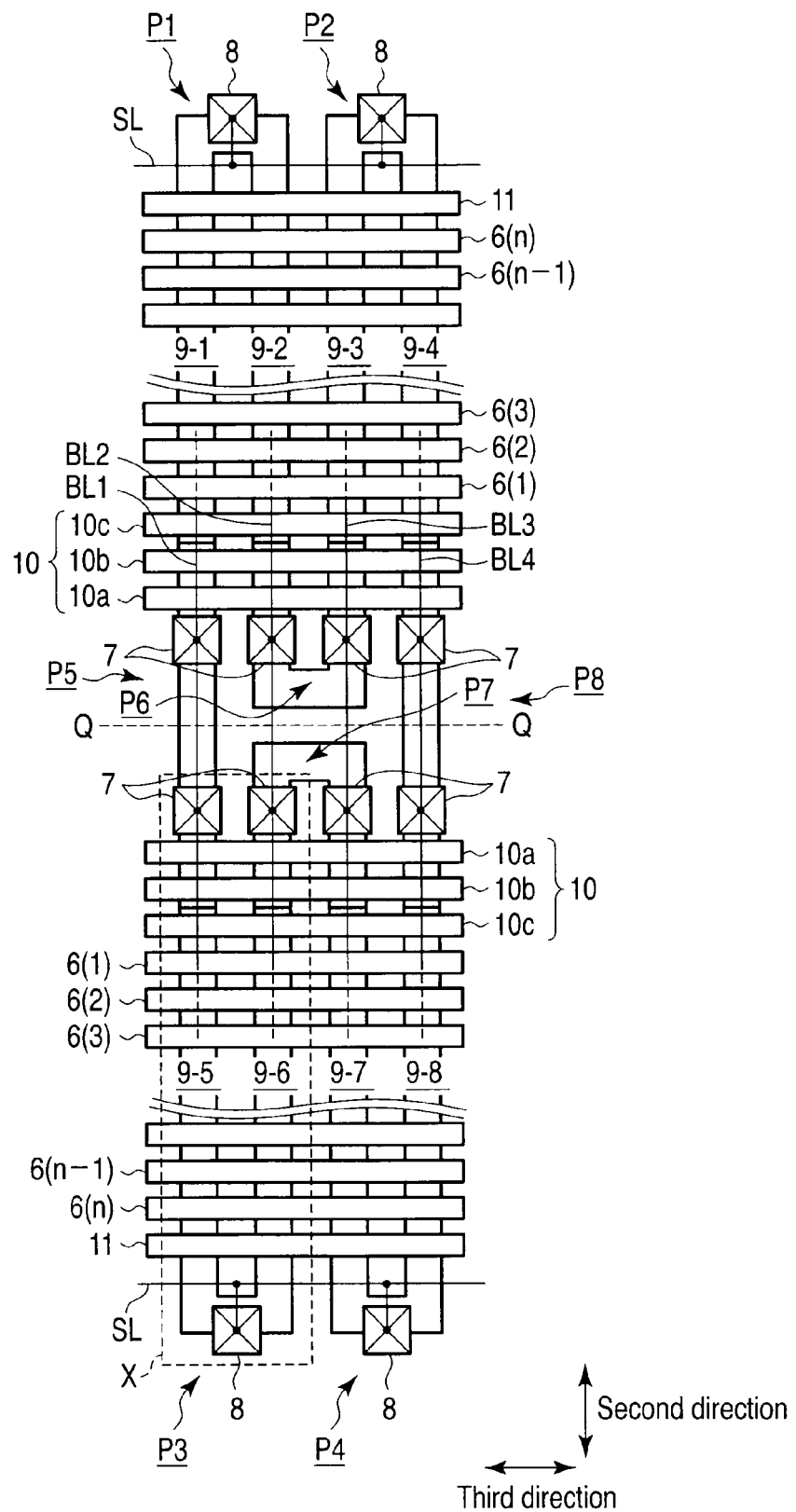
FIGS. 16 and 17 show a structure of a second embodiment.

FIG. 16 is a plan view of a nonvolatile semiconductor memory device.

In FIG. 16, like reference numerals are denoted to like elements identical to those in the first embodiment (FIGS. 1 to 5) and thus a detailed explanation thereof will be omitted. In FIG. 16, an area X has the same structure as that shown in the perspective view of FIG. 2, for example.

The second embodiment is characterized by the layout of the series connection (ring shape) of fin-type stacked layer structures unlike the first embodiment.

The ring shape in the second embodiment is configured with first, second, third, fourth, fifth, sixth, seventh and eighth fin-type stacked layer structures 9-1, 9-2, 9-3, 9-4, 9-5, 9-6, 9-7 and 9-8 extending in the second direction. Each of the first, second, third, fourth, fifth, sixth, seventh and eighth fin-type stacked layer structures 9-1, 9-2, 9-3, 9-4, 9-5, 9-6, 9-7 and 9-8 is the same as the fin-type stacked layer structure according to the first embodiment.

A first part P1 connects ends in the second direction of the first and second fin-type stacked layer structures 9-1 and 9-2 stacked with respect to each other. A second part P2 connects ends in the second direction of the third and fourth fin-type stacked layer structures 9-3 and 9-4 stacked with respect to each other.

A third part P3 connects ends in the second direction of the fifth and sixth fin-type stacked layer structures 9-5 and 9-6 stacked with respect to each other. A fourth part P4 connects ends in the second direction of the seventh and eighth fin-type stacked layer structures 9-7 and 9-8 stacked with respect to each other.

A fifth part P5 connects the other ends in the second direction of the first and fifth fin-type stacked layer structures 9-1 and 9-5 stacked with respect to each other.

A sixth part P6 connects the other ends in the second direction of the second and third fin-type stacked layer structures 9-2 and 9-3 stacked with respect to each other. A seventh part P7 connects the other ends in the second direction of the sixth and seventh fin-type stacked layer structures 9-6 and 9-7 stacked with respect to each other.

An eighth part P8 connects the other ends in the second direction of the fourth and eighth fin-type stacked layer structures 9-4 and 9-8 stacked with respect to each other.

The memory strings in the first and second fin-type stacked layer structures 9-1 and 9-2 use the first part P1 as a source area and the memory strings in the third and fourth fin-type stacked layer structures 9-3 and 9-4 use the second part P2 as the source area.

The memory strings in the fifth and sixth fin-type stacked layer structures 9-5 and 9-6 use the third part P3 as the source area and the memory strings in the seventh and eighth fin-type stacked layer structures 9-7 and 9-8 use the fourth part P4 as the source area.

The memory strings in the first and fifth fin-type stacked layer structures 9-1 and 9-5 use the fifth part P5 as a drain area.

The memory strings in the second and third fin-type stacked layer structures 9-2 and 9-3 use the sixth part P6 as the drain area. The memory strings in the sixth and seventh fin-type stacked layer structures 9-6 and 9-7 use the seventh part P7 as the drain area.

The memory strings in the fourth and eighth fin-type stacked layer structures 9-4 and 9-8 use the eight part P8 as the drain area.

That is, the memory strings in the first and second fin-type stacked layer structures 9-1 and 9-2 share the first part (source area) P1 and the memory strings in the third and fourth fin-type stacked layer structures 9-3 and 9-4 share the second part (source area) P2.

The memory strings in the fifth and sixth fin-type stacked layer structures 9-5 and 9-6 share the third part (source area) P3 and the memory strings in the seventh and eighth fin-type stacked layer structures 9-7 and 9-8 share the fourth part (source area) P4.

Each of the first, second, third and fourth parts P1, P2, P3 and P4 has a source electrode 8 which is connected to one end of each of the first, second, third, fourth, fifth, sixth, seventh and eighth fin-type stacked layer structures 9-1, 9-2, 9-3, 9-4, 9-5, 9-6, 9-7 and 9-8.

Each of the fifth, sixth, seventh and eighth parts P5, P6, P7 and P8 has a drain electrode 7 which is connected to the other end of each of the first, second, third, fourth, fifth, sixth, seventh and eighth fin-type stacked layer structures 9-1, 9-2, 9-3, 9-4, 9-5, 9-6, 9-7 and 9-8. A drain electrode 7 is provided per fin-type stacked layer structure.

Bit lines BL1, BL2, BL3 and BL4 are connected to the drain electrodes 7 and a source line SL is connected to the source electrodes 8.

In the second embodiment, the number of fin-type stacked layer structures is eight but is not limited thereto. Typically, this layout can be obtained by connecting 4×m (m is a natural number of 2. or more) fin-type stacked layer structures in series.

Figure 17:
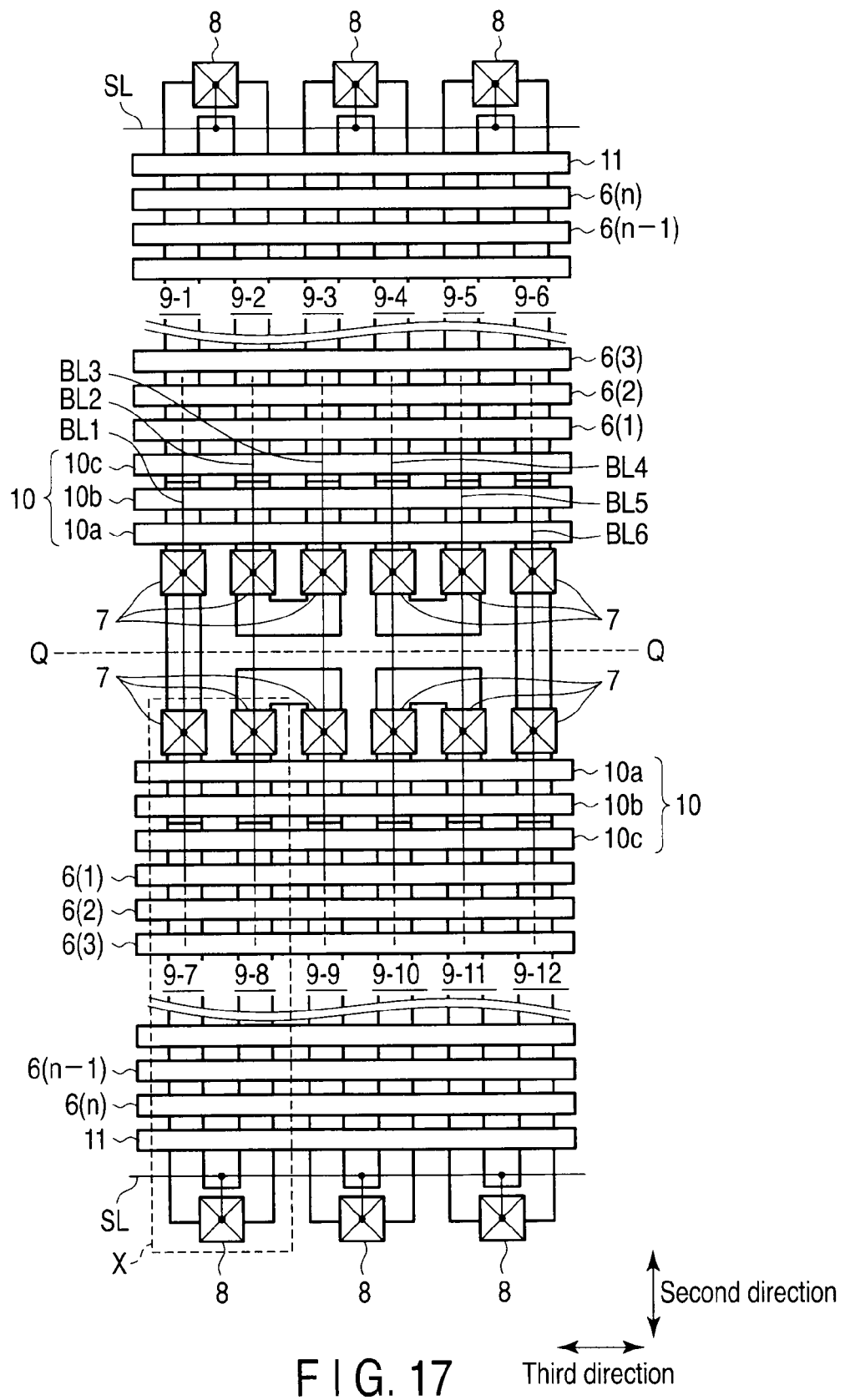

For example, as shown in FIG. 17, the ring shape may be configured by using first, second, third, fourth, fifth, sixth, seventh, eighth, ninth, tenth, eleventh and twelfth fin-type stacked layer structures 9-1, 9-2, 9-3, 9-4, 9-5, 9-6, 9-7, 9-8, 9-9, 9-10, 9-11 and 9-12. When m=1, the same structure as the first embodiment is employed.

With the structure, similar to the first embodiment, the entire plane shape is the ring shape due to the first, second, third, fourth, fifth, sixth, seventh and eighth fin-type stacked layer structures 9-1, 9-2, 9-3, 9-4, 9-5, 9-6, 9-7, 9-8 and the first, second, third, fourth, fifth, sixth, seventh and eighth parts P1, P2, P3, P4, P5, P6, P7, P8. For the ring shape, the first, second, third and fourth fin-type stacked layer structures 9-1, 9-2, 9-3, 9-4 and the fifth, sixth, seventh and eighth fin-type stacked layer structures 9-5, 9-6, 9-7, 9-8 are symmetrically provided relative to line Q, for example.

Therefore, even when the number of memory strings in each of the first, second, third, fourth, fifth, sixth, seventh and eighth fin-type stacked layer structures 9-1, 9-2, 9-3, 9-4, 9-5, 9-6, 9-7 and 9-8 is increased and the fin width of each of the first, second, third, fourth, fifth, sixth, seventh and eighth fin-type stacked layer structures 9-1, 9-2, 9-3, 9-4, 9-5, 9-6, 9-7 and 9-8 is made smaller, the first, second, third, fourth, fifth, sixth, seventh and eighth fin-type stacked layer structures 9-1, 9-2, 9-3, 9-4, 9-5, 9-6, 9-7 and 9-8 will not fall.

B. Examples of Materials

Examples of materials are the same as those in the first embodiment and thus an explanation thereof will be omitted here.

C. Modification Examples

Also in the second embodiment, the first modification example (FIG. 6) and the second modification example (FIG. 7) of the first embodiment can be applied.

The following modification examples are applicable to the layout.

Figure 18:
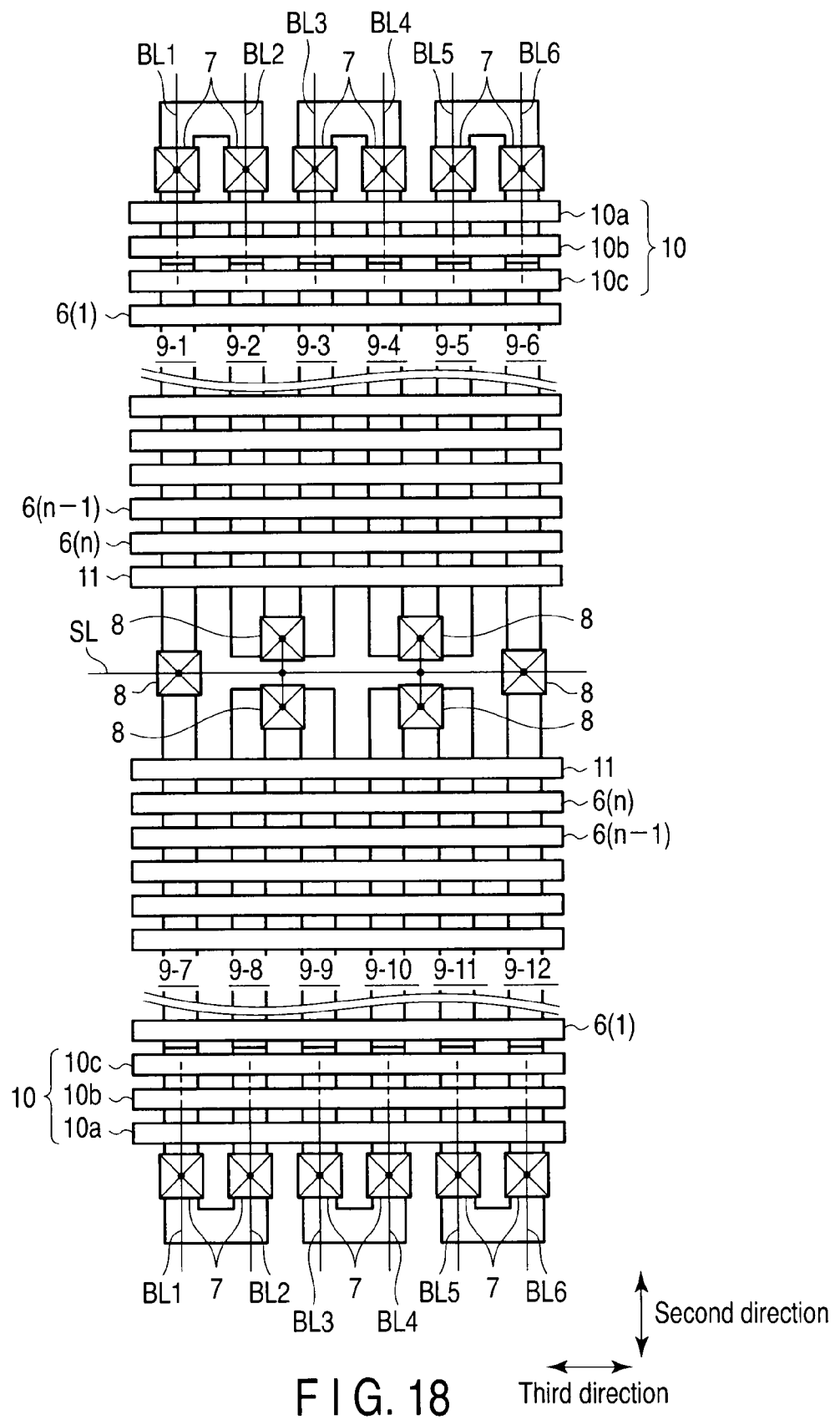
Figure 20:
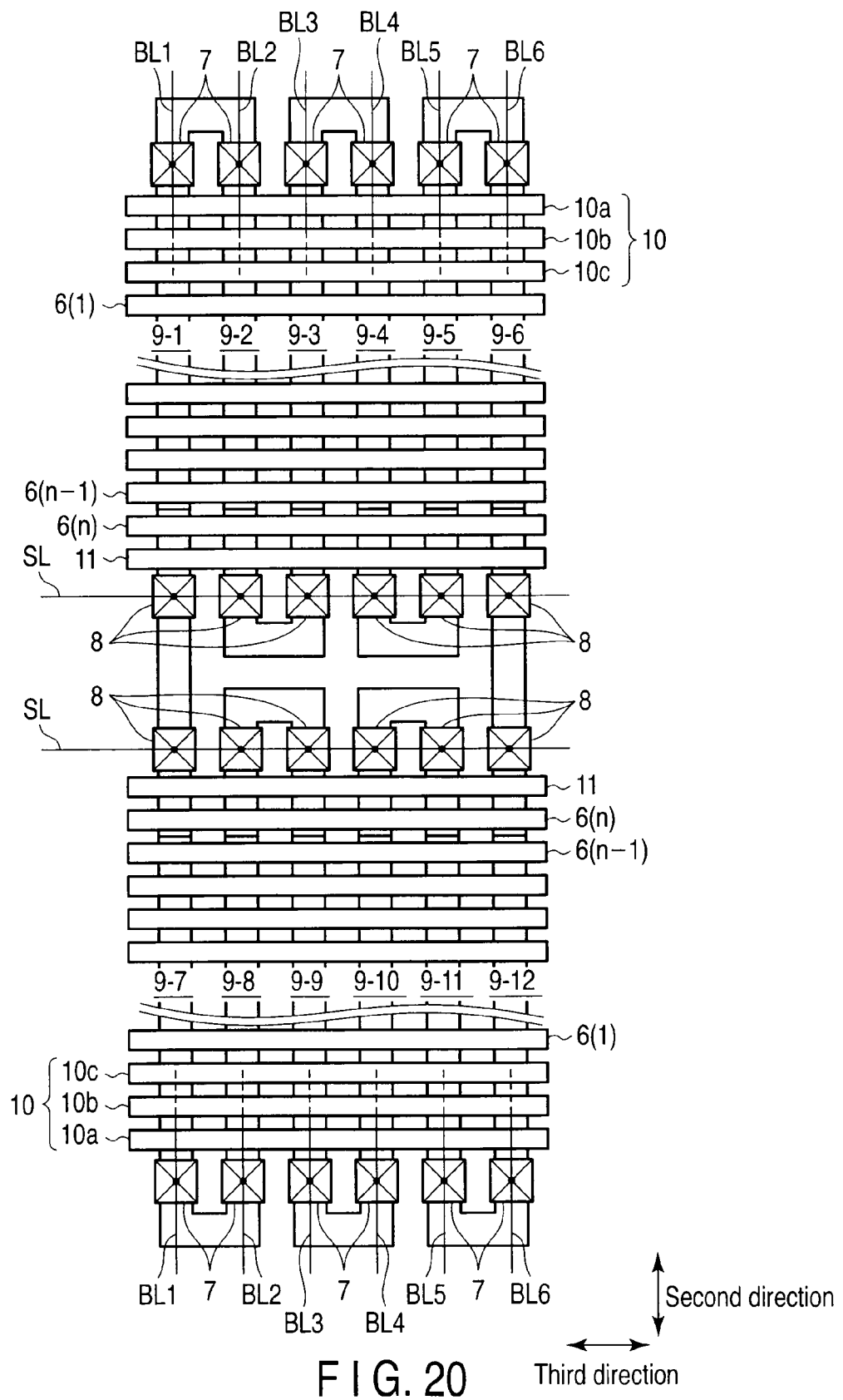

FIGS. 18 to 20 show a modification example of the layout.

FIG. 18 has a layout in which the positions of the drain electrodes 7 and the positions of the source electrodes 8 are inverted to the layout of FIG. 17. The source electrode 8 can be shared in the fin-type stacked layer structures but a drain electrode 7 is provided per fin-type stacked layer structure.

FIG. 19 is characterized in that a source electrode 8 is provided per fin-type stacked layer structure in the layout of FIG. 17. That is, the drain electrode 7 and the source electrode 8 are independently provided in each of the first, second, third, fourth, fifth, sixth, seventh, eighth, ninth, tenth, eleventh and twelfth fin-type stacked layer structures 9-1, 9-2, 9-3, 9-4, 9-5, 9-6, 9-7, 9-8, 9-9, 9-10, 9-11 and 9-12.

FIG. 20 has a layout in which the positions of the drain electrodes 7 and the positions of the source electrodes 8 are inverted to the layout of FIG. 19. A drain electrode 7 and a source electrode 8 are provided per fin-type stacked layer structure.

Also in these modification examples, similar effects to those of the structure of FIGS. 16 and 17 can be obtained.

D. Operations

The operations of a three-dimensional stacked layer semiconductor memory according to the second embodiment are the same as those according to the first embodiment and thus an explanation thereof will be omitted here.

E. Manufacturing Method

FIGS. 21A, 21B, 21C, 21D, 21E, 21F, 21G and 21H show a method for manufacturing the structure of FIG. 17.

Figure 21A:
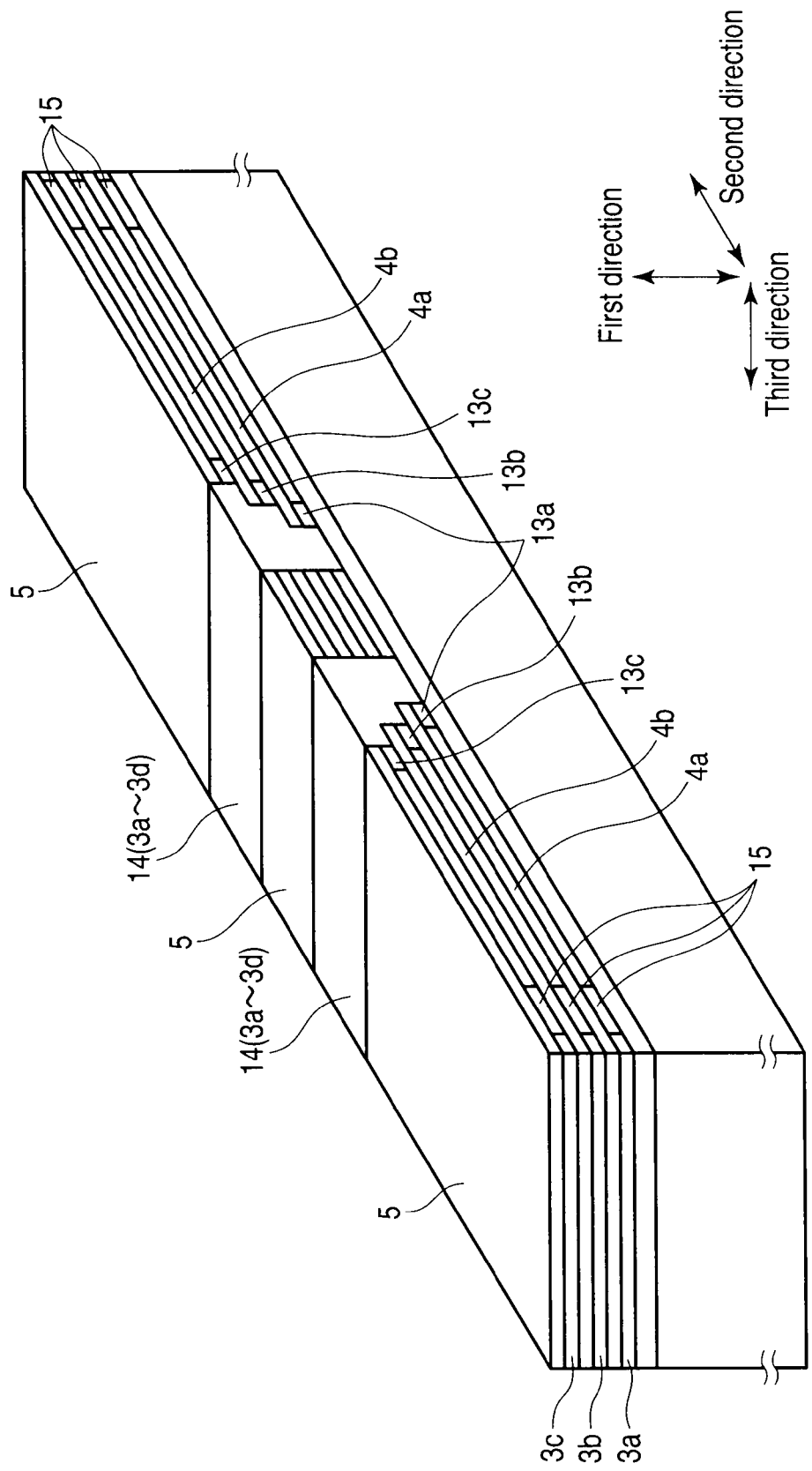
Figure 21B:
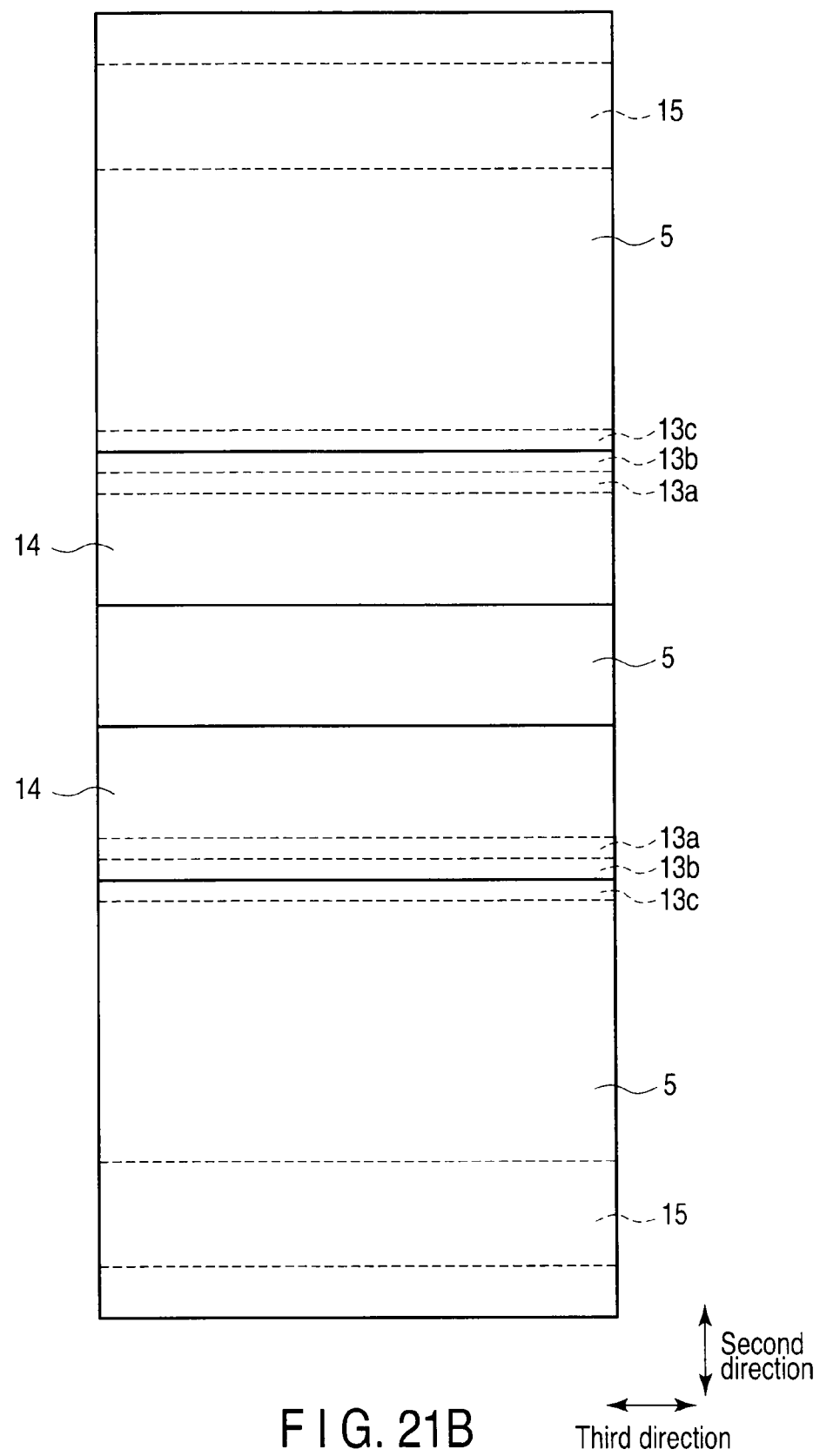

At first, the structure shown in FIGS. 21A and 21B is formed through the steps of FIGS. 9A, 9B, 9C and 9D described in the first embodiment. FIG. 21A (perspective view) and FIG. 21B (plan view) show the same structure.

The structure shown in FIGS. 21A and 21B may be formed by using the steps of FIGS. 10A, 10B, 10C, the steps of FIGS. 11A, 11B, 11C or the steps of FIGS. 12A, 12B, 12C.

As shown in FIGS. 21A and 21B, a common semiconductor 14 (3a, 3b, 3c, 3d) is formed at ends in the second direction of first, second and third semiconductor layers 3a, 3b. and 3c.

Next, a mask element having a ring shape for forming the first, second, third, fourth, fifth, sixth, seventh, eighth, ninth, tenth, eleventh and twelfth fin-type stacked layer structures is formed on a fourth insulating layer 5 and the common semiconductor 14. The mask element having a ring shape is made of a hard mask (such as amorphous Si).

Since a resist pattern is peeled by an ashing processing and thus the first, second and third semiconductor layers 3a, 3b. and 3c. are prevented from being oxidized during the peeling of the resist pattern, the resist pattern cannot be used as the patterning mask of the first, second and third semiconductor layers 3a, 3b. and 3c.

A hard mask is used as the patterning mask of the first, second and third semiconductor layers 3a, 3b. and 3c.

The mask element having a ring shape is formed through the following steps.

At first, as shown in FIG. 21C, a comb-shaped core (such as SiN) 16 extending in the second direction is formed on the fourth insulating layer 5 and the common semiconductor 14. As shown in FIG. 21D, the comb-shaped core 16 is etched by isotropic wet etching to make the widths in the second and third directions of the comb-shaped core 16 narrower.

Figure 21F:
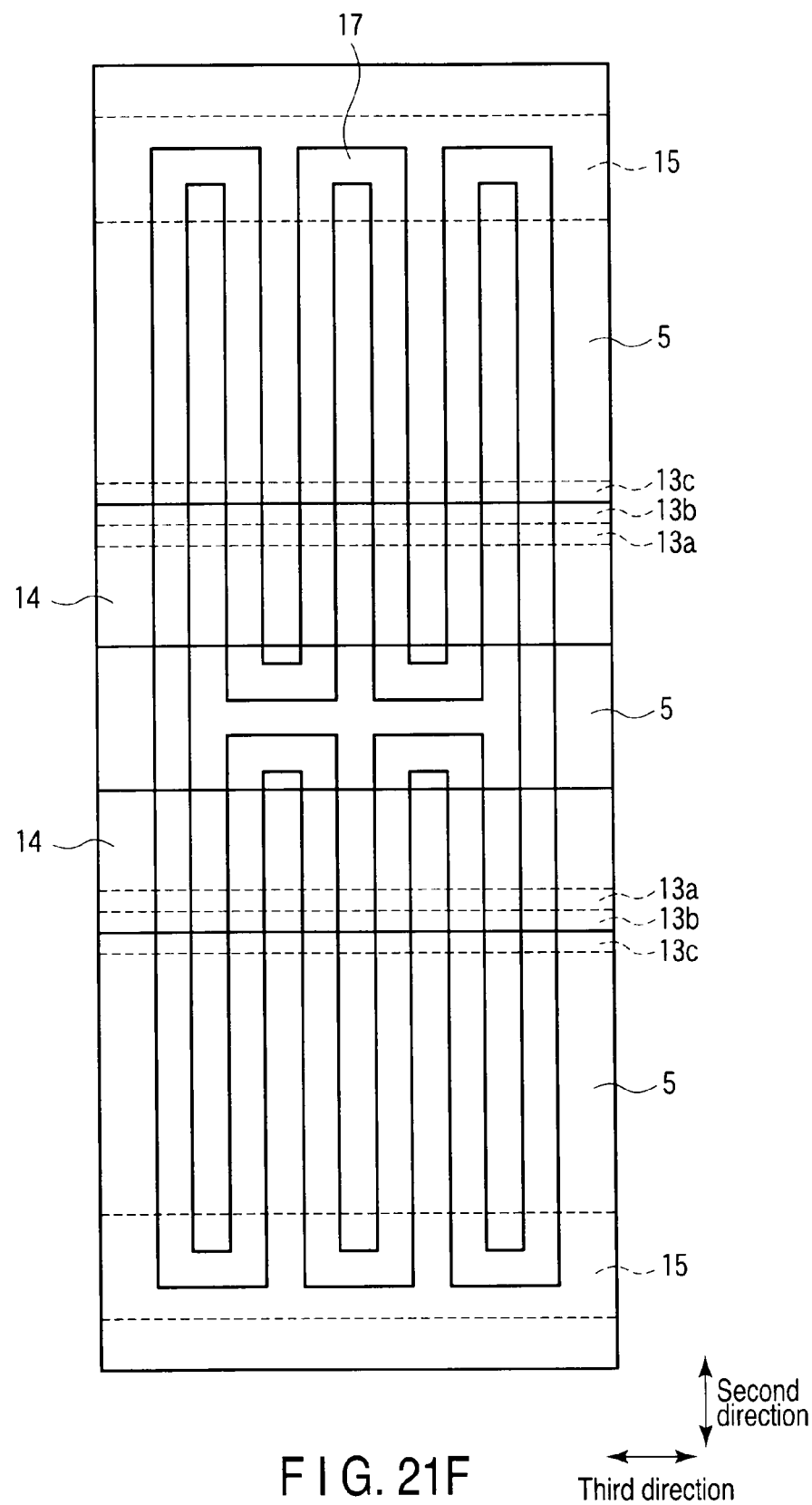

Next, as shown in FIG. 21E, a hard mask (such as amorphous Si) is formed on the fourth insulating layer 5 and the common semiconductor 14 and then the hard mask is etched by anisotropic etching so that a mask element 17 having a ring shape is formed on side walls of the comb-shaped core 16. As shown in FIG. 21F, when the comb-shaped core 16 is selectively removed, the mask element 17 having a ring shape remains on the fourth insulating layer 5 and the common semiconductor 14.

Then, as shown in FIG. 21G, the fourth insulating layer 5, the third semiconductor layer 3c, a third insulating layer 4b, the second semiconductor layer 3b, a second insulating layer 4a, the first semiconductor layer 3a, a first insulating layer 2 and the common semiconductor 14 are sequentially patterned by anisotropic etching using the comb-shaped mask element 17 as a mask.

Consequently, the first, second, third, fourth, fifth, sixth, seventh, eighth, ninth, tenth, eleventh and twelfth fin-type stacked layer structures 9-1, 9-2, 9-3, 9-4, 9-5, 9-6, 9-7, 9-8, 9-9, 9-10, 9-11, 9-12 and the first, second, third, fourth, fifth, sixth, seventh, eighth, ninth, tenth, eleventh and twelfth parts P1, P2, P3, P4, P5, P6, P7, P8, P9, P10, P11, P12 are formed on a semiconductor substrate 1.

Thereafter, the mask element 17 having a ring shape is removed. The mask element 17 having a ring shape may remain instead of being removed.

Figure 21H:
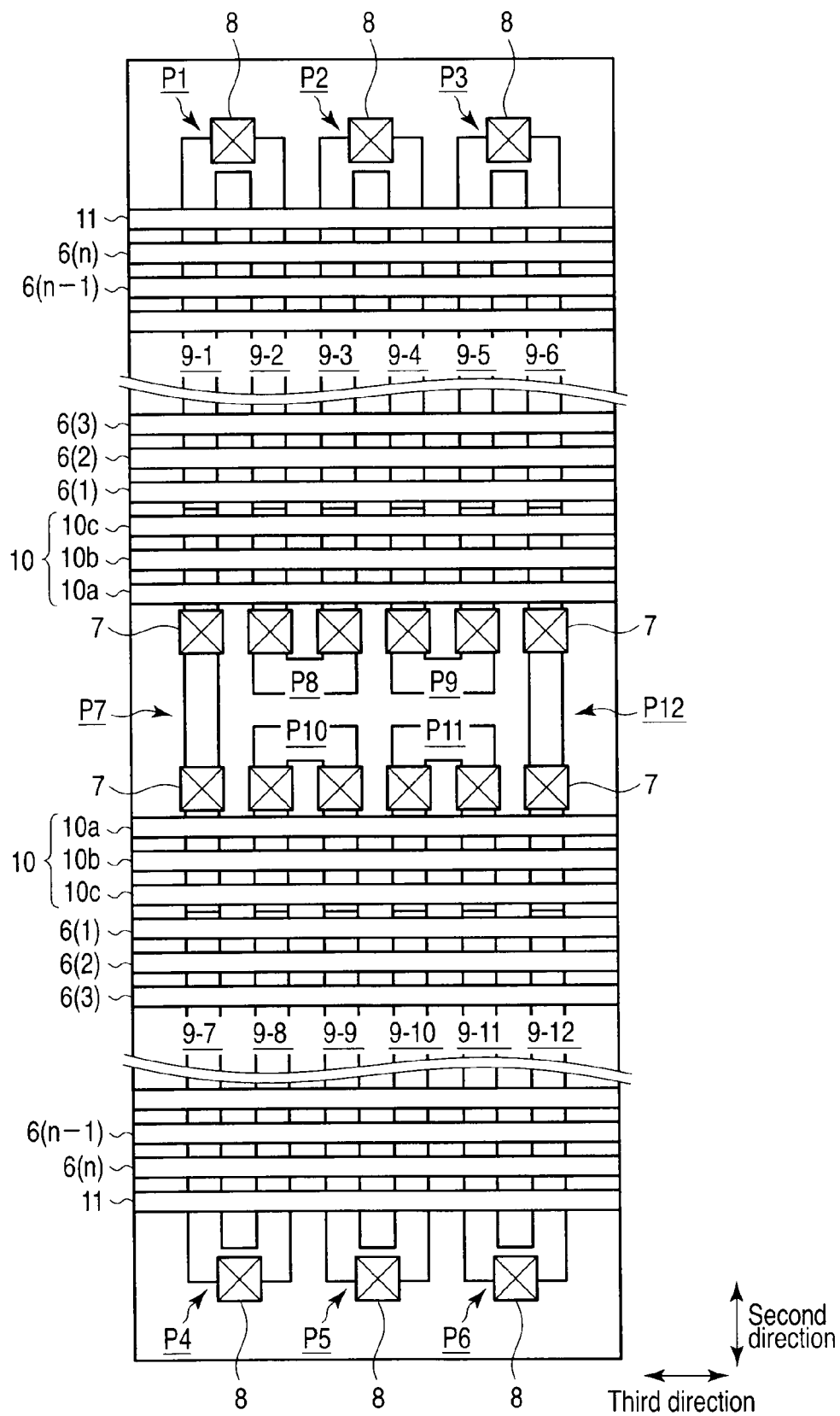

Next, as shown in FIG. 21H, stacked gate structures 6(1), 6(2), ... 6(n) and select gate electrodes 10 (10a, 10b, 10c) extending in the third direction are formed by using anisotropic etching such as CVD, sputtering and RIE and by straddling the first, second, third, fourth, fifth, sixth, seventh, eighth, ninth, tenth, eleventh and twelfth fin-type stacked layer structures 9-1, 9-2, 9-3, 9-4, 9-5, 9-6, 9-7, 9-8, 9-9, 9-10, 9-11 and 9-12.

The structure of FIG. 17 is completed through the above steps.

F. Application Examples

The first, second and third application examples (FIGS. 13, 14, 15) of the first embodiment can be also applied to the second embodiment.

G. Conclusion

According to the second embodiment, 4×m (m is a natural number of 2. or more) fin-type stacked layer structures are connected in series so that the entire plane shape is a serpentine ring shape snaking in the third direction.

Thus, even when the number of memory strings in the fin-type stacked layer structure is increased and the fin width of the fin-type stacked layer structure is made smaller, the fin-type stacked layer structure will not fall.

Thus, it is possible to realize higher integration and higher yield of a nonvolatile semiconductor memory device.

3. Third Embodiment

A. Structure

Figure 22:
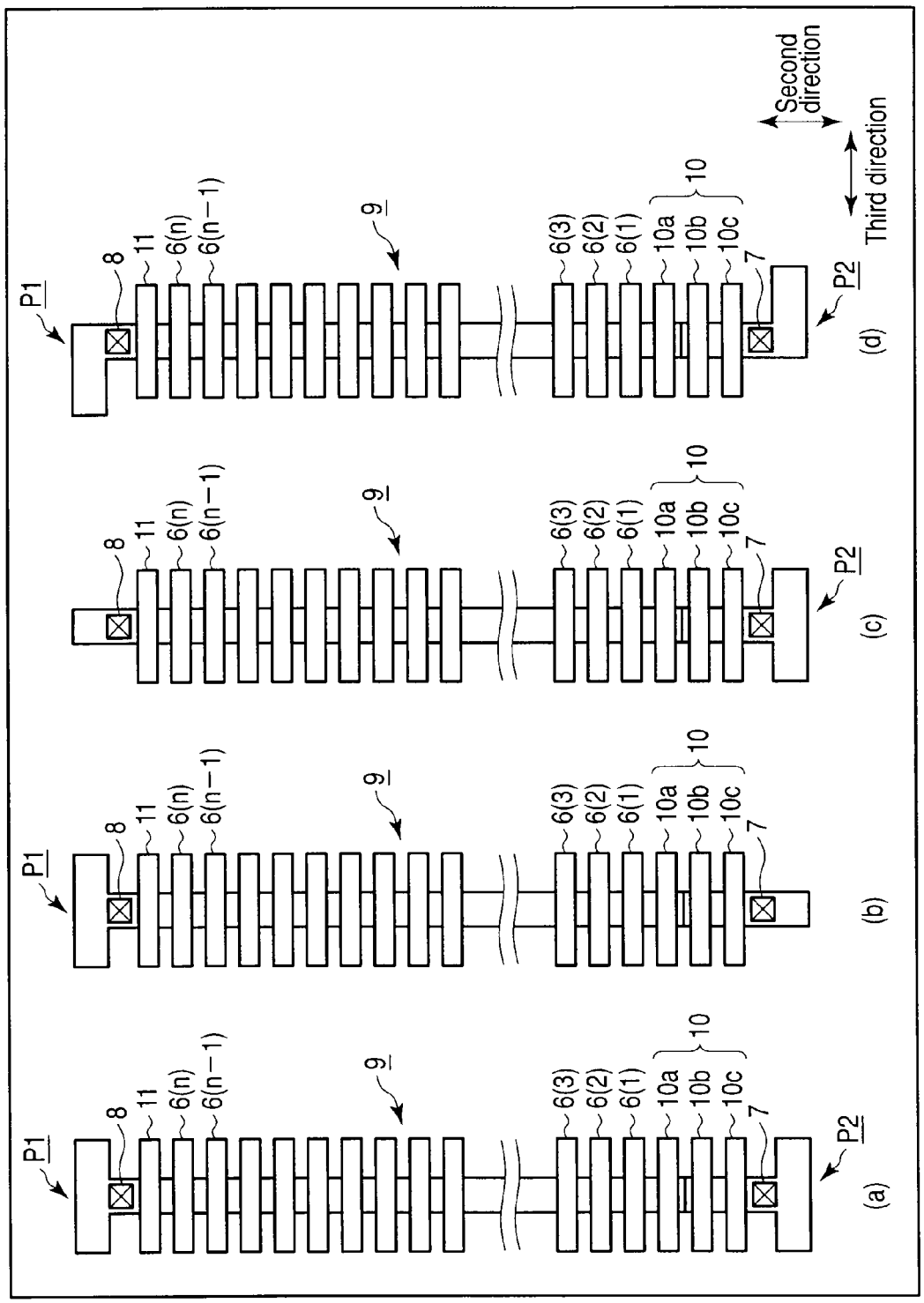
FIG. 22 shows a structure of a third embodiment.

FIG. 22 is a plan view of a nonvolatile semiconductor memory device.

The third embodiment is characterized in that a fin-type stacked layer structure 9 extending in the second direction is focused and reinforcing members for preventing the falling, which extend in the third direction, are provided at one or both ends in the second direction unlike the first embodiment.

The fin-type stacked layer structure 9 is the same as the fin-type stacked layer structure according to the first embodiment.

In FIGS. 22A and 22D, a first part P1 extending in the third direction is contacted to one end in the second direction of the fin-type stacked layer structure 9 and a second part P2 extending in the third direction is contacted to the other end in the second direction.

In FIG. 22B, the first part P1 extending in the third direction is contacted to only one end in the second direction of the fin-type stacked layer structure 9, and in FIG. 22C, the second part P2 extending in the third direction is contacted to only the other end in the second direction of the fin-type stacked layer structure 9.

The first and second parts P1 and P2 function as a reinforcing member for preventing the falling of the fin-type stacked layer structure 9. The shapes of the first and second parts P1 and P2 are not limited to that in FIGS. 22A, 22B, 22C and 22D. If the maximum width in the third direction of each of the first and second parts P1 and P2 is larger than the width in the third direction of the fin-type stacked layer structure 9, the first and second parts P1 and P2 can serve as the reinforcing member for preventing the falling of the fin-type stacked layer structure 9 irrespective of the shapes.

Figure 24:
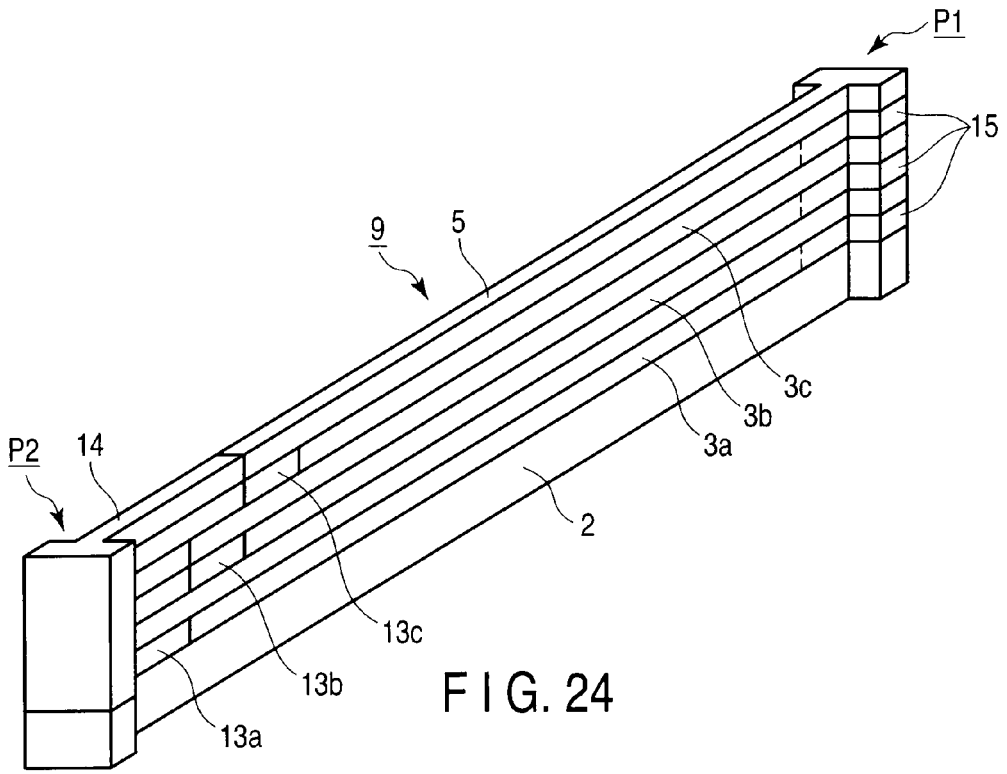
FIG. 24 shows a part in FIG. 23.

FIG. 23 shows an example of the fin-type stacked layer structure. FIG. 24 shows part of the structure of FIG. 23.

The third embodiment focuses on the structure shown in FIG. 22A.

A semiconductor substrate 1 is a silicon substrate, for example. The fin-type stacked layer structure 9 is formed on the semiconductor substrate 1. The fin-type stacked layer structure 9 has first, second and third memory strings 3a. (NANDa), 3b. (NANDb) and 3c. (NANDc) which are stacked in the first direction perpendicular to a surface of the semiconductor substrate 1, and extends in the second direction parallel to the surface of the semiconductor substrate 1.

The third embodiment shows the first, second and third memory strings NANDa, NANDb and NANDc but is not limited thereto. Similar to the first embodiment, the fin-type stacked layer structure 9 may have only a first to an i-th memory strings (i is a natural member of 2. or more).

The first part (source area) P1 is connected to one end in the second direction of the fin-type stacked layer structure 9. The first part P1 has the same structure as the fin-type stacked layer structure 9, for example.

The second part (drain area) P2 is connected to the other end in the second direction of the fin-type stacked layer structure 9. The second part P2 is made of a common semiconductor 14, for example.

Each of the first, second and third memory strings NANDa, NANDb and NANDc has first, second and third semiconductor layers 3 (3a, 3b, 3c) and stacked gate structures 6(1), 6(2), ... 6(n) provided on the side surface in the third direction perpendicular to the first and second directions of the first, second and third semiconductor layers 3 (3a, 3b, 3c). The stacked gate structure 6(1) has a first insulating layer 6(1)a, a charge storage layer 6(1)b, a second insulating layer 6(1)c. and a control gate electrode 6(1)d, for example.

The first insulating layer 6(1)a. functions as a gate insulating layer, and the second insulating layer 6(1)c. functions as a block insulating layer for blocking leak current between the charge storage layer 6(1)b. and the control gate electrode 6(1)d.

In this example, the first, second and third memory strings NANDa, NANDb and NANDc cover two opposite side surfaces in the third direction of the first, second and third semiconductor layers 3 (3a, 3b, 3c). That is, the first, second and third memory strings NANDa, NANDb and NANDc have a double gate structure.

Insulating layers 2, 4 (4a, 4b) and 5 isolate the semiconductor layers 3 (3a, 3b, 3c) from each other.

The first, second and third memory strings NANDa, NANDb and NANDc use the first, second and third semiconductor layers 3 (3a, 3b, 3c) as a channel, respectively.

The first part P1 has a source electrode 8 which connects the first, second and third memory strings NANDa, NANDb and NANDc in the fin-type stacked layer structure 9 stacked with respect to each other. The second part P2 has a drain electrode 7 connected to the common semiconductor 14.

Each of the first, second and third memory strings NANDa, NANDb and NANDc in the fin-type stacked layer structure 9 has first, second and third layer-select transistor Ta, Tb and Tc in this order from the drain electrode 7 side.

The number of layer-select transistors Ta, Tb, Tc is equal to the number of memory strings NANDa, NANDb, NANDc. Similar to the first embodiment, when the fin-type stacked layer structure 9 has the first to i-th memory strings (i is a natural number of 2. or more), the fin-type stacked layer structure 9 has the first to i-th layer-select transistors.

The first, second and third layer-select transistors Ta, Tb and Tc have first, second and third select gate electrodes 10 (10a, 10b, 10c) extending in the first direction by straddling the first, second and third semiconductor layers 3 (3a, 3b, 3c).

In this example, the first, second and third select gate electrodes 10 (10a, 10b, 10c) cover two opposite side surfaces in the third direction of the first, second and third semiconductor layers (3a, 3b, 3c). That is, the first, second and third layer-select transistors Ta, Tb and Tc have a double gate structure.

A source side select transistor Ts is provided between the first, second, third memory strings NANDa, NANDb, NANDc and the source electrode 8.

The source side select transistor Ts has a select gate electrode 11 extending in the first direction by straddling the first, second and third semiconductor layers 3 (3a, 3b, 3c).

In this example, the source side select gate electrode 11 coverts two opposite side surfaces in the third direction of the first, second and third semiconductor layers 3 (3a, 3b, 3c). That is, the source side select transistor Ts has a double gate structure, too.

The first, second, third layer-select transistors Ta, Tb, Tc and the source side select transistor Ts are not limited in their shapes while functioning as a switch device similar to the first embodiment.

The edge positions of the second and third insulating layers 4 (4a, 4b) at the drain electrode 7 side and the threshold states of the first, second and third layer-select transistors Ta, Tb, Tc are identical to those in the first embodiment and thus a detailed explanation thereof will be omitted.

The first layer-select transistor Ta nearest to the drain electrode 7 is a normally on-state within a range of voltage to be applied to the first select gate electrode 10a. in the lowermost first semiconductor layer 3a. (uncontrollable state).

The normally on-state is realized by providing an impurity area 13a. in the first semiconductor layer 3a as the channel of the first layer-select transistor Ta.

For the second and third semiconductor layers 3b and 3c, the first layer-select transistor Ta is on/off controlled within a range of voltage to be applied to the first select gate electrode 10a.

The second layer-select transistor Tb is a normally on-state within a range of voltage to be applied to the second select gate electrode 10b. in the intermediate second semiconductor layer 3b (uncontrollable state).

The normally on-state is realized by providing an impurity area 13b. in the second semiconductor layer 3b as the channel of the second layer-select transistor Tb.

For the first and third semiconductor layers 3a and 3c, the second layer-select transistor Tb is on/off controlled within a range of voltage to be applied to the second select gate electrode 10b.

The third layer-select transistor Tc furthest from the drain electrode 7 is a normally on-state within a range of voltage to be applied to the third select gate electrode 10c. in the uppermost third semiconductor layer 3c. (uncontrollable state).

The normally on-state is realized by providing an impurity area 13c. in the third semiconductor layer 3c as the channel of the third layer-select transistor Tc.

For the first and second semiconductor layers 3a and 3b, the third layer-select transistor Tc is on/off controlled within a range of voltage to be applied to the third select gate electrode 10c.

With the structure, since the first and second parts P1 and P2 function as a reinforcing member for preventing the falling of the fin-type stacked layer structure 9, even when the number of memory strings in the fin-type stacked layer structure 9 is increased and the fin width of the fin-type stacked layer structure 9 is made smaller, the fin-type stacked layer structure 9 will not fall.

B. Manufacturing Method

FIGS. 25A, 25B, 25C, 25D, 25E and 25F show a method for manufacturing the structure of FIGS. 23 and 24.

Figure 25A:
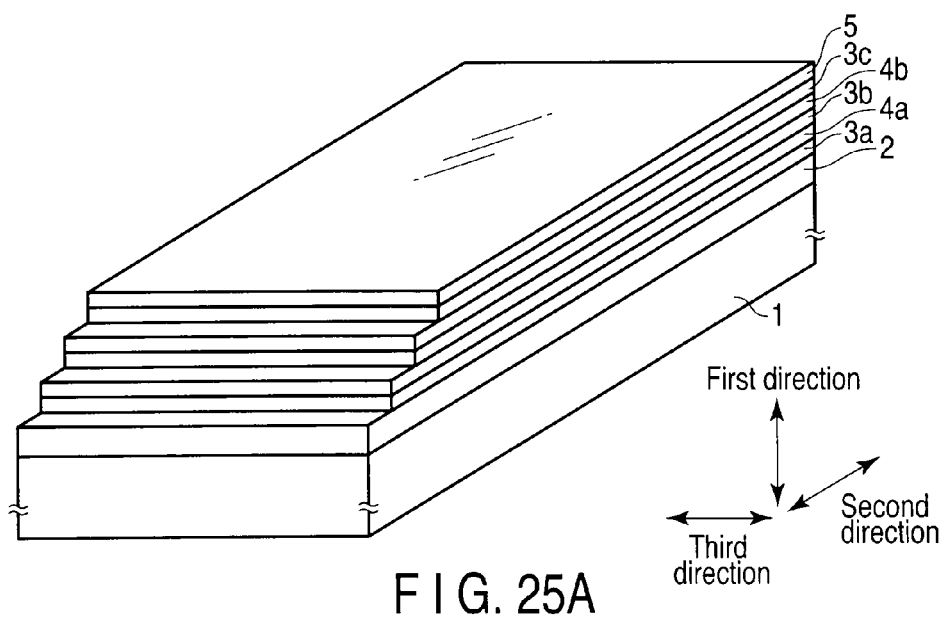
FIGS. 25A to 25F show an example of the manufacturing method.

At first, as shown in FIG. 25A, the first insulating layer (such as silicon oxide) 2 is formed on the semiconductor substrate 1 and subsequently the first semiconductor layer (such as silicon) 3a. and the second insulating layer (such as silicon oxide) 4a. are sequentially formed on the first insulating layer 2.

A resist pattern is formed on the second insulating layer 4a. by PEP and RIE is performed by using the resist pattern as a mask to pattern the second insulating layer 4a. and the first semiconductor layer 3a.

Consequently, an edge position in the second direction of the second insulating layer 4a. is determined. Thereafter, the resist pattern is removed.

The second semiconductor layer (such as silicon) 3b. and the third insulating layer (such as silicon oxide) 4b. are sequentially formed on the second insulating layer 4a.

A resist pattern is formed on the third insulating layer 4b. by PEP and RIE is performed by using the resist pattern as a mask to pattern the third insulating layer 4b. and the second semiconductor layer 3b.

Consequently, an edge position of the third insulating layer 4b. is determined in the second direction. Thereafter, the resist pattern is removed.

The third semiconductor layer (such as silicon) 3c and the fourth insulating layer (such as silicon oxide) 5 are sequentially formed on the third insulating layer 4b.

A resist pattern is formed on the fourth insulating layer 5 by PEP and RIE is performed by using the resist pattern as a mask to pattern the fourth insulating layer 5 and the third semiconductor layer 3c.

Consequently, an edge position of the fourth insulating layer 5 is determined in the second direction. Thereafter, the resist pattern is removed.

In this example, the thicknesses in the first direction of the second, third and fourth insulating layers 4a, 4b. and 5 are desirably equal to each other in consideration of ion implantation (collective implantation) described later.

Figure 25B:
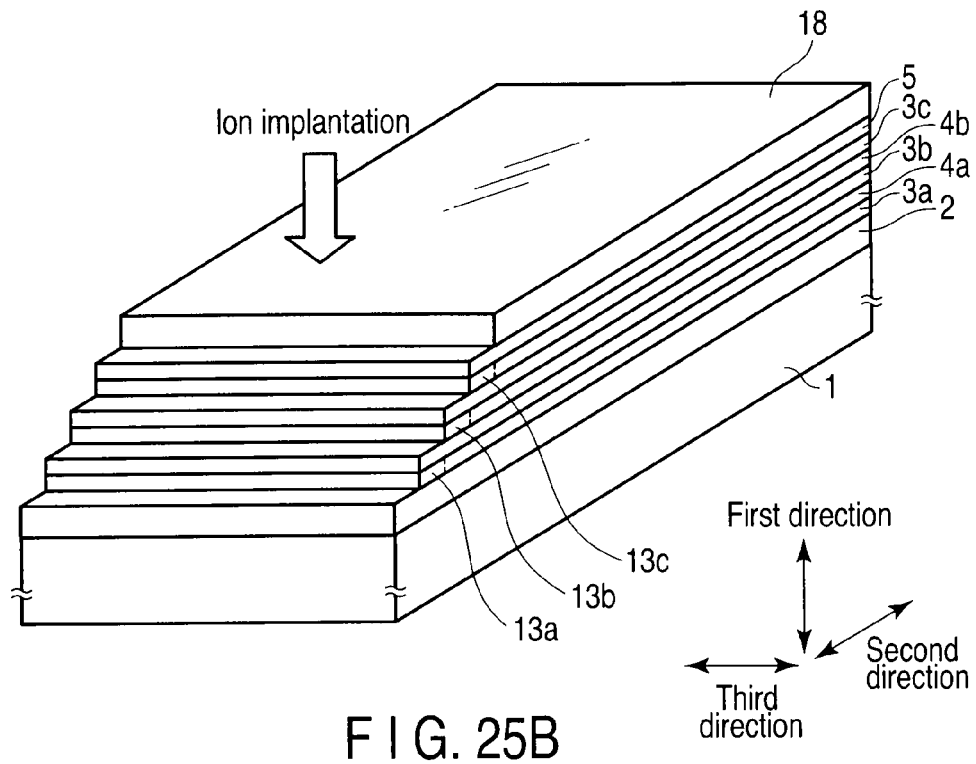

Next, as shown in FIG. 25B, a resist pattern 18 is formed on the fourth insulating layer 5 by PEP and ion implantation is performed by using the resist pattern 18 as a mask.

For the ion implantation, the acceleration energy and the amount of dose are controlled so that the impurity areas 13a, 13b. and 13c. are simultaneously formed in the first, second and third semiconductor layers 3 (3a, 3b, 3c) (collective implantation).

Since the second, third and fourth insulating layers 4a, 4b. and 5 function as a mask, each of the impurity areas 13a, 13b. and 13c. is formed at one end of each of the first, second and third semiconductor layers 3 (3a, 3b, 3c) in a self-alignment manner.

Thereafter, the resist pattern 18 is removed.

Figure 25C:
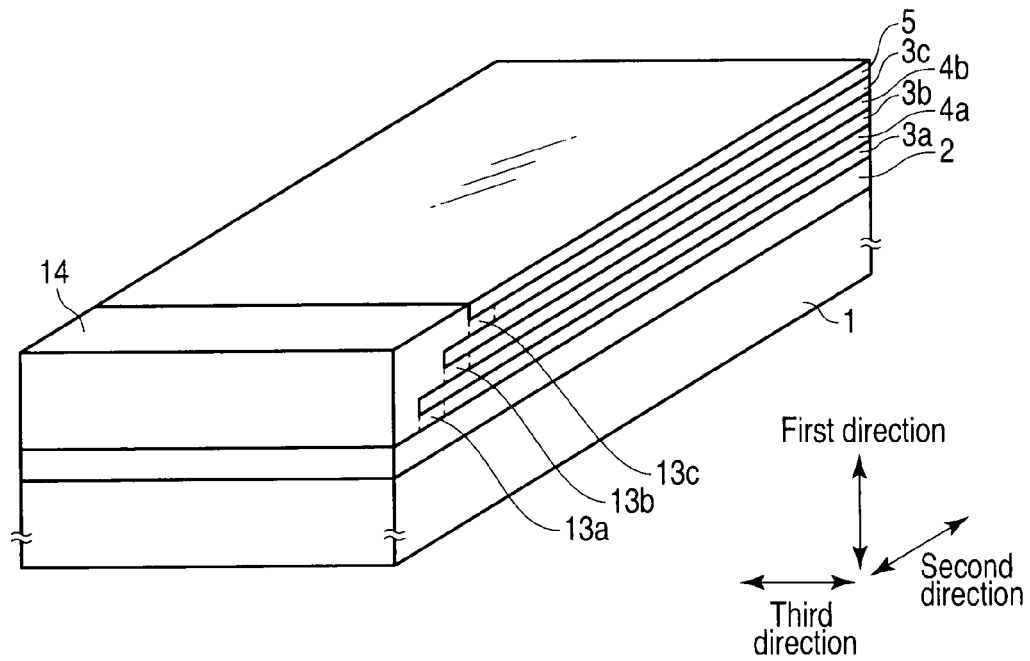

Next, as shown in FIG. 25C, the common semiconductor (such as silicon) 14 is formed and the surface of the common semiconductor 14 is planarized by CMP. The planarization may be performed by dry etching, for example.

The common semiconductor 14 contacts ends in the second direction of the first, second and third semiconductor layers 3 (3a, 3b, 3c) each other.

A source side impurity area 15 of FIGS. 23 and 24 is not formed through the above steps but may be additionally formed by adding a process similar to that in the second example of the manufacturing method according to the first embodiment.

Figure 25D:
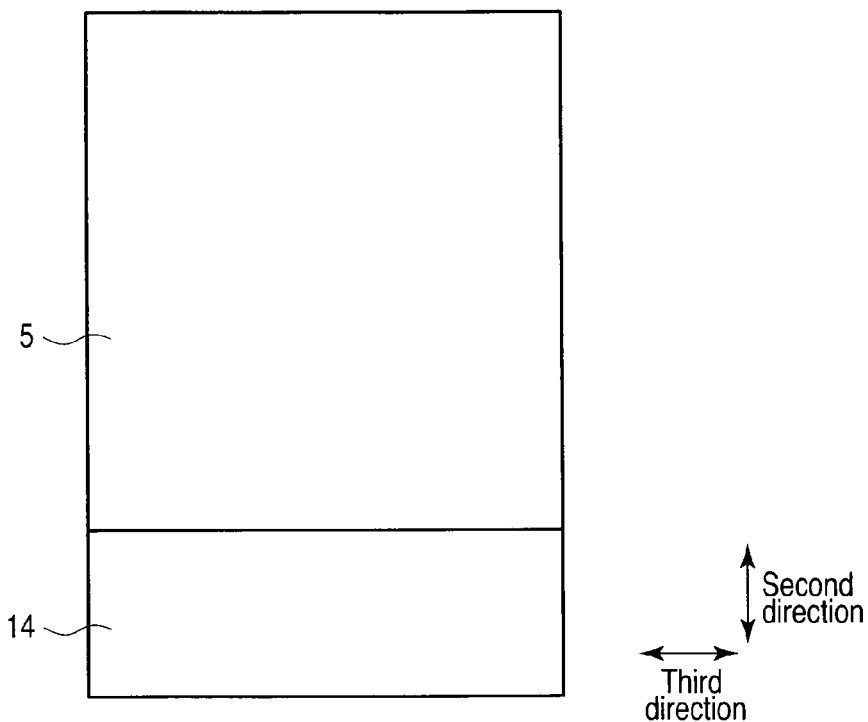

FIG. 25D is a plan view of FIG. 25C.

Figure 25E:
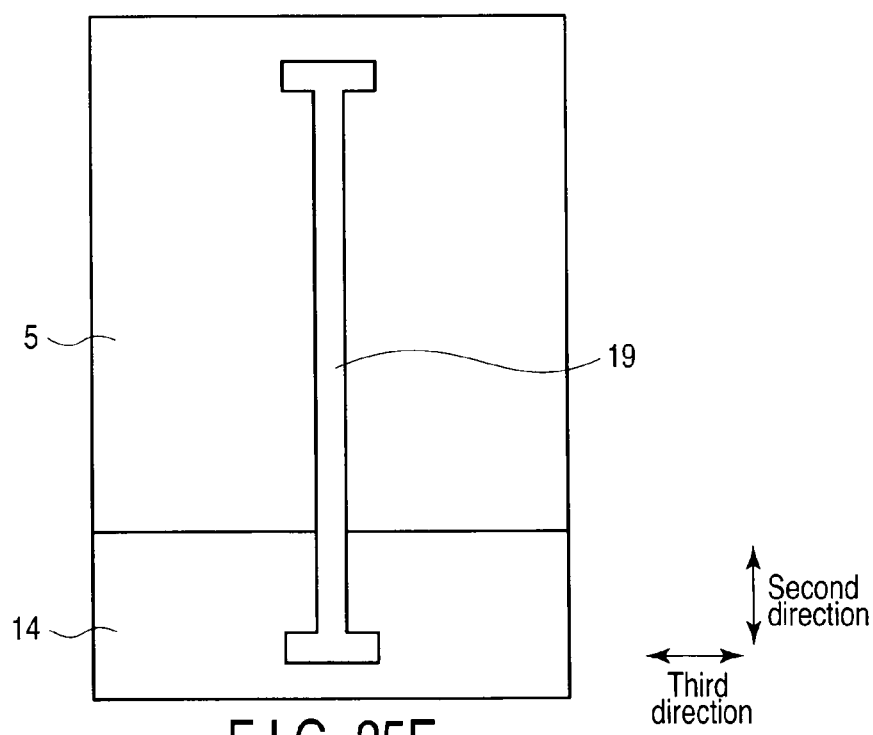

Next, as shown in FIG. 25E, the fourth insulating layer 5, the third semiconductor layer 3c, the third insulating layer 4b, the second semiconductor layer 3b, the second insulating layer 4a, the first semiconductor layer 3a, the first insulating layer 2 and the common semiconductor 14 are sequentially patterned by anisotropic etching using an I-type mask element 19 as a mask.

Consequently, the fin-type stacked layer structure 9 and the first and second parts P1, P2 are formed on the semiconductor substrate 1.

Thereafter, the I-type mask element 19 is removed. The I-type mask element 19 may remain instead of being removed.

Figure 25F:
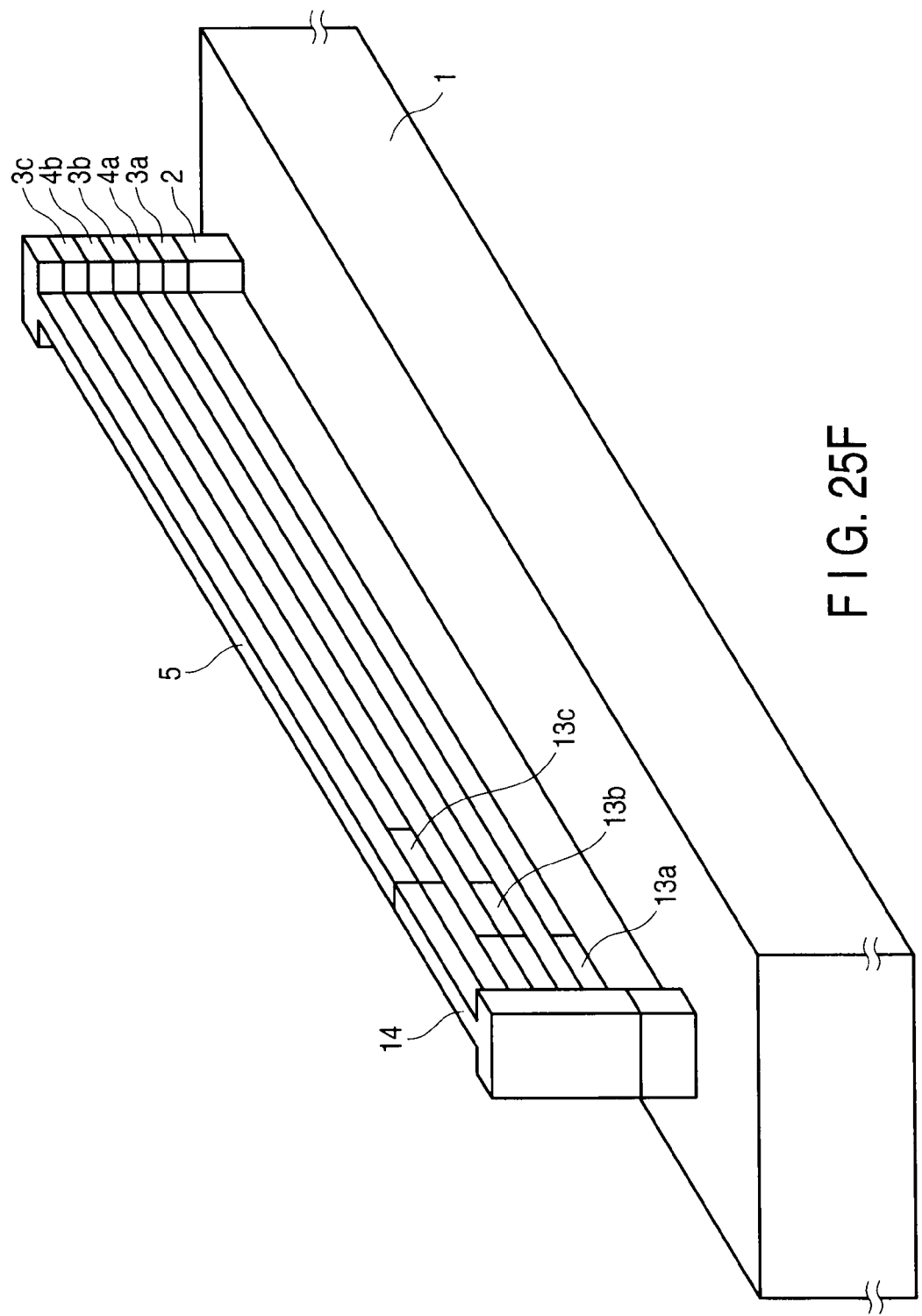

The structure shown in FIG. 25F is obtained through the steps of FIGS. 25A, 25B, 25C, 25D and 25E.

Thereafter, the stacked gate structures 6(1), 6(2), ... 6(n) and the select gate electrodes 10 (10a, 10b, 10c) extending in the third direction are formed by using the manufacturing method according to the first embodiment (see FIG. 9M) and by straddling the fin-type stacked layer structure 9.

The device structure of FIGS. 23 and 24 is completed through the above steps.

C. Application Examples

Application examples of the structure of FIG. 22 will be described.

Figure 26:
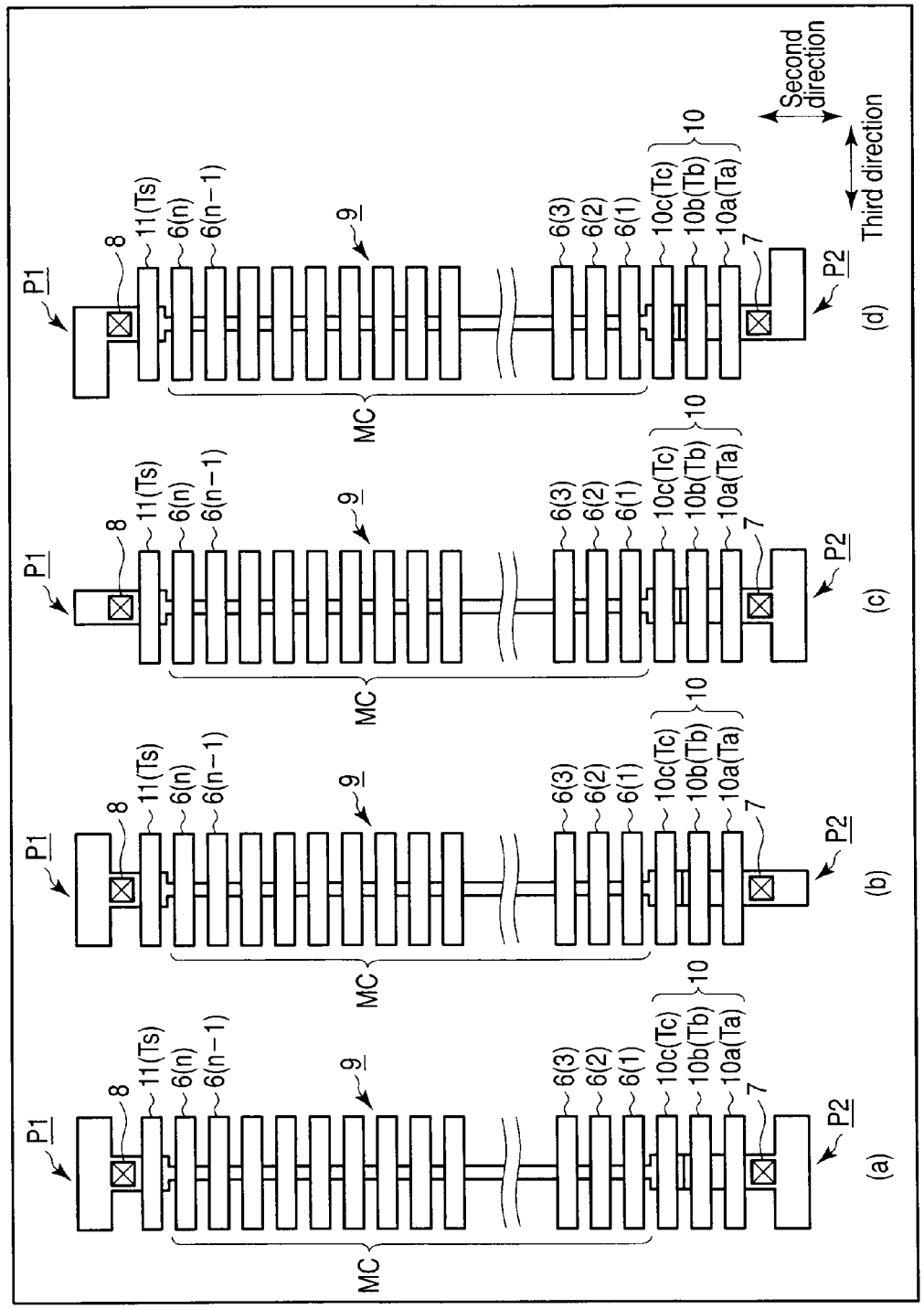
FIG. 26 shows a first application example.

FIG. 26 shows a first application example.

In FIG. 26, like reference numerals are denoted to like elements identical to those of FIG. 22 and thus a detailed explanation thereof will be omitted.

In the first application example, a fin width of a part in which the layer-select transistors (drain side select transistors) Ta, Tb, Tc and the source side select transistor Ts are provided is larger than a fin width of a part in which memory cells MC are provided.

That is, the width in the third direction of the semiconductor layers 3 (3a, 3b, 3c) in the fin-type stacked layer structure 9 has a minimum value in the part in which the memory cells MC are provided between the layer-select transistors Ta, Tb, Tc and the source side select transistor Ts.

Thus, the properties of the select transistors can be enhanced and the amount of current passing through the memory cells can be reduced. The control of the control gate electrodes is enhanced, thereby enabling higher speed and lower voltage of the memory cell operation. The ends in the second direction of the fin-type stacked layer structure 9 are made thicker so that the fin-type stacked layer structure 9 is difficult to fall.

In this example, both the fin width of the part in which the layer-select transistors Ta, Tb, and Tc are provided and the fin width of the part in which the source side select transistor Ts is provided are large but either one of them may be larger.

Figure 27:
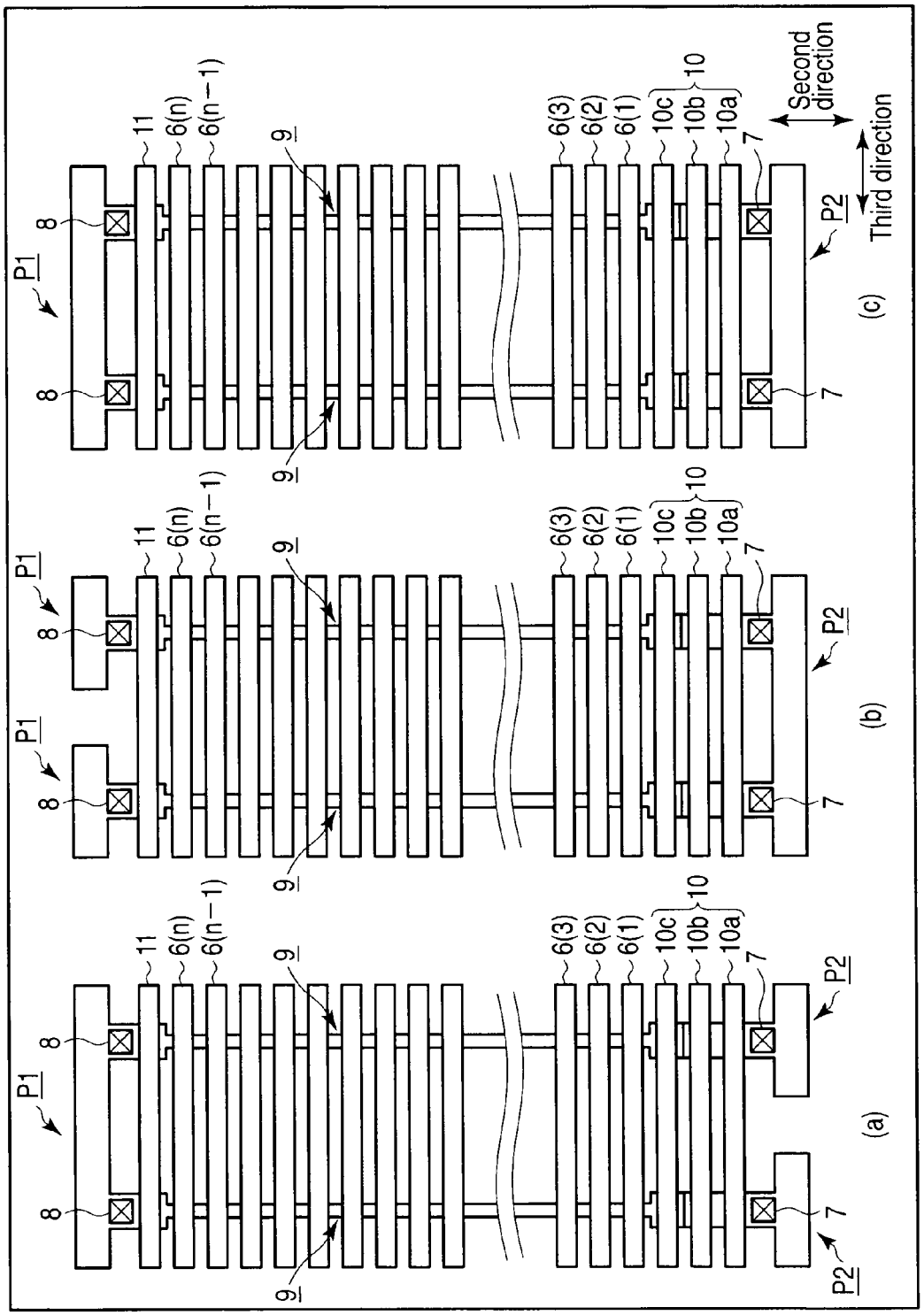
FIG. 27 shows a second application example.

FIG. 27 shows a second application example.

In FIG. 27, like reference numerals are denoted to like elements identical to those of FIG. 22 and thus a detailed explanation thereof will be omitted.

In the second application example, two fin-type stacked layer structures 9 according to the first application example (FIG. 26) are prepared and provided side by side in the second direction.

Then, the two fin-type stacked layer structures 9 share at least one of the first and second parts P1 and P2.

In FIG. 27(a), the two fin-type stacked layer structures 9 share the first part P1, in FIG. 27(b), the two fin-type stacked layer structures 9 share the second part P2, and in FIG. 27(c), the two fin-type stacked layer structures 9 share the first and second parts P1 and P2.

Thus, the properties of the select transistors can be enhanced and the amount of current passing through the memory cells can be reduced. The control of the control gate electrodes is enhanced, thereby enabling higher speed and lower voltage of the memory cell operation. The two fin-type stacked layer structures 9 share at least one of the first and second parts P1 and P2 so that the fin-type stacked layer structures 9 are difficult to fall.

In this example, both the fin width of the part in which the layer-select transistors Ta, Tb and Tc are provided and the fin width of the part in which the source side select transistor Ts is provided are large but either one of them may be larger.

Figure 29:
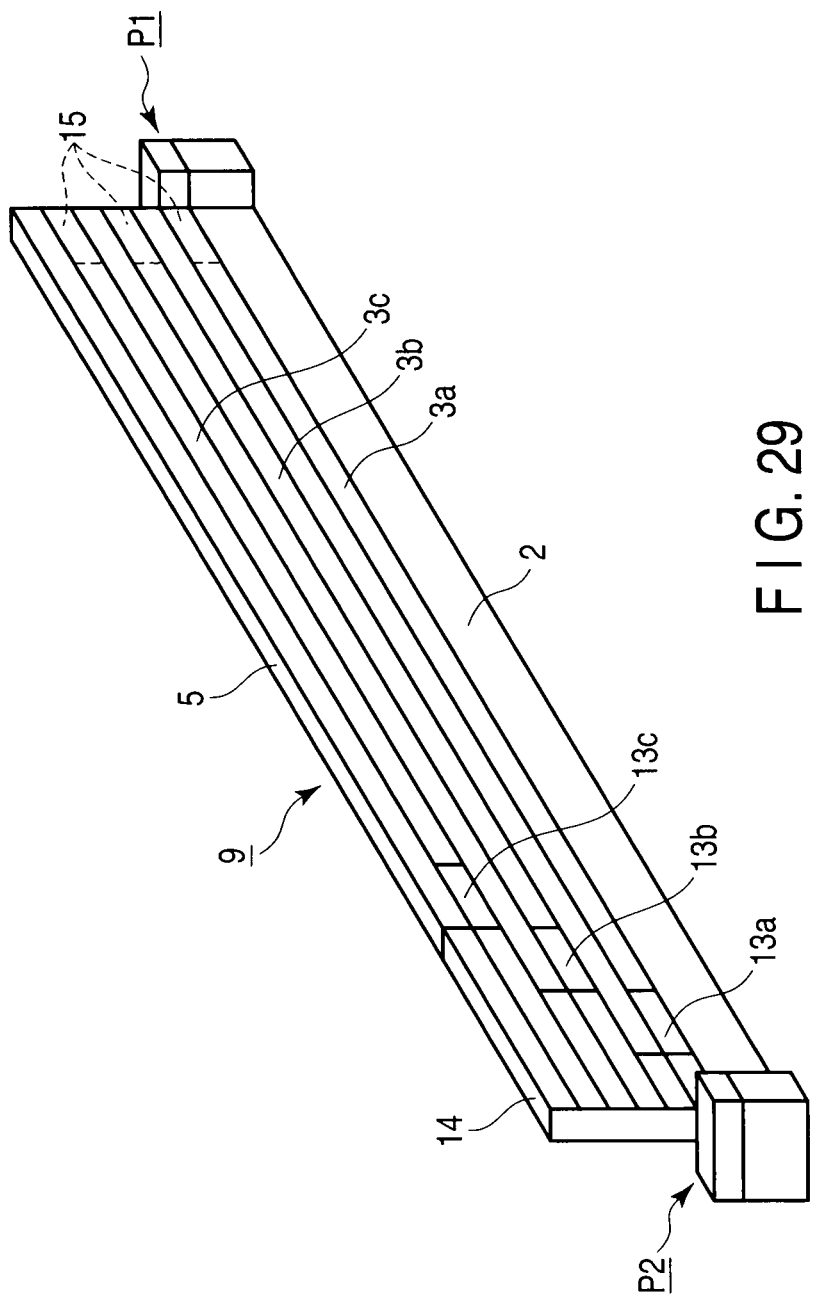
FIG. 29 shows a part in FIG. 28.

FIG. 28 shows a third application example. FIG. 29 shows part of the structure of FIG. 28.

In FIGS. 28 and 29, like reference numerals are denoted to like elements identical to those of FIGS. 23 and 24 and thus a detailed explanation thereof will be omitted.

In the third application example, as compared with the structure shown in FIGS. 23 and 24, the upper surface in the first direction of each of the first and second parts P1 and P2 is lower than that of the fin-type stacked layer structure 9, and each of the first and second parts P1 and P2 partially contacts a lower part of the fin-type stacked layer structure 9.

The third application example suggests that the height of each of the first and second parts P1 and P2 is different from that of the fin-type stacked layer structure 9. That is, in this example, each of the first and second parts P1 and P2 is lower than the fin-type stacked layer structure 9, but instead, it can be proposed that each of the first and second parts P1 and P2 is higher than the fin-type stacked layer structure 9.

As described above, the shape of each of the first and second parts P1 and P2 is not limited to this example. That is, if the maximum width in the third direction of each of the first and second parts P1 and P2 is larger than the width in the third direction of the fin-type stacked layer structure 9, the first and second parts P1 and P2 can serve as a reinforcing member for preventing the falling of the fin-type staked layer structure 9 irrespective of the shapes.

Figure 30:
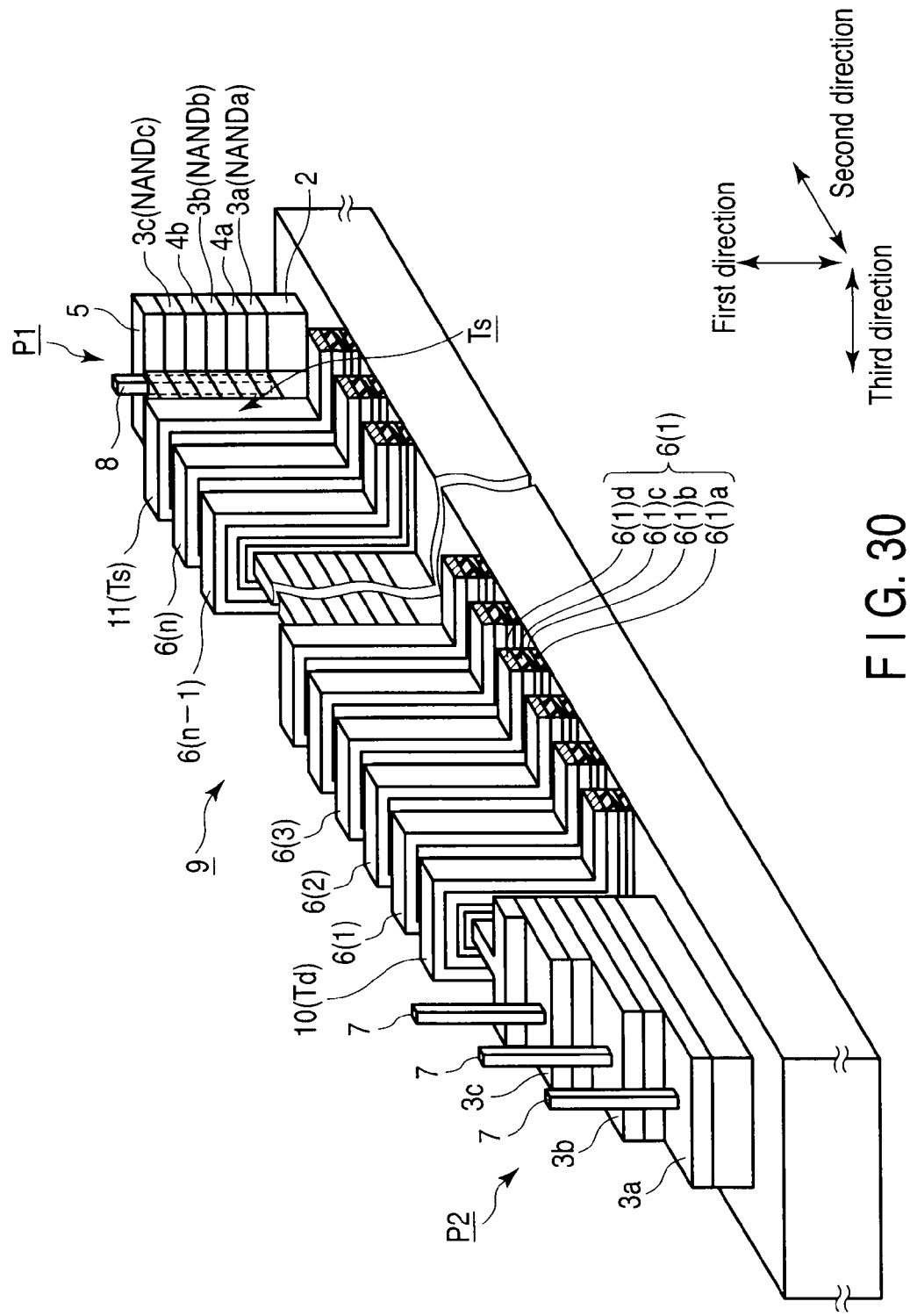
FIG. 30 shows a fourth application example.

FIG. 30 shows a fourth application example.

In FIG. 30, like reference numerals are denoted to like elements identical to those of FIG. 23 and thus a detailed explanation thereof will be omitted.

In the fourth application example, as compared with the structure of FIG. 23, the second part (drain area) P2 has a stepwise shape and adds the drain electrode 7 to each of the first, second and third semiconductor layers (channels) 3a, 3b. and 3c. in the fin-type stacked layer structure 9.

This structure is based on the structure having the layer-select transistors described above and is characterized in that the drain electrode 7 has to be added to each of the first, second and third semiconductor layers 3a, 3b. and 3c. in the fin-type stacked layer structure 9 instead of having layer-select transistors.

The characteristic points will be described below.

The drain side select transistor Td is provided at one end of each of the first, second and third memory strings NANDa, NANDb and NANDc and the source side select transistor Ts is provided at the other end thereof.

The drain side select transistor Td has the select gate electrode 10. The structure of the select gate electrode 10 of the drain side select transistor Td is the same as the structure of the select gate electrode 11 of the source side select transistor Ts, for example.

The source side/drain side select transistors Ts and Td are not limited in their structures while functioning as a switch device.

The second part P2 connected to the other end of the fin-type stacked layer structure 9 has a stepwise shape and the first, second and third semiconductor layers 3a, 3b. and 3c. are exposed. The drain electrode 7 is independently connected to each of the first, second and third semiconductor layers 3a, 3b. and 3c.

D. Conclusion

According to the third embodiment, since the first and second parts P1 and P2 function as a reinforcing member for preventing the falling of the fin-type stacked layer structure 9, even when the number of memory strings in the fin-type stacked layer structure 9 is increased and the fin width of the fin-type stacked layer structure 9 is made smaller, the fin-type stacked layer structure 9 will not fall.

Thus, it is possible to realize higher integration and higher yield of a nonvolatile semiconductor memory device.

4. Fourth embodiment

A. Structure

Figure 31:
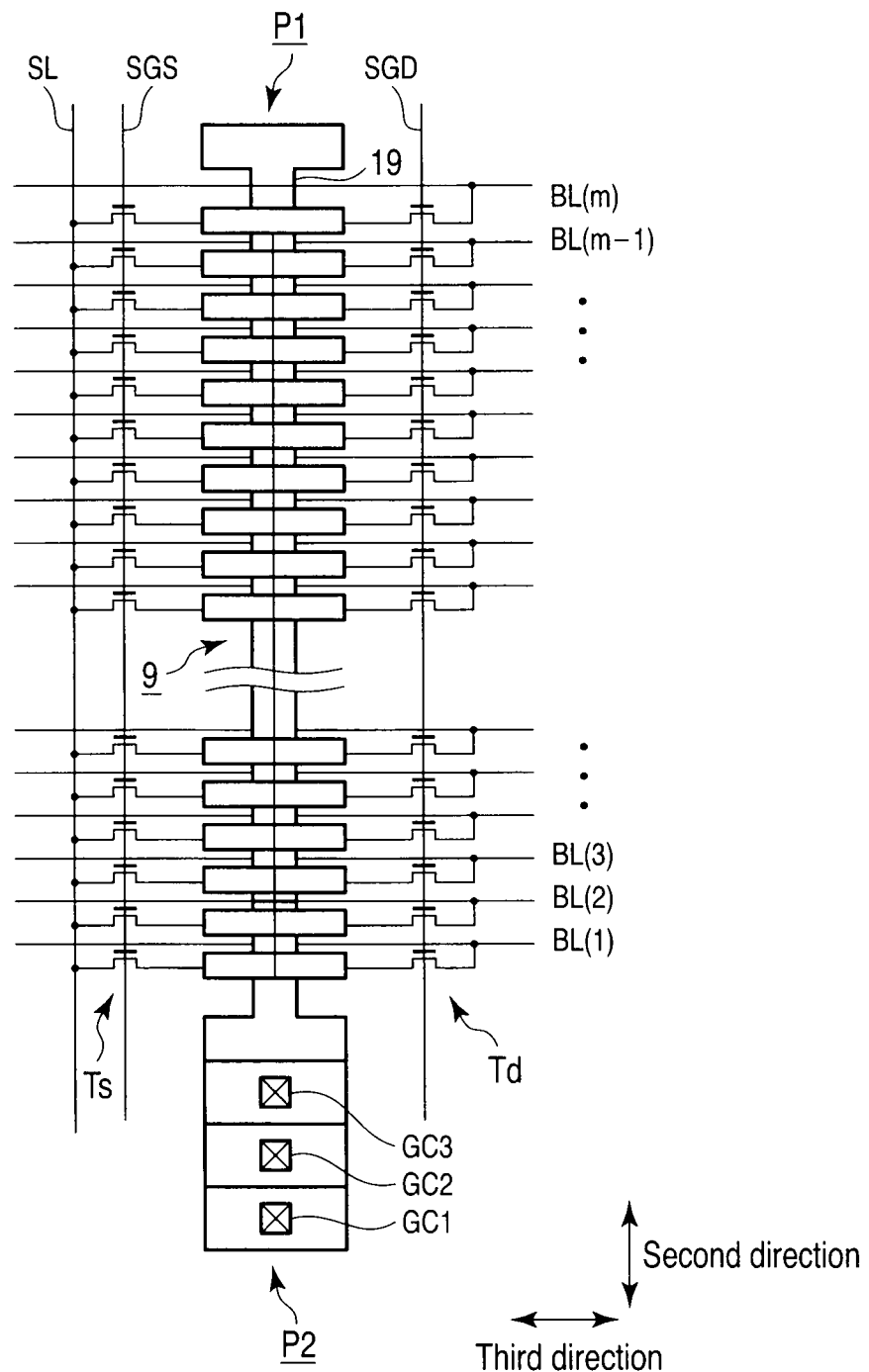
FIGS. 31 and 32 show a structure of a fourth embodiment.
Figure 32:
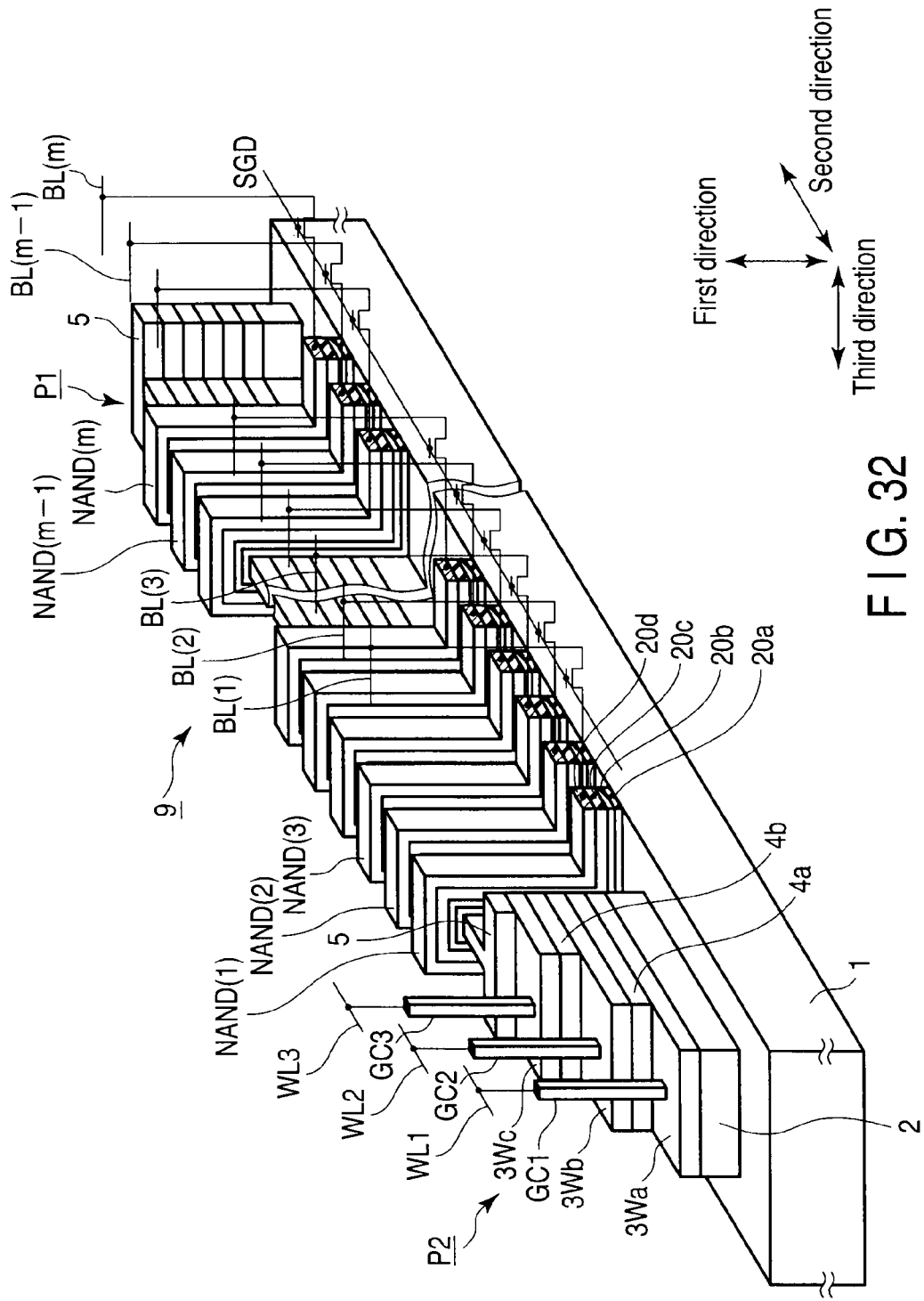

FIG. 31 is a plan view of a nonvolatile semiconductor memory device. FIG. 32 is a perspective view of FIG. 31.

The fourth embodiment is largely different from the first, second and third embodiments. That is, the stacked memory strings (active areas) are provided in the fin-type stacked layer structure in the first, second and third embodiments, while the stacked control gate electrodes are provided in the fin-type stacked layer structure in the fourth embodiment (See J. Kim et al, 2009. Symp. on VLSI p. 186, for example).

The structure according to the fourth embodiment will be describe below in detail.

A fin-type stacked layer structure 9 is a stacked layer element in which a first insulating layer 2, a first control gate electrode 3Wa, a second insulating layer 4a, a second control gate electrode 3Wb, a third insulating layer 4b, a third control gate electrode 3Wc and a fourth insulating layer 5 are stacked in this order in the first direction perpendicular to a surface of a semiconductor substrate 1, and extends in the second direction parallel to the surface of the semiconductor substrate 1.

The fin-type stacked layer structure 9 is not limited thereto, and may be generally used as a stacked layer element in which the first insulating layer, the first control gate electrode, . . . the i-th insulating layer, the i-th control gate electrode, the (i+1)-th insulating layer (i is a natural number of 2. or more) are stacked in this order.

The first insulating layer 2 is made of silicon oxide ($SiO_2$), for example. The first, second and third control gate electrodes 3W (3Wa, 3Wb, 3Wc) are made of impurity-containing conductive polysilicon or metallic material, for example. The first, second and third control gate electrodes 3W (3Wa, 3Wb, 3Wc) may have a single layer structure or multiplayer structure.

The second and third insulating layers (4a, 4b) are made of silicon oxide ($SiO_2$), for example. The fourth insulating layer 5 is made of silicon oxide ($SiO_2$), silicon nitride ($SiN_x$) or stack thereof, for example.

A first part P1 is connected to one end in the second direction of the fin-type stacked layer structure 9 and a second part P2 is connected to the other end in the second direction of the fin-type stacked layer structure 9.

The first part P1 has the same stacked layer structure as the fin-type stacked layer structure 9, for example, and its maximum width in the third direction is larger than the width in the third direction of the fin-type stacked layer structure 9.

A second part P2 has also the same stacked layer structure as the fin-type stacked layer structure 9, for example, and its maximum width in the third direction is larger than the width in the third direction of the fin-type stacked layer structure 9. The second part P2 has a stepwise shape, and the upper surface of each of the first, second and third control gate electrodes 3Wa, 3Wb and 3Wc is exposed. First, second and third gate contact electrodes GC1, GC2 and GC3 are connected to the first, second and third control gate electrodes 3Wa, 3Wb and 3Wc, respectively.

Word lines WL1, WL2 and WL3 are connected to the first, second and third control gate electrodes 3Wa, 3Wb and 3Wc via the first, second and third gate contact electrodes GC1, GC2 and GC3, respectively.

A first to an m-th memory strings NAND(1), NAND(2), NAND(3), . . . NAND(m) extend in the third direction by straddling the fin-type stacked layer structure 9. m is a natural number of 2. or more.

Each of the first to m-th memory strings NAND(1), NAND (2), NAND(3), . . . NAND(m) has a first gate insulating layer 20a, a charge storage layer 20b, a second gate insulating layer 20c. and a semiconductor layer (active area) 20d. The first to m-th memory strings NAND (1), NAND(2), NAND(3), . . . NAND(m) use the semiconductor layer 20d. as a channel, the first gate insulating layer 20a as a block insulating layer, and the second gate insulating layer 20c. as a tunnel insulating layer.

In this example, the first to m-th memory strings NAND(1), NAND(2), NAND(3), . . . NAND(m) have SONOS (Silicon/oxide/nitride/oxide/silicon) type. That is, the charge storage layer 20b. is made of an insulator such as silicon-rich SiN.

The charge storage layer 20b may be made of impurity-containing conductive polysilicon or metallic conductor.

One end of each of the first to m-th memory strings NAND (1), NAND(2), NAND(3), . . . NAND(m) is connected to each of the first to m-th bit lines BL(1), BL(2), BL(3), . . . BL(m) via a drain side select transistors Td, respectively. The gate electrode of the drain side select transistor Td is connected to a select gate line SGD.

The other end of each of the first to m-th memory strings NAND(1), NAND(2), NAND(3), . . . NAND(m) is connected to a source line SL via a source side select transistors Ts. The gate electrode of the source side select transistor Ts is connected to a select gate line SGS.

If the number of fin-type stacked layer structures 9 to be provided between the source side/drain side select transistors Ts and Td is increased (for example, the fin-type stacked layer structures 9 are provided), and the number of control gate electrodes in a fin-type stacked layer structure is increased, the number of memory cells connected in series in a memory string NANDk can be increased.

B. Manufacturing Method

The structure of the fourth embodiment is configured so that the semiconductor layers and the control gate electrodes according to the first, second and third embodiments are replaced with each other, and thus the manufacturing method according to the first, second and third embodiments is utilized to easily form the structure.

C. Conclusion

According to the fourth embodiment, since the first and second parts P1 and P2 function as a reinforcing member for preventing the falling of the fin-type stacked layer structure 9, even if the number of control gate electrodes in the fin-type stacked layer structure 9 is increased and the fin width of the fin-type stacked layer structure 9 is made smaller, the fin-type stacked layer structure 9 will not fall.

Thus, it is possible to realize higher integration and higher yield of a nonvolatile semiconductor memory device.

5. Others

For the series connection made of the memory cells and the select transistors (the layer-select transistors (drain side select transistors) and the source side select transistors) connected in series, a diffusing layer may be or may not be formed between the transistors.

When an interval between the gates (pitch between the control gate electrodes) is 30. nm or less, even when a diffusing layer is not formed between the transistors, a current path can be formed in the semiconductor layer (channel) (See Chang-Hyum Lee et al, VLSI Technology Digest of Technical Papers, pp 118-119, 2008, for example).

For a ratio of the height H1 in the first direction of the fin-type stacked layer structure relative to the width H2 in the third direction (aspect ratio of H1/H2), if a reinforcing member is not present in the embodiments, the fin-type stacked layer structure falls at the aspect ratio of 30. or more (see Hideo Sunami et al, A three-dimensional MOS transistor formation technique with crystallographic orientation-dependent TMAH etchant, Sensors and actuators A 111 (2004) PP 310-316, particularly FIG. 9. thereof), while, if a reinforcing member is present in the embodiments, the fin-type stacked layer structure will not fall even at the aspect ratio of 30. or more.

For example, according to the embodiments, the fin height of 900. nm or more is possible with the fin width of 30. nm.

6. Conclusion

According to the embodiments, it is possible to realize higher integration and higher yield of a nonvolatile semiconductor memory device.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A nonvolatile semiconductor memory device comprising:
   a semiconductor substrate;
   first, second, third and fourth fin-type stacked layer structures, each having memory strings stacked in a first direction perpendicular to a surface of the semiconductor substrate, and each extending in a second direction parallel to the surface of the semiconductor substrate;
   a first part connected to first ends in the second direction of the first and second fin-type stacked layer structures stacked with respect to each other;
   a second part connected to first ends in the second direction of the third and fourth fin-type stacked layer structures stacked with respect to each other;
   a third part connected to second ends in the second direction of the first and third fin-type stacked layer structures stacked with respect to each other; and
   a fourth part connected to second ends in the second direction of the second and fourth fin-type stacked layer structures stacked with respect to each other,
   wherein each of the memory strings in the first and second fin-type stacked layer structures uses the first part as a source area and uses the third and fourth parts as a drain area, and each of the memory strings in the third and fourth fin-type stacked layer structures uses the second part as the source area and uses the third and fourth parts as the drain area,
   wherein each of the memory strings has memory cells connected in series in the second direction, each of the memory cells has a semiconductor layer and a stacked gate structure provided on a side surface of the semiconductor layer in a third direction perpendicular to the first and second directions, and the stacked gate structure includes a first insulating layer, a charge storage layer, a second insulating layer and a control gate electrode stacked with respect to each other,
   wherein the control gate electrodes of the memory cells arranged in the first direction in each of the first, second, third and fourth fin-type stacked layer structures are connected to each other.

2. The device of claim 1,
   wherein each of the first, second, third and fourth fin-type stacked layer structures has a first width in a first portion in which the memory cells are provided and a second width in a second portion different from the first portion, and the first width is smaller than the second width.

3. The device of claim 1,
   wherein each of the memory strings has layer-select transistors, and the j-th layer-select transistor (j is a natural number) from the drain area among the layer-select transistors is a normally on-state in the j-th memory string from the semiconductor substrate among the memory strings.

4. The device of claim 1,
   wherein the source area has a source electrode which connects the memory strings to each other.

5. A nonvolatile semiconductor memory device comprising:
   a semiconductor substrate;
   first, second, third, fourth, fifth, sixth, seventh and eighth fin-type stacked layer structures, each having memory strings stacked in a first direction perpendicular to a surface of the semiconductor substrate, and each extending in a second direction parallel to the surface of the semiconductor substrate;
   a first part connected to first ends in the second direction of the first and second fin-type stacked layer structures stacked with respect to each other;
   a second part connected to first ends in the second direction of the third and fourth fin-type stacked layer structures stacked with respect to each other;
   a third part connected to first ends in the second direction of the fifth and sixth fin-type stacked layer structures stacked with respect to each other;
   a fourth part connected to first ends in the second direction of the seventh and eighth fin-type stacked layer structures stacked with respect to each other;
   a fifth part connected to second ends in the second direction of the first and fifth fin-type stacked layer structures stacked with respect to each other;
   a sixth part connected to second ends in the second direction of the second and third fin-type stacked layer structures stacked with respect to each other,
   a seventh part connected to second ends in the second direction of the sixth and seventh fin-type stacked layer structures stacked with respect to each other; and
   a eighth part connected to second ends in the second direction of the fourth and eighth fin-type stacked layer structures stacked with respect to each other,
   wherein each of the memory strings in the first, second, third and fourth fin-type stacked layer structures uses the first and second parts or the fifth, sixth and eighth parts as a source area and uses the fifth, sixth and eighth parts or the first and second parts as a drain area, and each of the memory strings in the fifth, sixth, seventh and eighth fin-type stacked layer structures uses the third and fourth parts or the fifth, seventh and eighth parts as the source area and uses the fifth, seventh and eighth parts or the third and fourth parts as the drain area,
   wherein each of the memory strings has memory cells connected in series in the second direction, each of the memory cells has a semiconductor layer and a stacked gate structure provided on a side surface in a third direction perpendicular to the first and second directions of the semiconductor layer, and the stacked gate structure includes a first insulating layer, a charge storage layer, a second insulating layer and a control gate electrode stacked with respect to each other,
   wherein the control gate electrodes of the memory cells arranged in the first direction in each of the first, second, third, fourth, fifth, sixth, seventh and eighth fin-type stacked layer structures are connected to each other.

6. The device of claim 5,
   wherein each of the first, second, third, fourth, fifth, sixth, seventh and eighth fin-type stacked layer structures has a first width in a first portion in which the memory cells are provided and a second width in a second portion different from the first portion, and the first width is smaller than the second width.

7. The device of claim 5,
wherein each of the memory strings has layer-select transistors, and the j-th layer-select transistor (j is a natural number) from the drain area among the layer-select transistors is a normally on-state in the j-th memory string from the semiconductor substrate among the memory strings.

8. The device of claim 5,
wherein the source area has a source electrode which connects the memory strings to each other.

9. A nonvolatile semiconductor memory device comprising:
a semiconductor substrate;
a fin-type stacked layer structure having memory strings stacked in a first direction perpendicular to a surface of the semiconductor substrate, and extending in a second direction parallel to the surface of the semiconductor substrate; and
a first part connected to a first end in the second direction of the fin-type stacked layer structure, and in which a maximum width in a third direction perpendicular to the first and second directions is wider than a width in the third direction of the fin-type stacked layer structure,
wherein each of the memory strings has memory cells connected in series in the second direction, each of the memory cells has a semiconductor layer and a stacked gate structure provided on a side surface in a third direction perpendicular to the first and second directions of the semiconductor layer, and the stacked gate structure includes a first insulating layer, a charge storage layer, a second insulating layer and a control gate electrode stacked with respect to each other,
wherein at least one of the first part and the first end in the second direction of the fin-type stacked layer structure has a common semiconductor which connects the memory strings each other, and has a drain electrode which connects to the common semiconductor,
wherein each of the memory strings has layer-select transistors which are provided in or on at least the common semiconductor, and the j-th layer-select transistor (j is a natural number) from the drain area among the layer-select transistors is a normally on-state in the j-th memory string from the semiconductor substrate among the memory strings.

10. The device of claim 9, further comprising
a second part connected to a second end in the second direction of the fin-type stacked layer structure, and in which a maximum width in the third direction is wider than a width in the third direction of the fin-type stacked layer structure; and
a source electrode connected to the memory strings in the second end in the second direction of the fin-type stacked layer structure.

11. The device of claim 10,
wherein a height in the first direction from the semiconductor substrate of the first and second parts is lower than that of the fin-type stacked layer structure.

12. The device of claim 9,
wherein the fin-type stacked layer structure has a first width in a first portion in which the memory cells are provided and a second width in a second portion different from the first portion, and the first width is smaller than the second width.

13. A nonvolatile semiconductor memory device comprising:
a semiconductor substrate;
a fin-type stacked layer structure having control gate electrodes stacked in a first direction perpendicular to a surface of the semiconductor substrate, and extending to a second direction parallel to the surface of the semiconductor substrate;
a first part connected to a first end in the second direction of the fin-type stacked layer structure, and in which a maximum width in a third direction perpendicular to the first and second directions is wider than a width in the third direction of the fin-type stacked layer structure,
a second part connected to a second end in the second direction of the fin-type stacked layer structure, and in which a maximum width in the third direction is wider than the width in the third direction of the fin-type stacked layer structure, and
a stacked layer element provided on a side surface in the third direction of the fin-type stacked layer structure, the stacked layer element including a first insulating layer, a charge storage layer, a second insulating layer and a semiconductor layer stacked with respect to each other,
wherein a memory string comprises the stacked layer element extending in the first direction, the first end of the memory string connects to a drain side select transistor, the second end of the memory string connects to a source side select transistor, and the second part has a stepwise shape which exposes each of the control gate electrodes.

* * * * *